United States Patent
Yokokawa et al.

(10) Patent No.: US 9,904,168 B2
(45) Date of Patent: Feb. 27, 2018

(54) ACTINIC RAY-SENSITIVE OR RADIATION-SENSITIVE RESIN COMPOSITION, ACTINIC RAY-SENSITIVE OR RADIATION-SENSITIVE FILM, MASK BLANK PROVIDED WITH ACTINIC RAY-SENSITIVE OR RADIATION-SENSITIVE FILM, PATTERN FORMING METHOD, METHOD FOR MANUFACTURING ELECTRONIC DEVICE, AND ELECTRONIC DEVICE

(71) Applicant: FUJIFILM Corporation, Tokyo (JP)

(72) Inventors: Natsumi Yokokawa, Shizuoka (JP); Shuhei Yamaguchi, Shizuoka (JP); Koutarou Takahashi, Shizuoka (JP)

(73) Assignee: FUJIFILM Corporation, Minato-Ku, Tokyo (JP)

( * ) Notice: Subject to any disclaimer, the term of this patent is extended or adjusted under 35 U.S.C. 154(b) by 0 days.

(21) Appl. No.: 15/205,250

(22) Filed: Jul. 8, 2016

(65) Prior Publication Data

US 2016/0320700 A1    Nov. 3, 2016

Related U.S. Application Data

(63) Continuation of application No. PCT/JP2015/050645, filed on Jan. 13, 2015.

(30) Foreign Application Priority Data

Feb. 21, 2014    (JP) .................................. 2014-032312

(51) Int. Cl.
*G03F 7/004*    (2006.01)
*G03F 7/038*    (2006.01)
(Continued)

(52) U.S. Cl.
CPC .............. *G03F 7/038* (2013.01); *C08F 12/24* (2013.01); *C08F 12/30* (2013.01); *C08F 112/14* (2013.01);
(Continued)

(58) Field of Classification Search
CPC ...... G03F 7/004; G03F 7/0015; G03F 7/2065; H01L 21/0274; B41C 2210/04;
(Continued)

(56) References Cited

U.S. PATENT DOCUMENTS

| 5,296,332 A | 3/1994 | Sachdev et al. |
| 5,322,765 A | 6/1994 | Clecak et al. |

(Continued)

FOREIGN PATENT DOCUMENTS

| JP | 05-216234 A | 8/1993 |
| JP | 2669581 B2 | 10/1997 |

(Continued)

OTHER PUBLICATIONS

Machine translation of JP 2003-121999 (no date).*

(Continued)

*Primary Examiner* — Amanda C Walke
(74) *Attorney, Agent, or Firm* — Sughrue Mion, PLLC

(57) ABSTRACT

An actinic ray-sensitive or radiation-sensitive resin composition includes a resin (A) containing a repeating unit represented by General Formula (4) and a crosslinking agent (C) containing a polar group, in which the crosslinking agent (C) is a compound represented by General Formula (1) or a compound in which two to five structures represented by General Formula (1) are connected via a linking group or a single bond represented by $L_1$ in General Formula (3).

(Continued)

US 9,904,168 B2

Page 2

(1)

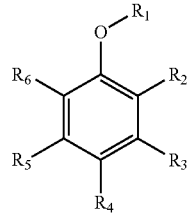

(2)

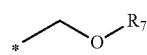

(3)

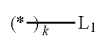

(4)

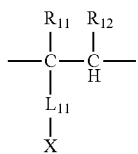

10 Claims, 2 Drawing Sheets

(51) Int. Cl.
| | |
|---|---|
| G03F 7/20 | (2006.01) |
| H01L 21/027 | (2006.01) |
| C08F 220/20 | (2006.01) |
| C08F 220/28 | (2006.01) |
| G03F 7/00 | (2006.01) |
| C08F 220/30 | (2006.01) |
| C08F 12/24 | (2006.01) |
| C08F 12/30 | (2006.01) |
| C08F 112/14 | (2006.01) |
| C09D 125/18 | (2006.01) |
| C08F 116/10 | (2006.01) |
| C08F 214/18 | (2006.01) |
| C08F 216/10 | (2006.01) |
| C08F 220/16 | (2006.01) |
| C08F 224/00 | (2006.01) |
| G03F 7/32 | (2006.01) |
| G03F 7/039 | (2006.01) |
| C08F 12/18 | (2006.01) |
| C08F 12/20 | (2006.01) |

(52) U.S. Cl.
CPC ........ *C08F 116/10* (2013.01); *C08F 214/186* (2013.01); *C08F 216/10* (2013.01); *C08F 220/16* (2013.01); *C08F 220/20* (2013.01); *C08F 220/28* (2013.01); *C08F 220/30* (2013.01); *C08F 224/00* (2013.01); *C09D 125/18* (2013.01); *G03F 7/0015* (2013.01); *G03F 7/0045* (2013.01); *G03F 7/0046* (2013.01); *G03F 7/0382* (2013.01); *G03F 7/0392* (2013.01); *G03F 7/0397* (2013.01); *G03F 7/2059* (2013.01); *G03F 7/2065* (2013.01); *G03F 7/322* (2013.01); *G03F 7/325* (2013.01); *H01L 21/0274* (2013.01); *B41C 2210/04* (2013.01); *B41C 2210/06* (2013.01); *B41C 2210/22* (2013.01); *B41C 2210/24* (2013.01); *C08F 12/18* (2013.01); *C08F 12/20* (2013.01)

(58) Field of Classification Search
CPC ............ B41C 2210/06; B41C 2210/22; B41C 2210/24; C08F 220/28; C08F 220/20; C08F 220/30
USPC ........ 430/270.1, 5, 942, 313, 322, 329, 330, 430/331; 568/719
See application file for complete search history.

(56) References Cited

U.S. PATENT DOCUMENTS

| | | |
|---|---|---|
| 2008/0227024 A1 | 9/2008 | Sato et al. |
| 2015/0017576 A1 | 1/2015 | Inoue et al. |
| 2015/0086911 A1 | 3/2015 | Tsuruta et al. |
| 2016/0145231 A1* | 5/2016 | Echigo ............... C07D 311/96 430/270.1 |
| 2016/0147154 A1* | 5/2016 | Takizawa ............ G03F 7/038 428/195.1 |
| 2016/0327867 A1* | 11/2016 | Okayasu ........... H01L 21/0273 |

FOREIGN PATENT DOCUMENTS

| | | |
|---|---|---|
| JP | 2669584 B2 | 10/1997 |
| JP | 117131 A | 1/1999 |
| JP | 11-254850 A | 9/1999 |
| JP | 11352679 A | 12/1999 |
| JP | 2000-147752 A | 5/2000 |
| JP | 2002148785 A | 5/2002 |
| JP | 2003-121999 A | 4/2003 |
| JP | 2006-084869 A | 3/2006 |
| JP | 2009-037201 A | 2/2009 |
| JP | 2010-060935 A | 3/2010 |
| JP | 2010-189375 A | 9/2010 |
| JP | 2013-205811 A | 10/2013 |
| JP | 2014-016478 A | 1/2014 |

OTHER PUBLICATIONS

Machine translation of JP 2010-060935 (no date).*
Machine translation of JP 05-216234 (no date).*
Machine translation of JP 2014-16478(no date).*
Machine translation of JP 11-254850(no date).*
Communication dated Feb. 14, 2017 from the Japanese Patent Office in counterpart Application No. 2014-032312.
International Preliminary Report on Patentability dated Aug. 23, 2016, in corresponding International Application No. PCT/JP2015/050645 with English translation of Written Opinion, 20 pages in English and Japanese.
International Search Report of PCT/JP2015/050645 dated Feb. 24, 2015 [PCT/ISA/210].
Written Opinion of PCT/JP2015/050645 dated Feb. 24, 2015 [PCT/ISA/237].
Communication dated Jun. 14, 2017, issued from the Korean Intellectual Property Office in corresponding Application No. 10-2016-7019792.
Office Action dated Sep. 19, 2017 issued by the Japanese Patent Office in counterpart Japanese Application No. 2014-032312.
Communication dated May 16, 2017, from the Japanese Patent Office in counterpart application No. 2014-032312.

* cited by examiner

US 9,904,168 B2

ACTINIC RAY-SENSITIVE OR RADIATION-SENSITIVE RESIN COMPOSITION, ACTINIC RAY-SENSITIVE OR RADIATION-SENSITIVE FILM, MASK BLANK PROVIDED WITH ACTINIC RAY-SENSITIVE OR RADIATION-SENSITIVE FILM, PATTERN FORMING METHOD, METHOD FOR MANUFACTURING ELECTRONIC DEVICE, AND ELECTRONIC DEVICE

CROSS-REFERENCE TO RELATED APPLICATIONS

This application is a Continuation of PCT International Application No. PCT/JP2015/50645, filed on Jan. 13, 2015, which claims priority under 35 U.S.C. § 119(a) to Japanese Patent Application No. 2014-032312, filed on Feb. 21, 2014. Each of the above application(s) is hereby expressly incorporated by reference, in its entirety, into the present application.

BACKGROUND OF THE INVENTION

1. Field of the Invention

The present invention relates to an actinic ray-sensitive or radiation-sensitive resin composition, as well as an actinic ray-sensitive or radiation-sensitive film, a mask blank provided with the actinic ray-sensitive or radiation-sensitive film, a pattern forming method, a method for manufacturing an electronic device, and an electronic device, each using the composition. More particularly, the present invention relates to an actinic ray-sensitive or radiation-sensitive resin composition which is suitably used in an ultramicrolithographic process which is applicable to a production process such as a production process for ultra-large scale integrations (LSIs) and high capacity microchips, a manufacturing process of a nanoimprint mold, and a production process of a high density information recording medium, and other photofabrication processes, as well as an actinic ray-sensitive or radiation-sensitive film, a mask blank provided with the actinic ray-sensitive or radiation-sensitive film, a pattern forming method, a method for manufacturing an electronic device, and an electronic device, each using the composition.

2. Description of the Related Art

In the process of producing a semiconductor device such as an IC and an LSI, microfabrication by lithography using a photoresist composition has been conventionally carried out and correspondingly the development of a resin or additive suitable for a variety of lithographic technologies is currently underway (For example, see JP2010-189375A and JP2009-37201A). Recently, the integration degree of integrated circuits has been becoming higher and consequently formation of an ultrafine pattern in the sub-micron or quarter-micron range has been required. To cope with this requirement, the exposure wavelength has also tended to become shorter, for example, from g line to i line, or further to excimer laser light. At present, the development of lithography using an electron beam or X-rays is also proceeding.

Lithography using an electron beam, X-rays, or EUV light is positioned as a next-generation or next-next-generation pattern formation technique, and there is demand for a high-sensitivity high-resolution resist composition.

However, from the viewpoint of overall performance of a resist, it remains very difficult to find a suitable combination of a resin, a photoacid generator, a basic compound, an additive, a solvent, and the like to be used. In particular, upon considering recent demand for the formation of an ultrafine pattern (for example, one having a line width of 50 nm or less) with high performance, it cannot be yet said that currently available lithography is sufficient in terms of its performance.

In the field of an electron beam (EB) lithography, it has been found that the influence of electron scattering in a resist film (that is, forward scattering) is reduced by increasing an accelerating voltage of an EB. Accordingly, there has been recently a tendency to increase an accelerating voltage of an EB. However, if an accelerating voltage of an EB is increased, the influence of forward scattering is reduced, whereas the influence of scattering of electrons reflected in a resist substrate (that is, backward scattering) is increased. In addition, in the case of forming an isolated line pattern having a large exposure area, the influence of backward scattering is particularly significant. Thus, for example, an increase in the accelerating voltage of an EB may possibly result in lowering of the resolution of an isolated line pattern.

Particularly, in the case of patterning on a photomask blank used for semiconductor exposure, since a light-shielding film containing heavy atoms such as chromium, molybdenum, and tantalum is present as the layer below a resist film, the influence of backward scattering due to reflection from the layer below a resist layer is more significant in comparison to the case of applying a resist onto a silicon wafer. As a consequence, in the case of forming an isolated line pattern on a photomask blank, the pattern is particularly susceptible to the influence of backward scattering, and the resolution thereof is highly likely to decrease. On the other hand, in extreme ultraviolet (EUV) lithography, there is a high possibility of lowering of the resolution, due to the flare light generated by the surface topology and a phase difference of a reflection mirror constituting an optical system of an exposure apparatus, and the unintended light of different wavelengths (Out of Band light: OoB light) from a wavelength of EUV light, which is generated due to the reflection mirror also exhibiting a certain degree of reflection characteristics with respect to wavelengths different from an exposure wavelength of EUV light (typically 13.5 nm).

Further, in the formation of an ultrafine pattern, there is also a need for an improvement in PEB temperature dependency whereby a line width of the pattern varies depending on the temperature of heating after the irradiation with actinic rays or radiation (post exposure bake: PEB).

SUMMARY OF THE INVENTION

An object of the present invention is to provide an actinic ray-sensitive or radiation-sensitive resin composition which is capable of forming a fine pattern having a narrow space width (for example, one having a line width of 50 nm or less) with high resolution while suppressing a line width variation of a pattern dependent on the PEB temperature, as well as an actinic ray-sensitive or radiation-sensitive film, a mask blank provided with the same film, a pattern forming method, a method for manufacturing an electronic device, and an electronic device, each using the composition.

In one aspect, the present invention is as follows.

[1] An actinic ray-sensitive or radiation-sensitive resin composition, comprising a resin (A) containing a repeating unit represented by General Formula (4) and a crosslinking agent (C) containing a polar group, in which the crosslinking agent (C) is a compound represented by General Formula (1), or a compound in which two to five structures represented by General Formula (1) are connected via a linking group or a single bond represented by $L_1$ in General Formula (3).

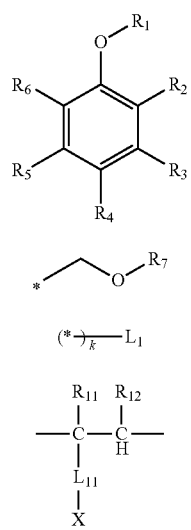

In General Formula (1), $R_1$ to $R_6$ each independently represent a hydrogen atom, an organic group having 1 to 50 carbon atoms, or a binding site to a linking group or a single bond represented by $L_1$ in General Formula (3), provided that at least one of $R_2$, $R_3$, $R_4$, $R_5$, or $R_6$ is a group represented by General Formula (2), and at least one of $R_1$, $R_2$, $R_3$, $R_4$, $R_5$, $R_6$, or $L_1$ in General Formula (3) is a polar group, or a group containing a polar group as a partial structure.

In General Formula (2), $R_7$ represents a hydrogen atom or an organic group having 1 to 30 carbon atoms.

In General Formula (3), $L_1$ represents a linking group or a single bond, * represents a binding site in any one of $R_1$, $R_2$, $R_3$, $R_4$, $R_5$, and $R_6$, and k is an integer of 2 to 5.

In General Formula (4), $R_{11}$ represents a hydrogen atom, a methyl group, or a trifluoromethyl group, $R_{12}$ represents a hydrogen atom or an alkyl group, $L_{11}$ represents a single bond or a linking group, X represents —Ar(OX$_1$)m or —CO$_2$X$_2$ in which Ar represents an aromatic ring, $X_1$ represents a hydrogen atom, a group having a non-acid-decomposable hydrocarbon structure, or a group having an acid-decomposable group, $X_2$ represents a group capable of leaving by the action of an acid or a group having a group capable of leaving by the action of an acid, and m represents an integer of 1 to 12. $R_{12}$ and X may be bonded to each other to form a ring.

[2] The actinic ray-sensitive or radiation-sensitive resin composition according to [1], in which the polar group is a structure selected from the following structures, or a group containing such a structure as a partial structure.

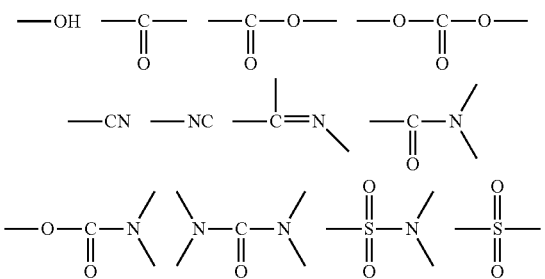

[3] The actinic ray-sensitive or radiation-sensitive resin composition according to [1], in which the polar group is a structure selected from the following structures, or a group containing such a structure as a partial structure.

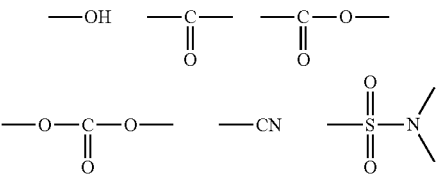

[4] The actinic ray-sensitive or radiation-sensitive resin composition according to any one of [1] to [3], further comprising a compound (B) capable of generating an acid upon irradiation with actinic rays or radiation.

[5] The actinic ray-sensitive or radiation-sensitive resin composition according to [4], in which the volume of an acid generated from a compound (B) upon irradiation with actinic rays or radiation is 240 Å$^3$ or more.

[6] The actinic ray-sensitive or radiation-sensitive resin composition according to any one of [1] to [5], in which the resin (A) contains at least a repeating unit represented by the following General Formula (6), as the repeating unit represented by General Formula (4).

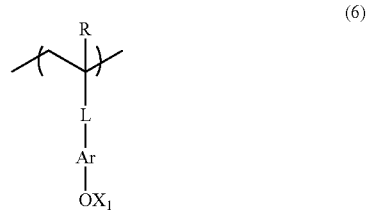

In General Formula (6), R represents a hydrogen atom or a methyl group, L represents a single bond or a linking group, Ar represents an aromatic ring, and $X_1$ represents a hydrogen atom, a group having a non-acid-decomposable hydrocarbon structure, or a group having an acid-decomposable group.

[7] An actinic ray-sensitive or radiation-sensitive film comprised of the actinic ray-sensitive or radiation-sensitive resin composition according to any one of [1] to [6].

[8] A mask blank provided with the actinic ray-sensitive or radiation-sensitive film according to [7].

[9] A pattern forming method, comprising:
a step of forming an actinic ray-sensitive or radiation-sensitive film using the actinic ray-sensitive or radiation-sensitive resin composition according to any one of [1] to [6];

a step of exposing the film; and a step of developing the exposed film using a developer to form a pattern.

[10] The pattern forming method according to [9], in which the exposure is carried out using X-rays, an electron beam, or EUV light.

[11] A method for manufacturing an electronic device, comprising the pattern forming method according to [9] or [10].

[12] An electronic device manufactured by the method for manufacturing an electronic device according to [11].

According to the present invention, it has become possible to provide an actinic ray-sensitive or radiation-sensitive resin composition which is capable of forming a fine pattern having a narrow space width (for example, one having a line width of 50 nm or less) with high resolution while suppressing a line width variation of a pattern dependent on the PEB temperature, as well as an actinic ray-sensitive or radiation-sensitive film, a mask blank provided with the same film, a pattern forming method, a method for manufacturing an electronic device, and an electronic device, each using the composition.

DESCRIPTION OF THE PREFERRED EMBODIMENTS

Figure 1:
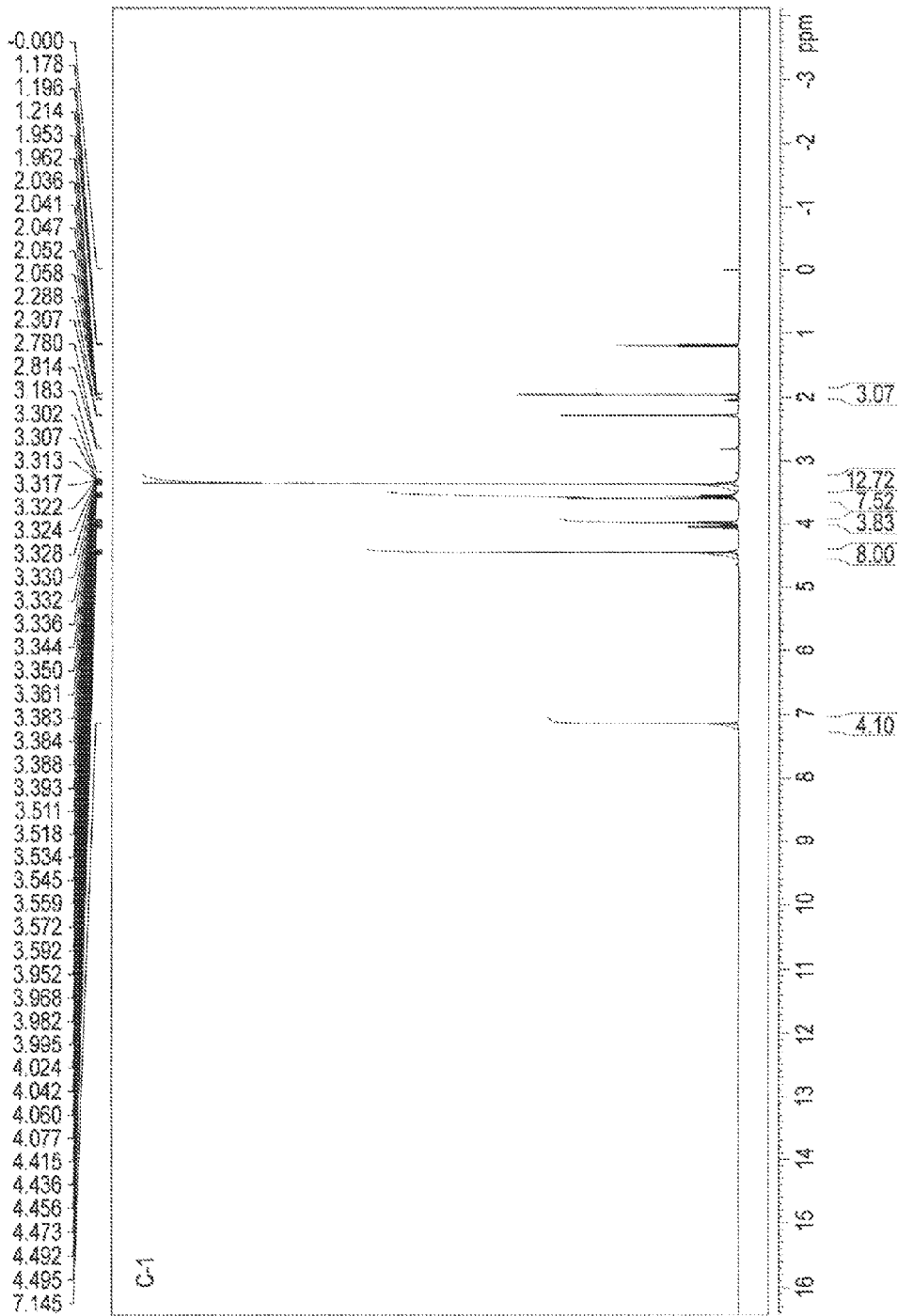
FIG. 1 shows an NMR spectrum ($^1$HNMR, acetone-d6) of a crosslinking agent (C-1) synthesized in Examples.

In the description of the present invention, when a group (atomic group) is denoted without specifying whether substituted or unsubstituted, the group includes both a group having no substituent and a group having a substituent. For example, "an alkyl group" includes not only an alkyl group having no substituent (unsubstituted alkyl group) but also an alkyl group having a substituent (substituted alkyl group).

Incidentally, the term "actinic rays" or "radiation" as used herein indicates, for example, a bright line spectrum of mercury lamp, far ultraviolet rays represented by excimer laser light, extreme ultraviolet rays (EUV light), X-rays, or an electron beam (EB). Also, in the present invention, the "light" means actinic rays or radiation.

Furthermore, unless otherwise indicated, the term "exposure" as used herein includes not only exposure to a mercury lamp, far ultraviolet rays represented by excimer laser light, extreme ultraviolet rays (EUV light), X-rays, or the like but also lithography with a particle beam such as an electron beam and an ion beam.

Hereinafter, embodiments of the present invention will be described in more detail.

<Crosslinking Agent>

The actinic ray-sensitive or radiation-sensitive resin composition of the present invention contains a crosslinking agent together with a resin (A) containing a later-described repeating unit represented by General Formula (4) and a compound (B) capable of generating an acid upon irradiation with actinic rays or radiation together. The crosslinking agent is a compound having a polar group, and contains a structure represented by General Formula (1) shown below (hereinafter, also referred to as a "crosslinking agent of the present invention" or "crosslinking agent (C)").

The combined use of the crosslinking agent (C) and the resin (A) leads to a hydrogen bond between a polar group in the crosslinking agent (C) and an OH group in the resin (A) (including a COOH group generated after acid decomposition, or a phenolic hydroxyl group). As a result, it is believed that the density of the actinic ray-sensitive or radiation-sensitive film is improved, and the penetration of a developer into the film is suppressed during development, thereby capable of suppressing the collapse of a line-and-space pattern by swelling, so that the resolution of an ultrafine pattern having a line width of 50 nm or less is improved. Further, it is presumed that since a hydrogen bond between an OH group in the resin (A) and a polar group in the crosslinking agent (C) enables to suppress the volatilization in a PEB step, the line width variation of a pattern depending on the PEB temperature is also improved.

The crosslinking agent (C) is "a compound represented by General Formula (1) shown below", or "a compound in which two to five structures represented by General Formula (1) are connected via a linking group or a single bond represented by $L_1$ in General Formula (3)".

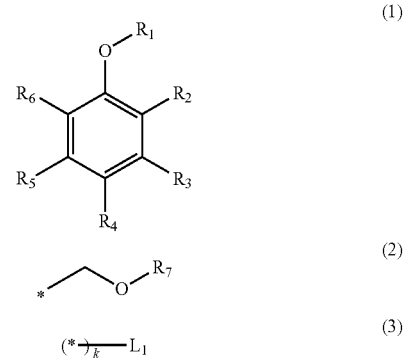

In General Formula (1), $R_1$ to $R_6$ each independently represent a hydrogen atom, an organic group having 1 to 50 carbon atoms, or a binding site to a linking group or a single bond represented by $L_1$ in General Formula (3), provided that at least one of $R_2$, $R_3$, $R_4$, $R_5$, or $R_6$ is a group represented by General Formula (2), and at least one of $R_1$, $R_2$, $R_3$, $R_4$, $R_5$, $R_6$, or $L_1$ in General Formula (3) is a polar group, or a group containing a polar group as a partial structure.

In General Formula (2), $R_7$ represents a hydrogen atom or an organic group having 1 to 30 carbon atoms.

In General Formula (3), $L_1$ represents a linking group or a single bond, * represents a binding site in any one of $R_1$, $R_2$, $R_3$, $R_4$, $R_5$, and $R_6$, and k is an integer of 2 to 5.

Examples of the polar group in the present invention include the following (1) to (4). In the following, the "electronegativity" means a Pauling's value.

(1) A functional group containing a structure where an oxygen atom and an atom with the electronegativity difference from oxygen atom being 1.1 or more are bonded via a single bond:

Examples of this polar group include a group containing a structure represented by O—H, such as hydroxy group.

(2) A functional group containing a structure where a nitrogen atom and an atom with the electronegativity difference from nitrogen atom being 0.6 or more are bonded via a single bond:

Examples of this polar group include a group containing a structure represented by N—H, such as amino group.

(3) A functional group containing a structure where two atoms differing in the electronegativity by 0.5 or more are bonded via a double bond or a triple bond:

Examples of this polar group include a group containing a structure represented by C=N, C=O, N=O, S=O, or C≡N.

(4) A functional group having an ionic moiety:

Examples of this polar group include a group having a moiety represented by $N^+$ or $S^+$.

Specific examples of the partial structure which can be contained in the "polar group" are illustrated below.

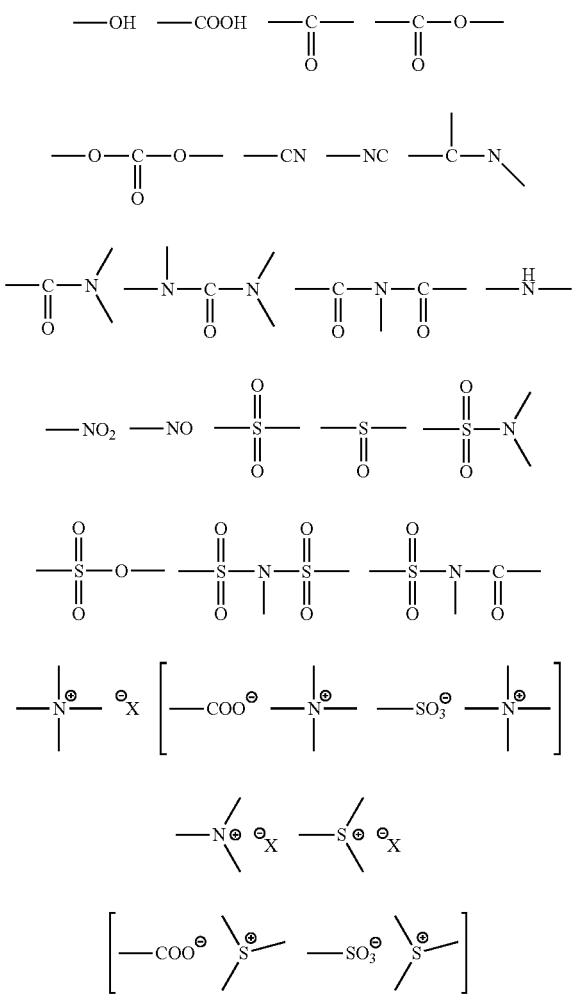

In one embodiment of the present invention, the polar group is preferably a structure selected from the following structures, or a group containing such a structure as a partial structure.

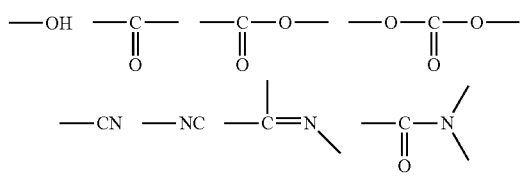

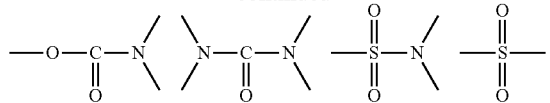

In one embodiment of the present invention, the polar group is more preferably a structure selected from the following structures, or a group containing such a structure as a partial structure.

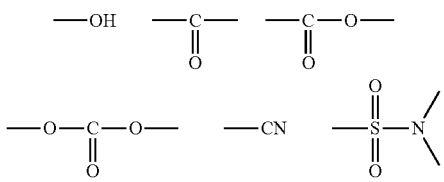

In the case where the crosslinking agent (C) is a compound represented by General Formula (1), $R_1$ to $R_6$ each independently represent a hydrogen atom, or an organic group having 1 to 50 carbon atoms. Examples of the organic group having 1 to 50 carbon atoms include an alkyl group, a cycloalkyl group, and an aryl group, each of which may contain a heteroatom, in addition to the polar group described above, for example.

Meanwhile, at least one of $R_1$, $R_2$, $R_3$, $R_4$, $R_5$, or $R_6$ is the above-mentioned polar group, or has the above-mentioned polar group as a partial structure.

Further, at least one of $R_2$, $R_3$, $R_4$, $R_5$, or $R_6$ is a structure represented by General Formula (2). The crosslinking agent (C) is preferably a crosslinking agent containing at least two structures represented by General Formula (2) in one molecule, including a case where a plurality of structures represented by General Formula (1) are connected.

Examples of the organic group having 1 to 30 carbon atoms represented by $R_7$ in General Formula (2) include an alkyl group, an aryl group, and an acyl group. In addition, $R_7$ may be a polarity converting group or may be a group having the polarity converting group as a partial structure.

In another embodiment of the present invention, the crosslinking agent (C) may be a compound in which two to five structures represented by General Formula (1) are connected via a linking group or a single bond represented by $L_1$ in General Formula (3). In this case, at least one of $R_1$, $R_2$, $R_3$, $R_4$, $R_5$, or $R_6$ in General Formula (1) represents a binding site to a linking group or a single bond represented by $L_1$ in General Formula (3). Additionally, in this case, at least one of $R_1$, $R_2$, $R_3$, $R_4$, $R_5$, $R_6$, or a linking group represented by $L_1$ in General Formula (3) is the above-mentioned polar group, or has the above-mentioned polar group as a partial structure.

The linking group represented by $L_1$ in General Formula (3) is not particularly limited. In one embodiment of the present invention, the linking group represented by $L_1$ is preferably a group selected from a single bond, an alkylene group, an arylene group, a carboxylic acid ester bond, an ether bond, a carbonyl bond, and a combination of two or more thereof.

Specific examples of the crosslinking agent of the present invention are set forth below, but the present invention is not limited thereto.

9                                                                                          10
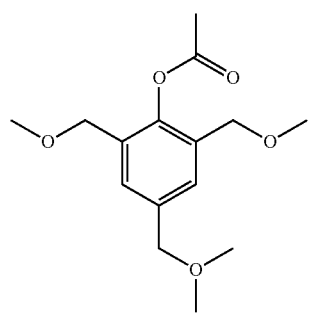 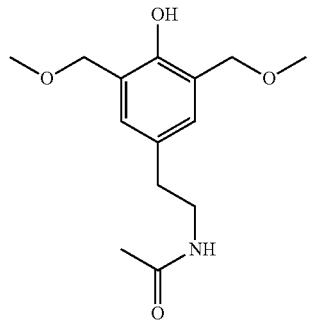 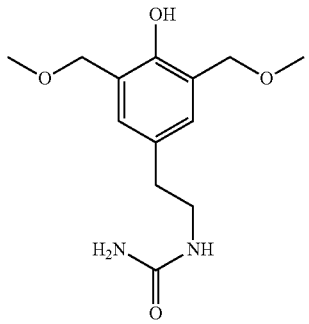
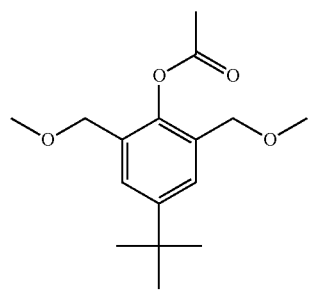 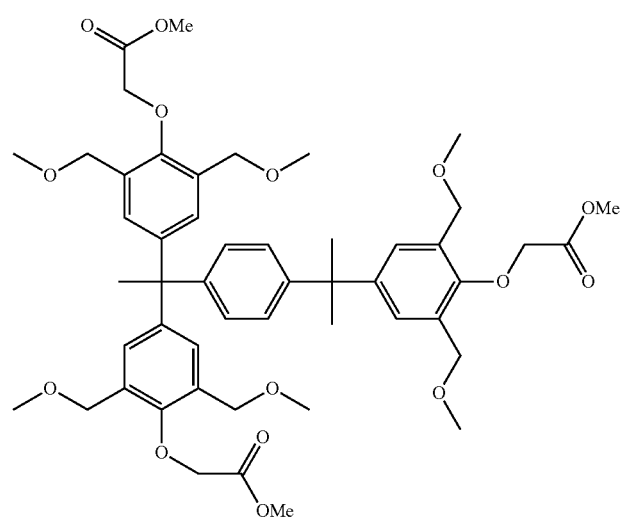
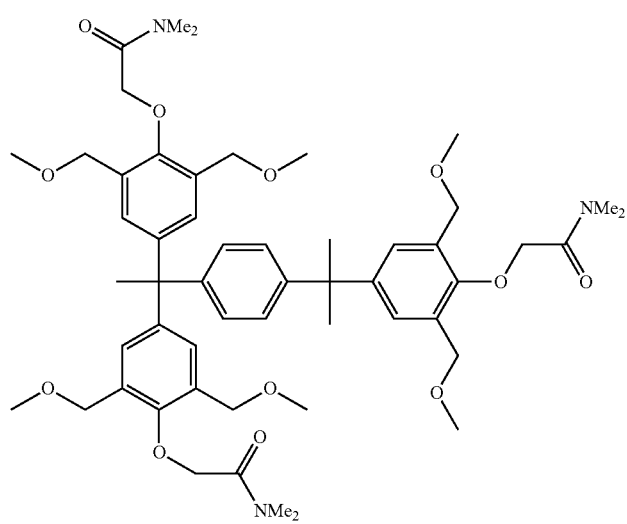

11
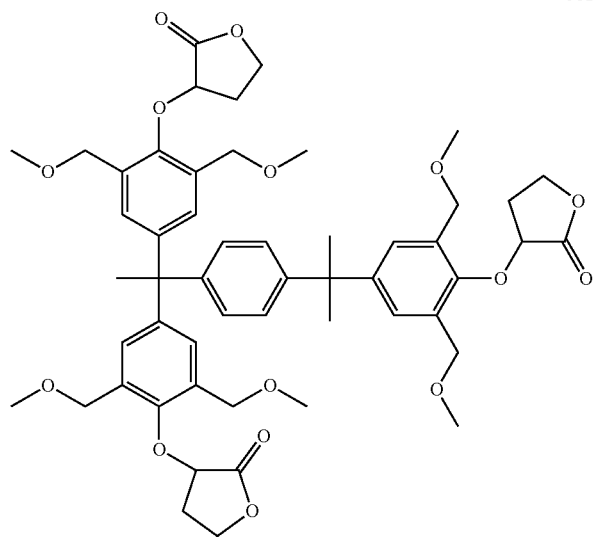
12
-continued
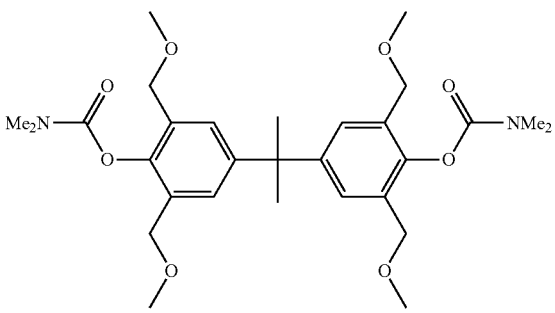
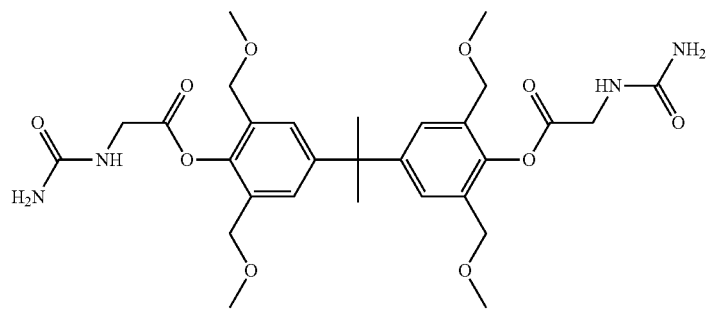
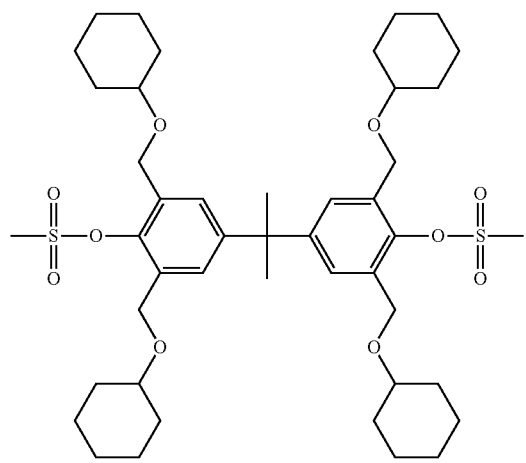
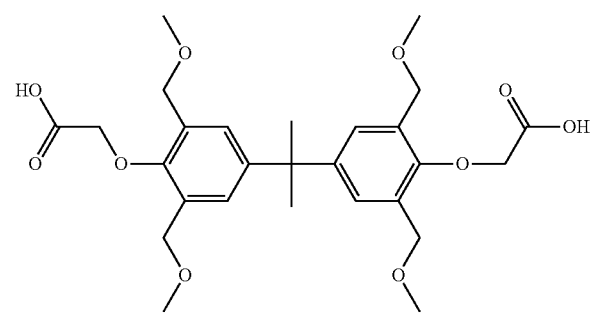
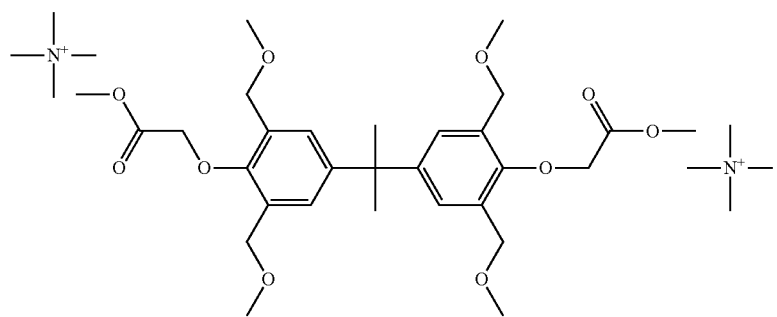

13
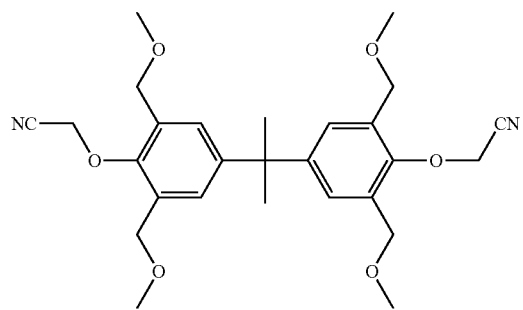
14
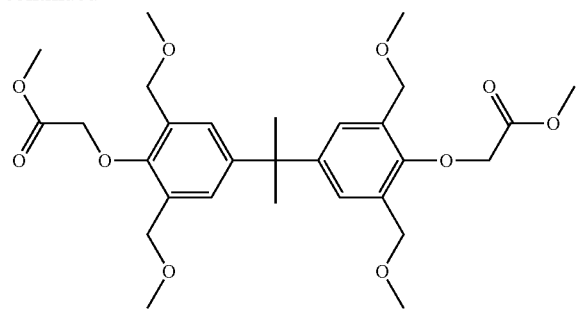
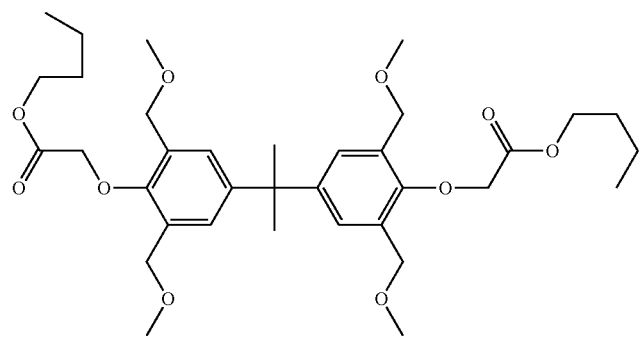
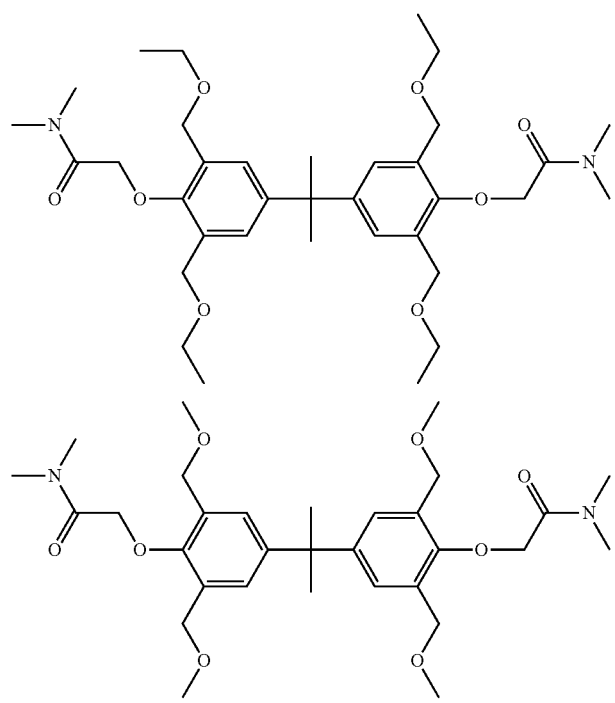

15
-continued
16
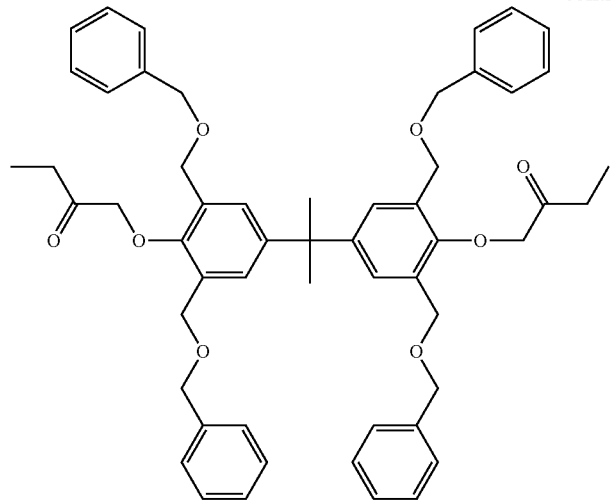
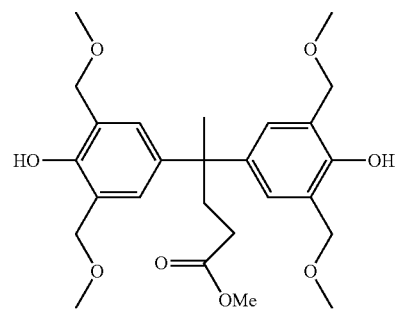
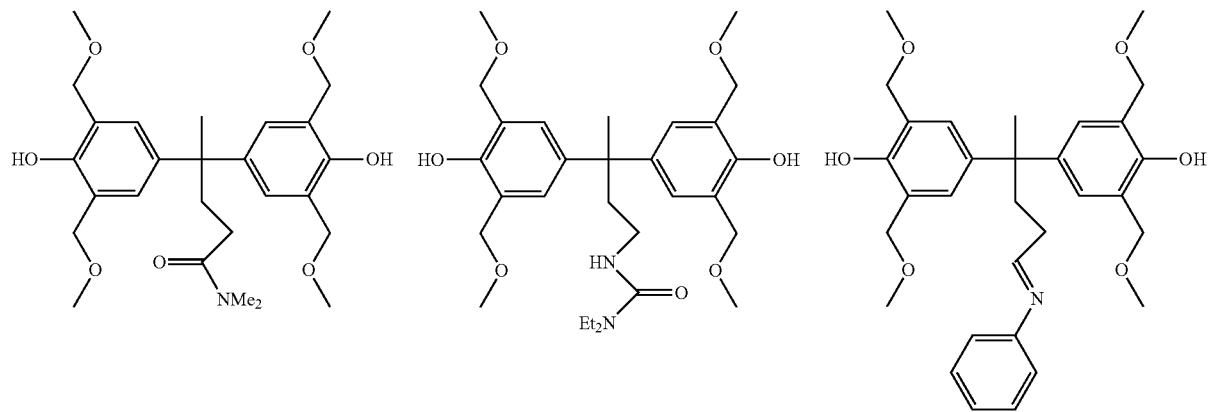
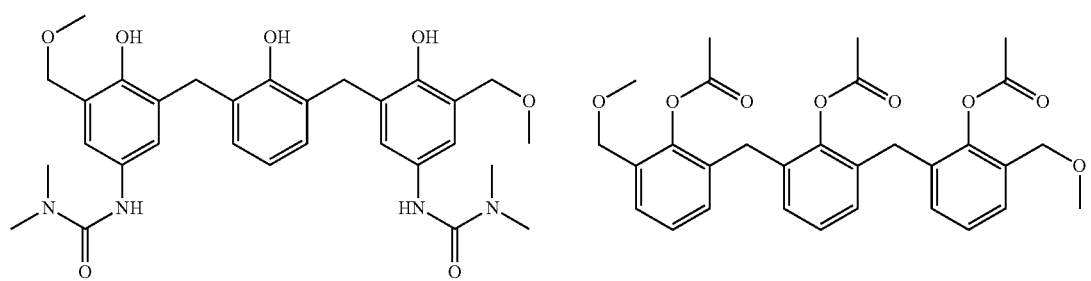

17 18
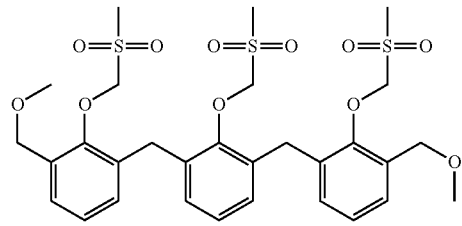 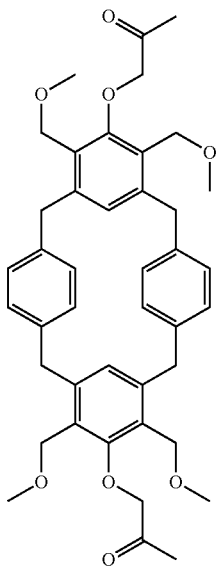 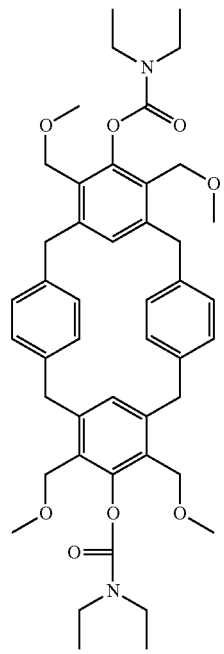
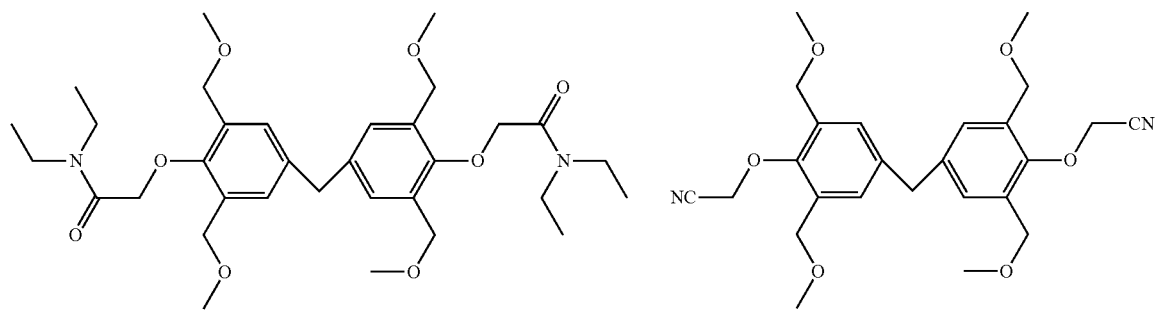
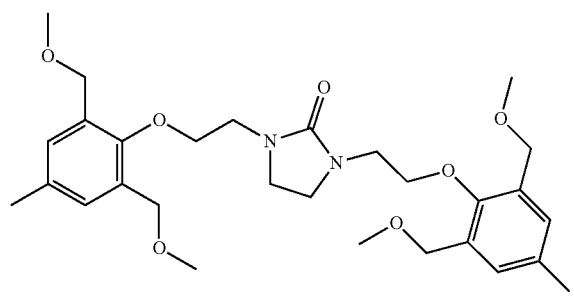
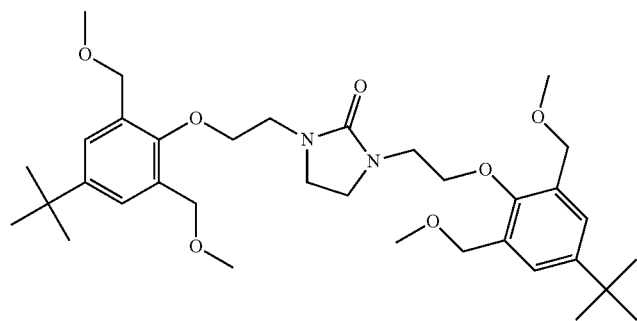

-continued
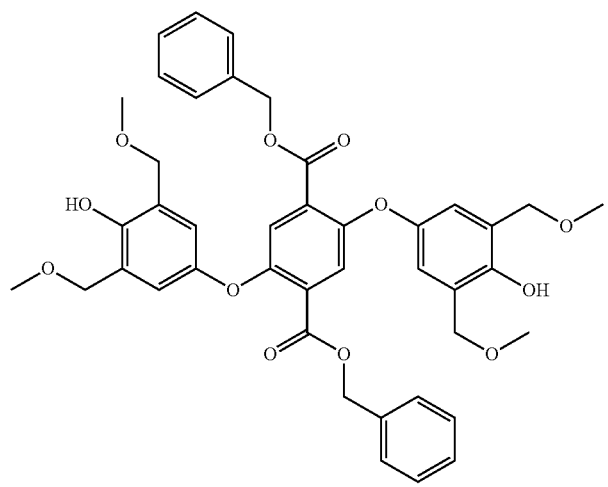
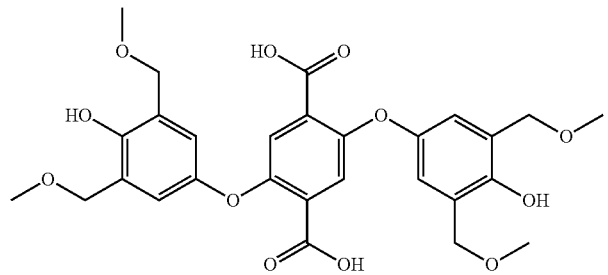
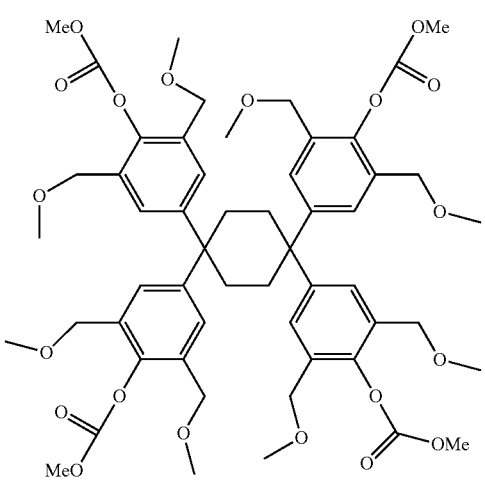
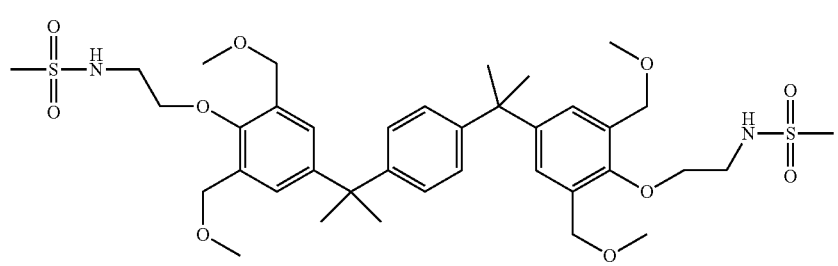
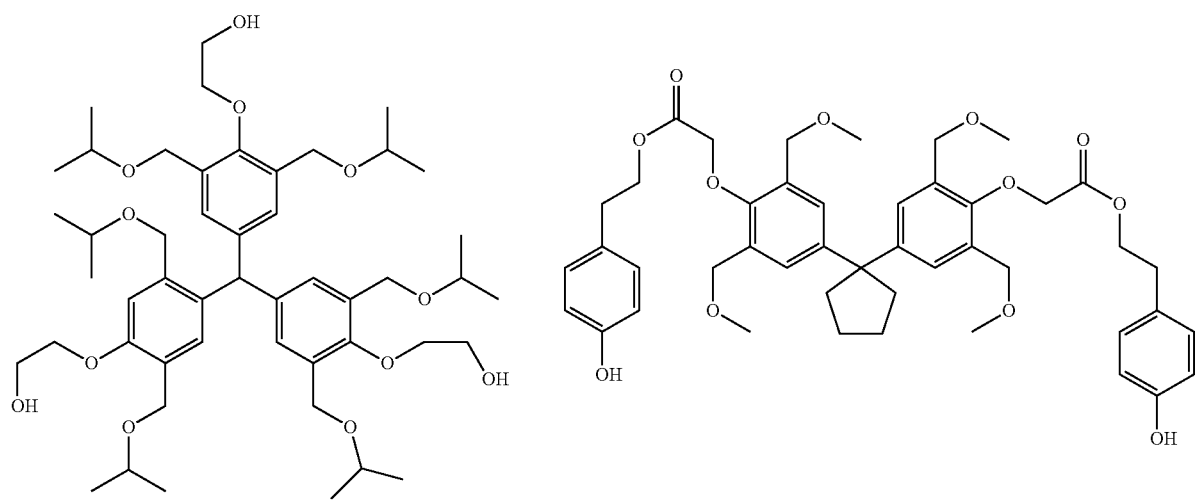

-continued
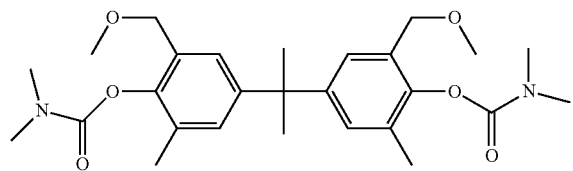
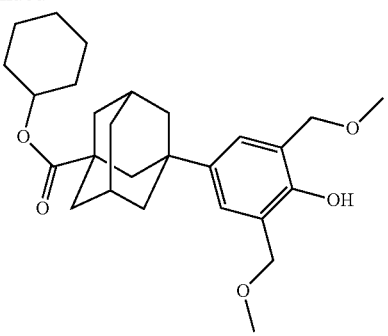
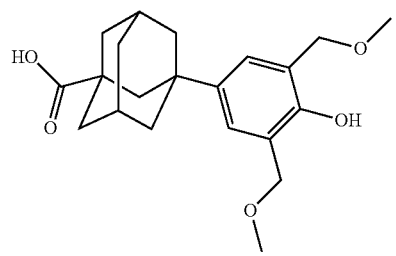
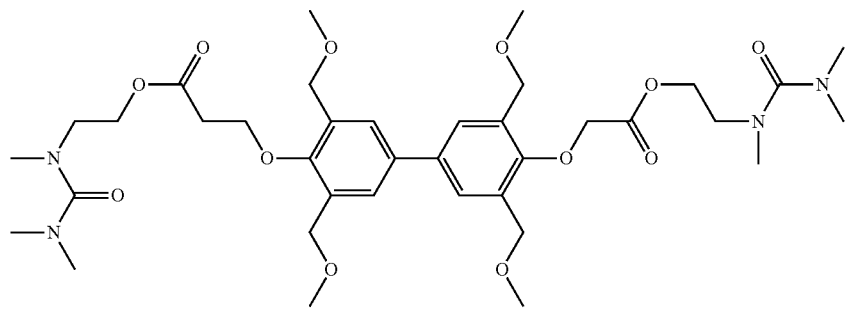
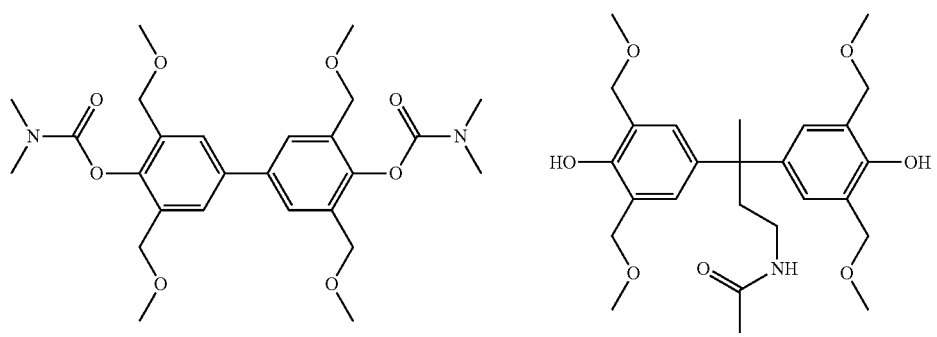
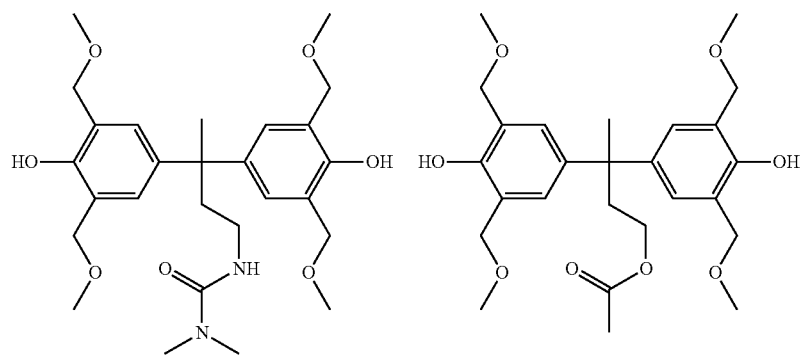

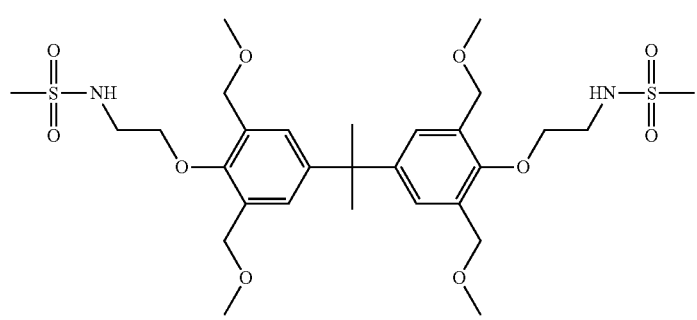
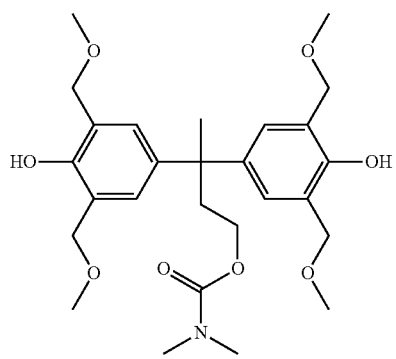

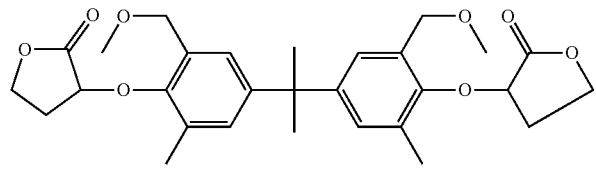

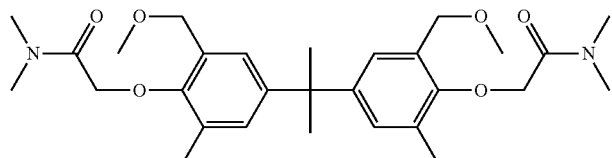

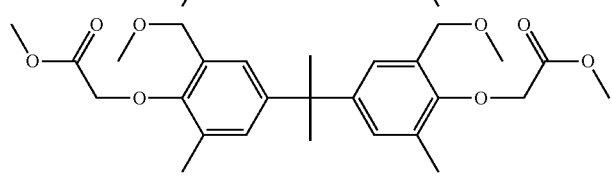

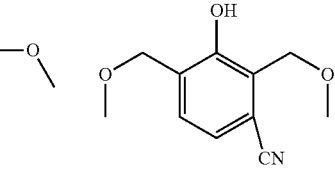

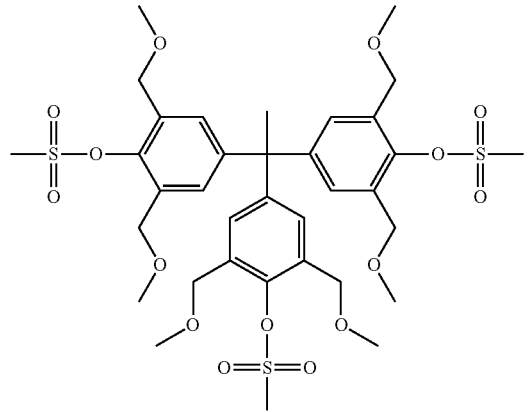
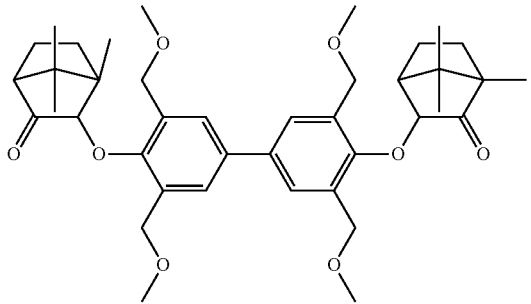

The crosslinking agent (C) of the present invention may be synthesized, for example, by the following method (i) or (ii).

(i) A method which includes the action of the corresponding acid chloride or sulfonic acid ester on the corresponding crosslinking agent having a phenolic hydroxyl group under the basic condition.

(ii) A method of introducing a structure represented by General Formula (2) through the action of paraformaldehyde or the like on a mother nucleus structure in which a polar group has been previously contained, under the basic condition.

The content of the crosslinking agent (C) in the present invention is preferably 5 mass % to 80 mass %, and more preferably 10 mass % to 40 mass %, based on the solid content of the actinic ray-sensitive or radiation-sensitive resin composition of the present invention.

Additionally, in the present invention, the crosslinking agent (C) may be used alone or in combination of two or more thereof.

<Resin (A)>

The actinic ray-sensitive or radiation-sensitive resin composition of the present invention contains a resin (A) including a repeating unit represented by General Formula (4).

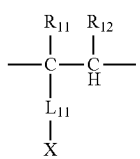

(4)

In General Formula (4), $R_{11}$ represents a hydrogen atom, a methyl group, or a trifluoromethyl group, $R_{12}$ represents a hydrogen atom or an alkyl group, $L_{11}$ represents a single bond or a linking group, and X represents —Ar(OX$_1$)m or —CO$_2$X$_2$ in which Ar represents an aromatic ring, $X_1$ represents a hydrogen atom, a group having a non-acid-decomposable hydrocarbon structure, or a group having an acid-decomposable group, $X_2$ represents a group capable of leaving by the action of an acid or a group having a group capable of leaving by the action of an acid, and m represents an integer of 1 to 12. $R_{12}$ and X may be bonded to each other to form a ring.

Examples of the alkyl group represented by $R_{12}$ include a methyl group and an ethyl group.

Examples of the linking group represented by $L_{11}$ include a carbonyl group, an alkylene group (preferably having 1 to 10 carbon atoms, and more preferably 1 to 5 carbon atoms), a sulfonyl group (—S(=O)$_2$—), —O—, —NH—, or a divalent linking group formed by combining these groups.

The aromatic ring represented by Ar is a monocyclic or polycyclic aromatic ring, and examples thereof include aromatic hydrocarbon rings having 6 to 18 carbon atoms which may have a substituent, such as a benzene ring, a naphthalene ring, an anthracene ring, a fluorene ring, and a phenanthrene ring; and aromatic heterocyclic rings containing heterocyclic rings such as a thiophene ring, a furan ring, a pyrrole ring, a benzothiophene ring, a benzofuran ring, a benzopyrrole ring, a triazine ring, an imidazole ring, a benzimidazole ring, a triazole ring, a thiadiazole ring, and a thiazole ring.

The term "non-acid-decomposable" in a group having a non-acid-decomposable hydrocarbon structure represented by $X_1$ means a property of not causing a decomposition reaction by an acid generated from a photoacid generator. For details and specific examples of the group having a non-acid-decomposable hydrocarbon structure, reference may be made to the description given below.

The term "acid-decomposable group" in a group having an acid-decomposable group represented by $X_1$ means a group capable of decomposing by the action of an acid to generate a polar group. For details and specific examples of the acid-decomposable group, reference may be made to the description for the acid-decomposable group containable in a repeating unit (a) to be described hereinafter.

The group capable of leaving by the action of an acid represented by $X_2$ is preferably represented, for example, by the following general formula.

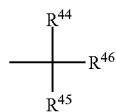

$R^{44}$ to $R^{46}$ each independently represent an alkyl group or a cycloalkyl group. Any two of $R^{44}$ to $R^{46}$ may be bonded to each other to form a cycloalkyl group.

The alkyl group of $R^{44}$ to $R^{46}$ is preferably a linear or branched alkyl group having 1 to 4 carbon atoms.

The cycloalkyl group of $R^{44}$ to $R^{46}$ is preferably a monocyclic cycloalkyl group having 3 to 8 carbon atoms or a polycyclic cycloalkyl group having 7 to 20 carbon atoms.

The cycloalkyl group which may be formed by bonding any two of $R^{44}$ to $R^{46}$ to each other is preferably a monocyclic cycloalkyl group having 3 to 8 carbon atoms or a polycyclic cycloalkyl group having 7 to 20 carbon atoms. Among them, particularly preferred is a monocyclic cycloalkyl group having 5 to 6 carbon atoms. More preferred is an embodiment in which $R^{46}$ is a methyl group or an ethyl group, and $R^{44}$ and $R^{45}$ are bonded to each other to form the above-mentioned cycloalkyl group.

$X_2$ is also preferably a group represented by the following general formula.

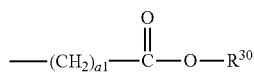

In the formula, $R^{30}$ represents a tertiary alkyl group having 4 to 20 carbon atoms, preferably 4 to 15 carbon atoms, a trialkylsilyl group in which each alkyl group has 1 to 6 carbon atoms, an oxoalkyl group having 4 to 20 carbon atoms, or a group represented by —C($R^{44}$)($R^{45}$)($R^{46}$). Specific examples of the tertiary alkyl group include a tert-butyl group, a tert-amyl group, a 1,1-diethylpropyl group, a 1-ethylcyclopentyl group, a 1-butylcyclopentyl group, a 1-ethylcyclohexyl group, a 1-butylcyclohexyl group, a 1-ethyl-2-cyclopentenyl group, a 1-ethyl-2-cyclohexenyl group, and a 2-methyl-2-adamantyl group. Specific examples of the trialkylsilyl group include a trimethylsilyl group, a triethylsilyl group, and a dimethyl-tert-butylsilyl group. Specific examples of the oxoalkyl group include a 3-oxocyclohexyl group, a 4-methyl-2-oxooxan-4-yl group, and a 5-methyl-2-oxooxolan-5-yl group. a1 is an integer of 1 to 6.

Examples of the ring formed by bonding $R_{12}$ and X to each other include a cyclopentyl ring, a cyclohexyl ring, and a cycloheptyl ring.

Also, in one embodiment of the present invention, the resin (A) preferably contains at least a repeating unit represented by the following General Formula (6), as a repeating unit represented by General Formula (4).

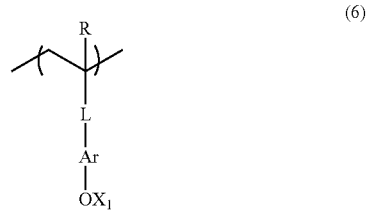

(6)

In General Formula (6), R represents a hydrogen atom or a methyl group, L represents a single bond or a divalent linking group, Ar represents an aromatic ring, and $X_1$ represents a hydrogen atom, or a group having a non-acid-decomposable hydrocarbon structure or an acid-decomposable group.

Here, L, Ar, and $X_1$ have the same definitions as $L_{11}$, Ar, and $X_1$ in General Formula (4), respectively.

Hereinafter, the resin (A) will be described in more detail.

In one embodiment, the resin (A) is preferably a resin containing at least one repeating unit having a phenolic hydroxyl group. That is, the resin (A) is preferably a resin containing at least a repeating unit in which X is —Ar—OH, as a repeating unit represented by General Formula (4).

According to the composition of the present invention comprised of the resin (A) and the above-described crosslinking agent (C), a crosslinking reaction takes place between the resin (A) containing a phenolic hydroxyl group and the above-described crosslinking agent (C) in the exposed area due to the action of an acid generated from an acid generator (B) upon irradiation with actinic rays or radiation, whereby a negative pattern is formed.

The repeating unit having a phenolic hydroxyl group is not particularly limited, but is preferably a repeating unit represented by the following General Formula (II).

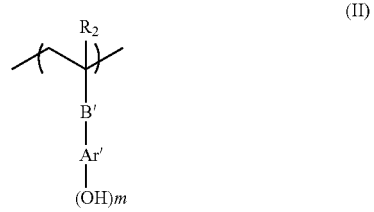
(II)

In the formula, $R_2$ represents a hydrogen atom, a methyl group which may have a substituent, or a halogen atom (preferably a fluorine atom);

B' represents a single bond or a divalent linking group;

Ar' represents an aromatic ring group; and m represents an integer of 1 or greater.

Examples of the methyl group which may have a substituent in $R_2$ include a trifluoromethyl group and a hydroxymethyl group.

$R_2$ is preferably a hydrogen atom or a methyl group, and a hydrogen atom is preferred from the viewpoint of developability.

The divalent linking group of B' is preferably a carbonyl group, an alkylene group (preferably having 1 to 10 carbon atoms, and more preferably 1 to 5 carbon atoms), a sulfonyl group (—S(=O)$_2$—), —O—, —NH—, or a divalent linking group formed by combining these groups.

B' preferably represents a single bond, a carbonyloxy group (—C(=O)—O—), or —C(=O)—NH—; and more preferably represents a single bond or a carbonyloxy group (—C(=O)—O—), and it is particularly preferable for B' to represent a single bond, from the viewpoint of enhancing dry etching resistance.

The aromatic ring of Ar' is a monocyclic or polycyclic aromatic ring, and examples thereof include aromatic hydrocarbon rings having 6 to 18 carbon atoms which may have a substituent, such as a benzene ring, a naphthalene ring, an anthracene ring, a fluorene ring, and a phenanthrene ring; and aromatic heterocyclic rings containing heterocyclic rings such as a thiophene ring, a furan ring, a pyrrole ring, a benzothiophene ring, a benzofuran ring, a benzopyrrole ring, a triazine ring, an imidazole ring, a benzimidazole ring, a triazole ring, a thiadiazole ring, and a thiazole ring. Among them, a benzene ring and a naphthalene ring are preferred from the viewpoint of resolution, and a benzene ring is most preferred from the viewpoint of sensitivity.

m is preferably an integer of 1 to 5, and most preferably 1. When m is 1 and Ar' is a benzene ring, the position of substitution of —OH may be a para-position, a meta-position, or an ortho-position with respect to the bonding position of the benzene ring to B' (when B' is a single bond, the polymer main chain). However, from the viewpoint of crosslinking reactivity, a para-position and a meta-position are preferred, and a para-position is more preferred.

The aromatic ring of Ar' may have a substituent other than the group represented by —OH, and examples of the substituent may include an alkyl group, a cycloalkyl group, a halogen atom, a hydroxyl group, an alkoxy group, a carboxyl group, an alkoxycarbonyl group, an alkylcarbonyl group, an alkylcarbonyloxy group, an alkylsulfonyloxy group, and an arylcarbonyl group.

The repeating unit having a phenolic hydroxyl group is more preferably a repeating unit represented by the following General Formula (II'), from the viewpoints of crosslinking reactivity, developability, and dry etching resistance.

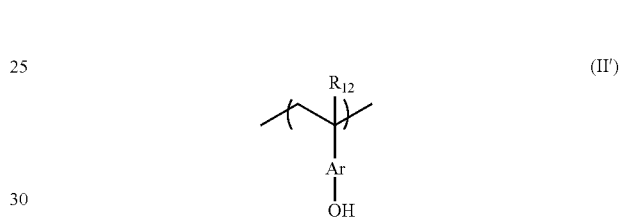
(II')

In General Formula (II'), $R_{12}$ represents a hydrogen atom or a methyl group.

Ar represents an aromatic ring.

$R_{12}$ represents a hydrogen atom or a methyl group, and is preferably a hydrogen atom in view of the developability.

Ar in General Formula (II') has the same definition as Ar' in General Formula (II), and a preferred range thereof is also the same as that in General Formula (II). As for the repeating unit represented by General Formula (II'), a repeating unit derived from hydroxystyrene (that is, a repeating unit of General Formula (II') in which $R_{12}$ is a hydrogen atom and Ar is a benzene ring) is preferred from the viewpoint of the sensitivity.

The resin (A) may be constituted by only the above-described repeating unit having a phenolic hydroxyl group. The resin (A) may have a repeating unit as described below, in addition to the above-described repeating unit having a phenolic hydroxyl group. In that case, the content of the repeating unit having a phenolic hydroxyl group is preferably 10 mol % to 98 mol %, more preferably 30 mol % to 97 mol %, and still more preferably 40 mol % to 95 mol %, based on the total content of the repeating units of the resin (A). Accordingly, particularly, in the case where the resist film is a thin film (for example, in the case where the thickness of the resist film is from 10 nm to 150 nm), it is possible to more reliably reduce the dissolution rate of an exposed area of the resist film of the present invention, which is formed using the resin (A), in an alkali developer (that is, it is possible to more reliably control the dissolution rate of the resist film employing the resin (A) to an optimum level). As a result, the sensitivity may be more reliably improved.

Examples of the repeating unit having a phenolic hydroxyl group will be described below, but are not limited thereto.

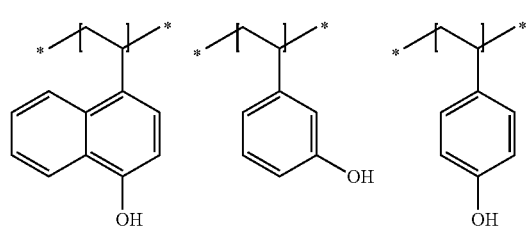
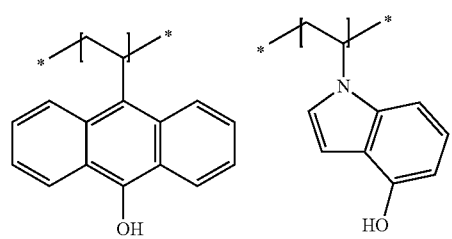
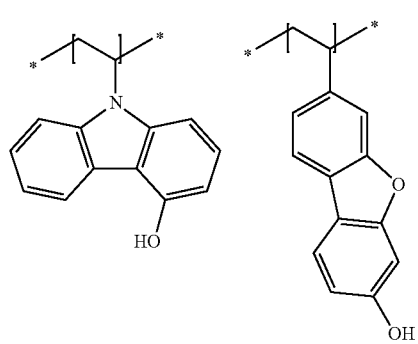
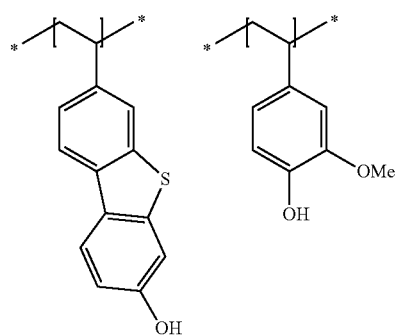
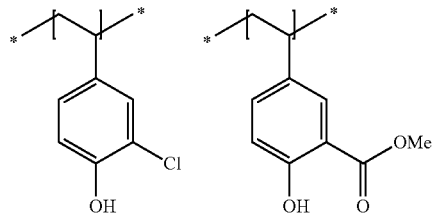
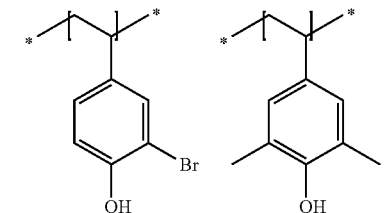
-continued
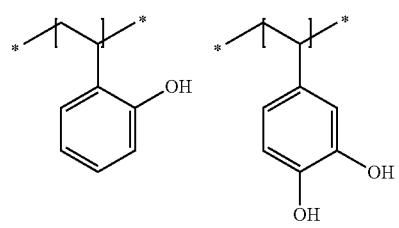
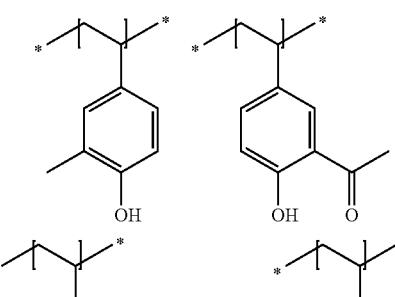
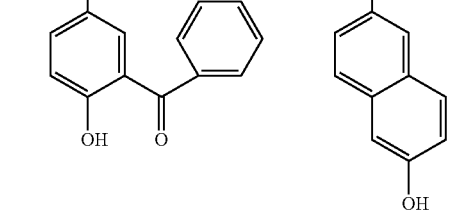
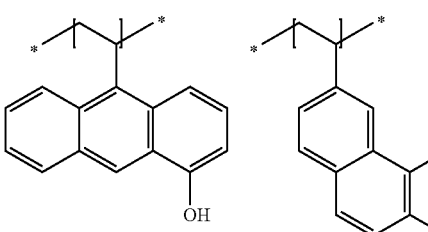
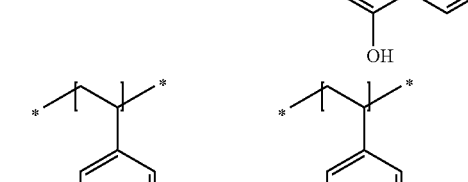
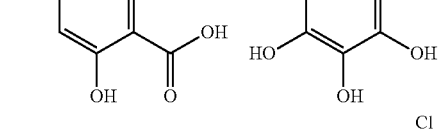
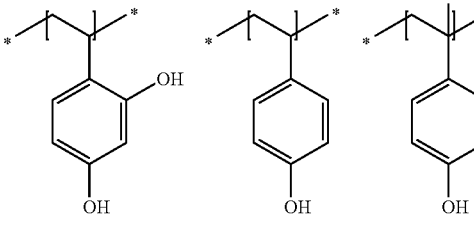
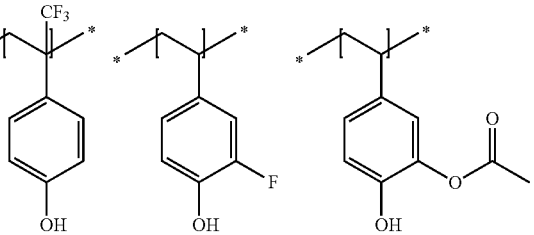

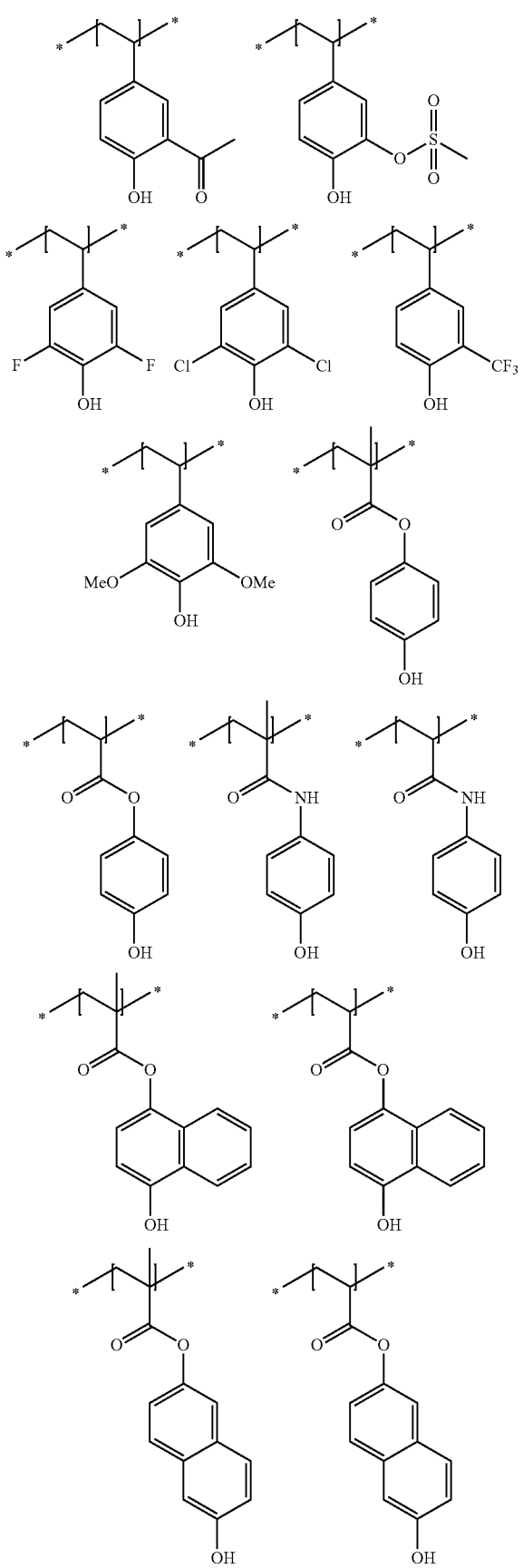

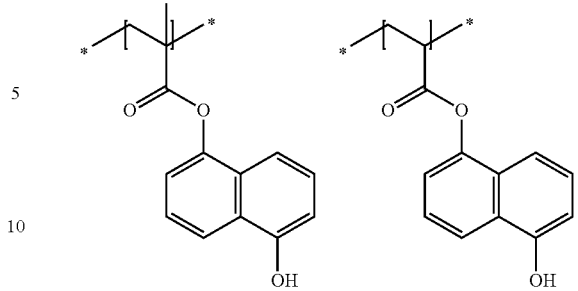

The resin (A) preferably has "a structure in which a hydrogen atom of the phenolic hydroxyl group is substituted with a group having a non-acid-decomposable hydrocarbon structure" from the viewpoints of achieving a high glass transition temperature (Tg) and favorable dry etching resistance. Here, the group having a non-acid-decomposable hydrocarbon structure corresponds to $X_1$ as —Ar(OX$_1$)n represented by X in General Formula (4).

Due to the fact that the resin (A) has a specific structure as described above, the glass transition temperature (Tg) of the resin (A) becomes high, so that a very hard resist film can be formed and the acid diffusion or dry etching resistance can be controlled. Accordingly, an acid is highly constrained from diffusion in the area exposed to actinic rays or radiation such as an electron beam and extreme ultraviolet rays, and this produces an excellent effect in terms of resolution, pattern profile, and LER in a fine pattern. Also, it is considered that the point that the resin (A) has a non-acid-decomposable hydrocarbon structure further contributes to an improvement in dry etching resistance. Furthermore, although details are unknown, it is presumed that the hydrocarbon structure has a high hydrogen radical-donating property and become to serve as a hydrogen source when decomposing a photoacid generator, as a result, the decomposition efficiency of the photoacid generator and in turn, the acid generation efficiency are further enhanced. This is considered to contribute to superior sensitivity.

In the aforementioned specific structure which may be taken by the resin (A) in the context of the present invention, an aromatic ring such as a benzene ring and a group having a non-acid-decomposable hydrocarbon structure are connected through an oxygen atom derived from a phenolic hydroxyl group. As described above, such a structure not only contributes to high dry etching resistance but also enables raising the glass transition temperature (Tg) of the resin (A). As a consequence, combinatorial effects thereof are believed to provide high resolution.

In the present invention, the "non-acid-decomposable" means a property of not causing a decomposition reaction by an acid generated from a photoacid generator.

More specifically, the group having a non-acid-decomposable hydrocarbon structure is preferably a group stable to an acid and an alkali. The term "group stable to an acid and an alkali" means a group not exhibiting acid decomposability and alkali decomposability. The term "acid decomposability" as used herein means a property of causing a decomposition reaction by the action of an acid generated from a photoacid generator.

Also, the term "alkali decomposability" means a property of causing a decomposition reaction by the action of an alkali developer, and the group exhibiting alkali decomposability includes the conventionally known group capable of decomposing by the action of an alkali developer to increase the dissolution rate in an alkali developer (for example, a group having a lactone structure), which is contained in the resin suitably used for the positive actinic ray-sensitive or radiation-sensitive resin composition.

The group having a hydrocarbon structure is not particularly limited as long as it is a monovalent group having a hydrocarbon structure, but the total number of carbon atoms thereof is preferably 5 to 40, and more preferably 7 to 30. The hydrocarbon structure may have an unsaturated bond in the ring.

The hydrocarbon structure in the group having a hydrocarbon structure means a structure having a chain-like or branched hydrocarbon group or a monocyclic alicyclic hydrocarbon group, or a polycyclic alicyclic hydrocarbon structure, and may be a crosslinked structure. The monocyclic alicyclic hydrocarbon group is preferably a cycloalkyl group having 3 to 8 carbon atoms, and examples thereof include a cyclopropyl group, a cyclopentyl group, a cyclohexyl group, a cyclobutyl group, and a cyclooctyl group. The structure having a monocyclic alicyclic hydrocarbon group may have plural such groups. The structure having plural monocyclic alicyclic hydrocarbon groups preferably has two to four monocyclic alicyclic hydrocarbon groups, and particularly preferably two monocyclic alicyclic hydrocarbon groups.

The chain-like or branched hydrocarbon group is a hydrocarbon group having 1 to 20 carbon atoms (more preferably having 1 to 10 carbon atoms, and still more preferably 1 to 7 carbon atoms), and examples thereof may include a propyl group, an isopropyl group, an n-butyl group, an s-butyl group, an isobutyl group, a pentyl group, an isopentyl group, a neopentyl group, a hexyl group, a 2-ethylhexyl group, and an octyl group.

The polycyclic alicyclic hydrocarbon structure includes, for example, a bicyclo-, tricyclo-, or tetracyclo-structure having 5 or more carbon atoms and is preferably a polycyclic cyclo-structure having 6 to 30 carbon atoms, and examples thereof include an adamantane structure, a decalin structure, a norbornane structure, a norbornene structure, a cedrol structure, an isobornane structure, a bornane structure, a dicyclopentane structure, an α-pinene structure, a tricyclodecane structure, a tetracyclododecane structure, and an androstane structure. Incidentally, a part of carbon atoms in the monocyclic or polycyclic cycloalkyl group may be substituted by a heteroatom such as oxygen atom.

The hydrocarbon structure is preferably an adamantane structure, a decalin structure, a norbornane structure, a norbornene structure, a cedrol structure, a structure having a plurality of cyclohexyl groups, a structure having a plurality of cycloheptyl groups, a structure having a plurality of cyclooctyl groups, a structure having a plurality of cyclodecanyl groups, a structure having a plurality of cyclododecanyl groups, or a tricyclodecane structure, and most preferably an adamantane structure in view of dry etching resistance (that is, it is most preferred that the group having a non-acid-decomposable hydrocarbon structure is a group having a non-acid-decomposable adamantane structure).

Chemical formulae of these hydrocarbon structures are illustrated below.

 (1)

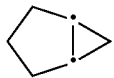 (2)

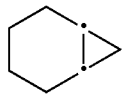 (3)

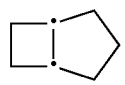 (4)

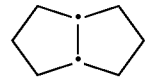 (5)

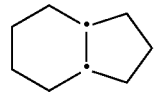 (6)

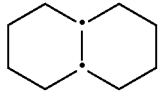 (7)

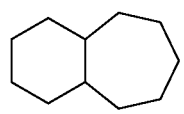 (8)

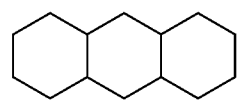 (9)

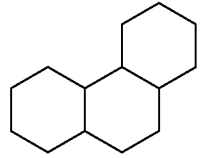 (10)

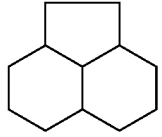 (11)

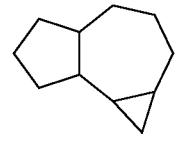 (12)

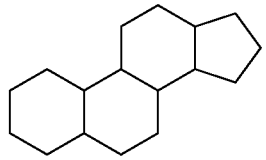 (13)

-continued
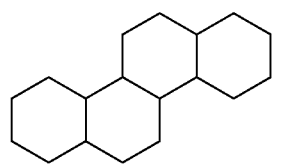
(14)
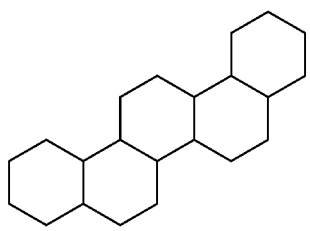
(15)
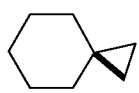
(16)
(17)
(18)
(19)
(20)
(21)
(22)
(23)
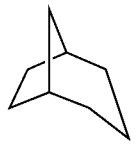
(24)
(25)
-continued
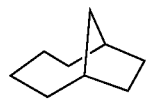
(26)
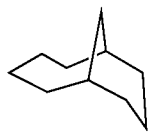
(27)
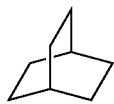
(28)
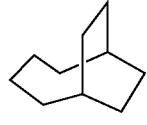
(29)
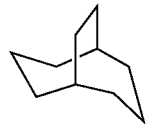
(30)
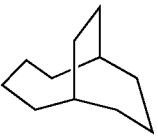
(31)
(32)
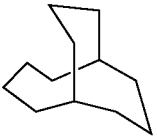
(33)
(34)
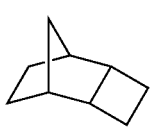
(35)
(36)
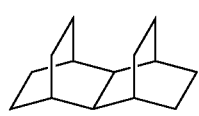
(37)

(38) 

(39) 

(40) 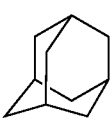

(41) 

(42) 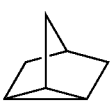

(43) 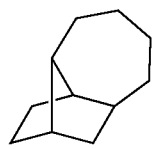

(44) 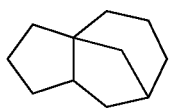

(45) 

(46) 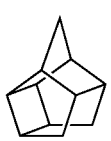

(47) 

(48) 

(49) 

(50) 

(51) 

The hydrocarbon structure may further have a substituent, and examples of the substituent may include an alkyl group (preferably having 1 to 6 carbon atoms), a cycloalkyl group (preferably having 3 to 10 carbon atoms), an aryl group (preferably having 6 to 15 carbon atoms), a halogen atom, a hydroxyl group, an alkoxy group (preferably having 1 to 6 carbon atoms), a carboxyl group, a carbonyl group, a thiocarbonyl group, an alkoxycarbonyl group (preferably having 2 to 7 carbon atoms), and a group formed by combining these groups (preferably having a total number of 1 to 30 carbon atoms, and more preferably a total number of 1 to 15 carbon atoms).

The hydrocarbon structure is preferably a structure represented by any one of Formulae (7), (23), (40), (41), and (51), or a structure having two monovalent groups each formed by substituting a bond for one arbitrary hydrogen atom in the structure of Formula (48), more preferably a structure represented by any one of Formulae (23), (40), and (51), or a structure having two monovalent groups each formed by substituting a bond for one arbitrary hydrogen atom in the structure of Formula (48), and most preferably a structure represented by Formula (40).

The group having a hydrocarbon structure is preferably a monovalent group formed by substituting a bond for one arbitrary hydrogen atom in the above-described hydrocarbon structure.

The repeating unit having the above-described "structure where a hydrogen atom of a phenolic hydroxyl group is substituted by a group having a non-acid-decomposable hydrocarbon structure", which is represented by General Formula (4), is more preferably contained as a repeating unit represented by the following General Formula (I) in the resin (A).

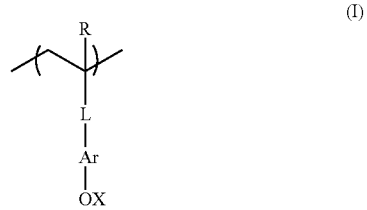

(I)

In General Formula (I), R represents a hydrogen atom or a methyl group, X represents a group having a non-acid-decomposable hydrocarbon group, Ar represents an aromatic ring, and L represents a divalent linking group.

In General Formula (I), R represents a hydrogen atom or a methyl group and is particularly preferably a hydrogen atom.

Examples of the aromatic ring of Ar in General Formula (I) may include an aromatic hydrocarbon ring having 6 to 18 carbon atoms which may have a substituent, such as a benzene ring, a naphthalene ring, an anthracene ring, a fluorene ring, and a phenanthrene ring, and an aromatic heterocyclic ring containing a heterocyclic ring such as a thiophene ring, a furan ring, a pyrrole ring, a benzothiophene ring, a benzofuran ring, a benzopyrrole ring, a triazine ring, an imidazole ring, a benzimidazole ring, a triazole ring, a thiadiazole ring, and a thiazole ring. Among these, a benzene ring and a naphthalene ring are preferred in view of resolution, and a benzene ring is most preferred.

The aromatic ring of Ar may have a substituent other than the group represented by —OX, and examples of the substituent may include an alkyl group (preferably having 1 to 6 carbon atoms), a cycloalkyl group (preferably having 3 to 10 carbon atoms), an aryl group (preferably having 6 to 15 carbon atoms), a halogen atom, a hydroxyl group, an alkoxy group (preferably having 1 to 6 carbon atoms), a carboxyl group, and an alkoxycarbonyl group (preferably having 2 to 7 carbon atoms). Among these, an alkyl group, an alkoxy group, and an alkoxycarbonyl group are preferred, and an alkoxy group is more preferred.

X represents a group having a non-acid-decomposable hydrocarbon group, and preferably represents a group having a non-acid-decomposable hydrocarbon structure. Specific examples and preferred ranges of the group having a non-acid-decomposable hydrocarbon structure represented by X are the same as those described above. X is more preferably a group represented by —Y—$X_2$ in later-described General Formula (I4).

The divalent linking group of L is preferably a carbonyl group, an alkylene group (preferably having 1 to 10 carbon atoms, and more preferably 1 to 5 carbon atoms), a sulfonyl group (—S(=O)$_2$—), —O—, —NH—, or a divalent linking group formed by combining these groups.

L preferably represents a single bond, a carbonyloxy group (—C(=O)—O—), or —C(=O)—NH—, more preferably a single bond or a carbonyloxy group (—C(=O)—O—), and from the viewpoint of improving dry etching resistance, particularly preferably a single bond.

In the present invention, the repeating unit represented by General Formula (I) is preferably a repeating unit represented by the following General Formula (I4).

When the polymer resin (A) having a repeating unit represented by General Formula (I4) is used, Tg of the polymer resin (A) becomes high and a very hard resist film is formed, so that the acid diffusion and dry etching resistance can be more reliably controlled.

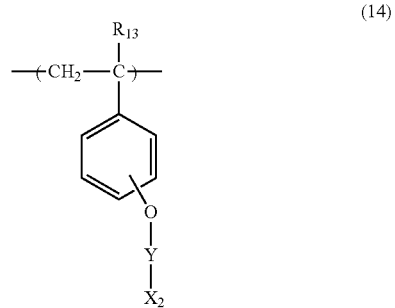

(I4)

In General Formula (I4), $R_{13}$ represents a hydrogen atom or a methyl group.

Y represents a single bond or a divalent linking group.

$X_2$ represents a non-acid-decomposable hydrocarbon group.

Preferred embodiments of the repeating unit represented by General Formula (I4) for use in the present invention are described below.

In General Formula (I4), $R_{13}$ represents a hydrogen atom or a methyl group and is particularly preferably a hydrogen atom.

In General Formula (I4), Y is preferably a divalent linking group. The divalent linking group of Y is preferably a carbonyl group, a thiocarbonyl group, an alkylene group (preferably having 1 to 10 carbon atoms, and more preferably 1 to 5 carbon atoms), a sulfonyl group, —COCH$_2$—, —NH—, or a divalent linking group formed by combining these groups (preferably having a total number of 1 to 20 carbon atoms, and more preferably a total number of 1 to 10 carbon atoms), more preferably a carbonyl group, —COCH$_2$—, a sulfonyl group, —CONH—, or —CSNH—, still more preferably a carbonyl group or —COCH$_2$—, and particularly preferably a carbonyl group.

$X_2$ represents a hydrocarbon group and is non-acid-decomposable. The total number of carbon atoms of the hydrocarbon group is preferably 5 to 40, and more preferably 7 to 30. The hydrocarbon group may have an unsaturated bond in the ring thereof.

This hydrocarbon group is a chain-like or branched hydrocarbon group, a group having a monocyclic alicyclic hydrocarbon group, or a polycyclic alicyclic hydrocarbon group, and may be a crosslinked group. The monocyclic alicyclic hydrocarbon group is preferably a cycloalkyl group having 3 to 8 carbon atoms, and examples thereof may include a cyclopropyl group, a cyclopentyl group, a cyclohexyl group, a cyclobutyl group, and a cyclooctyl group. The group having a monocyclic alicyclic hydrocarbon group may have plural such groups. The group having plural monocyclic alicyclic hydrocarbon groups preferably has two to four monocyclic alicyclic hydrocarbon groups, and particularly preferably two monocyclic alicyclic hydrocarbon groups.

The chain-like or branched hydrocarbon group is preferably a group having 1 to 20 carbon atoms, more preferably a group having 1 to 10 carbon atoms, and still more preferably a group having 1 to 7 carbon atoms.

Specific examples of the chain-like or branched hydrocarbon group may include a propyl group, an isopropyl group, an n-butyl group, an s-butyl group, an isobutyl group, a pentyl group, an isopentyl group, a neopentyl group, a hexyl group, a 2-ethylhexyl group, and an octyl group.

The polycyclic alicyclic hydrocarbon group may include a group containing, for example, a bicyclo-, tricyclo-, or tetracyclo-structure having 5 or more carbon atoms and is preferably a group containing a polycyclic cyclo-structure having 6 to 30 carbon atoms, and examples thereof include an adamantyl group, a norbornyl group, a norbornenyl group, an isobornyl group, a camphanyl group, a dicyclopentyl group, an α-pinel group, a tricyclodecanyl group, a tetracyclododecyl group, and an androstanyl group. Incidentally, a part of carbon atoms in the monocyclic or polycyclic cycloalkyl group may be substituted by a heteroatom such as oxygen atom.

The polycyclic alicyclic hydrocarbon group of $X_2$ is preferably an adamantyl group, a decalin group, a norbornyl group, a norbornenyl group, a cedrol group, a group having a plurality of cyclohexyl groups, a group having a plurality of cycloheptyl groups, a group having a plurality of cyclooctyl groups, a group having a plurality of cyclodecanyl groups, a group having a plurality of cyclododecanyl groups, or a tricyclodecanyl group, and most preferably an adamantyl group in view of dry etching resistance. Examples of the chemical formula of the hydrocarbon structure in the hydrocarbon group of $X_2$ are the same as those of the chemical formula of the hydrocarbon structure in the above-described group having a hydrocarbon structure, and a preferred range thereof is also the same. The hydrocarbon group of $X_2$ includes a monovalent group formed by substituting a bond for one arbitrary hydrogen atom in the above-described hydrocarbon structure.

The alicyclic hydrocarbon group may further have a substituent, and examples of the substituent are the same as those described above as the substituent which may be substituted on the hydrocarbon structure.

In General Formula (I4), the substitution position of —O—Y—$X_2$ may be a para-position, a meta-position, or an ortho-position with respect to the bonding position of the benzene ring to the polymer main chain but is preferably a para-position.

In the present invention, the repeating unit represented by General Formula (I) is most preferably a repeating unit represented by the following General Formula (4'):

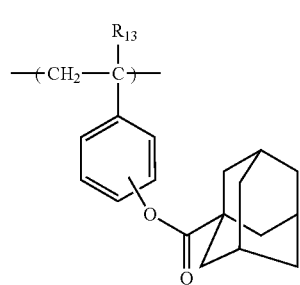

(4')

In General Formula (4'), $R_{13}$ represents a hydrogen atom or a methyl group.

In General Formula (4'), $R_{13}$ represents a hydrogen atom or a methyl group and is particularly preferably a hydrogen atom.

In General Formula (4'), the substitution position of the adamantyl ester group may be a para-position, a meta-position, or an ortho-position with respect to the bonding position of the benzene ring to the polymer main chain but is preferably a para-position.

Specific examples of the repeating unit having "a structure where a hydrogen atom of the phenolic hydroxyl group is substituted by a group having a non-acid-decomposable hydrocarbon structure" may include the following repeating units.

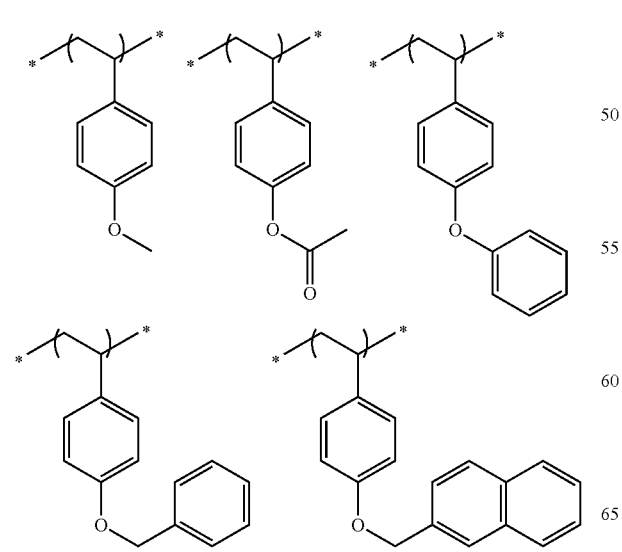

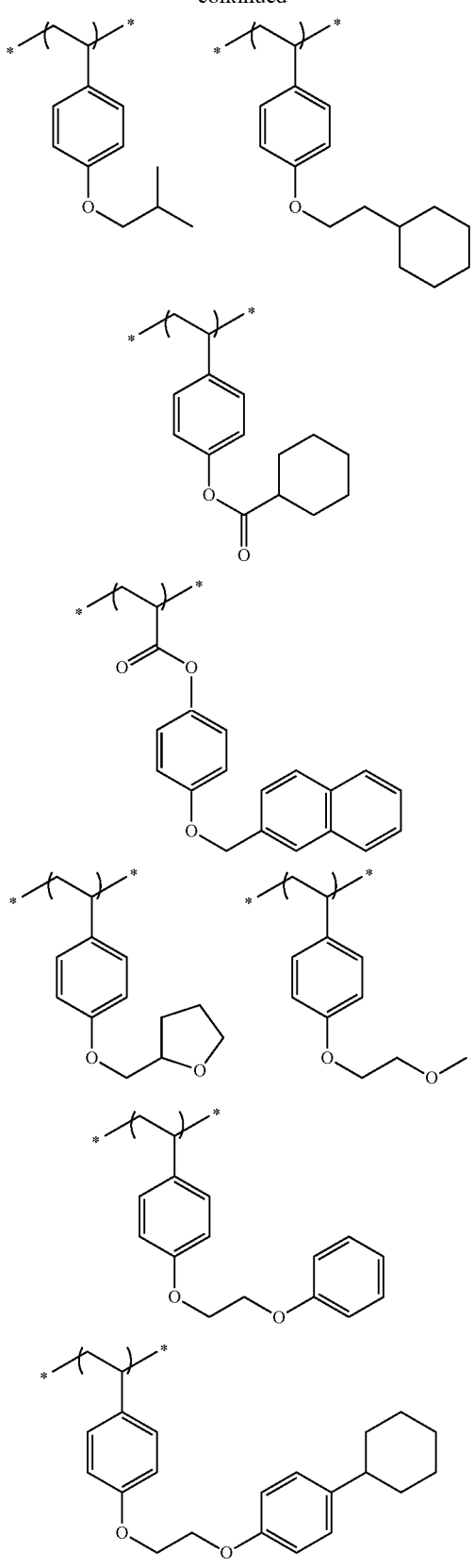

Among these, specific examples of the repeating unit represented by General Formula (I4) are as follows.

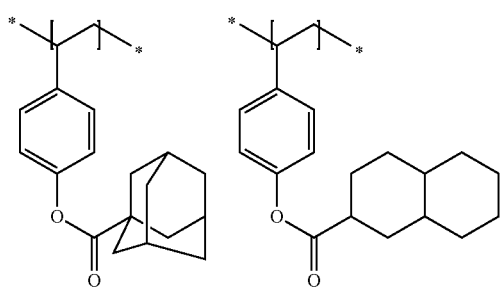
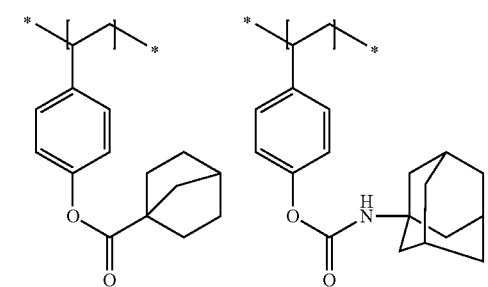
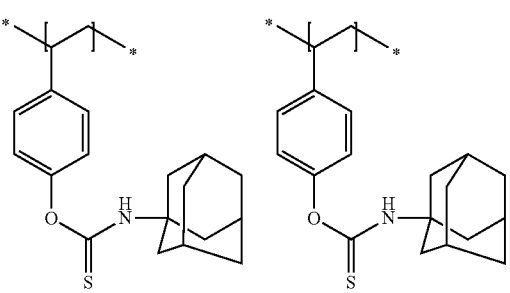
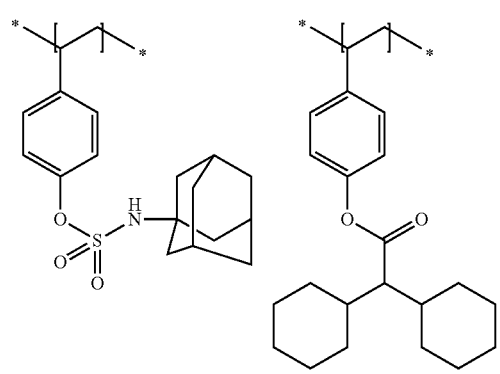
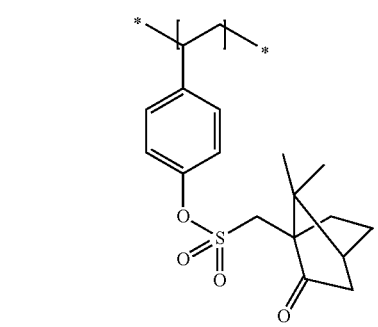
-continued
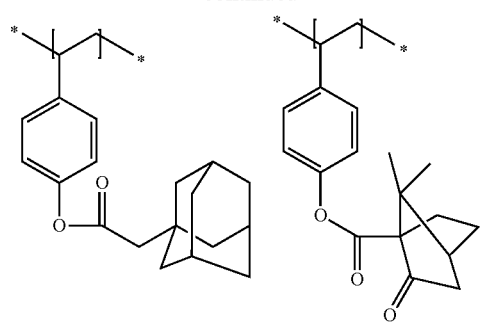
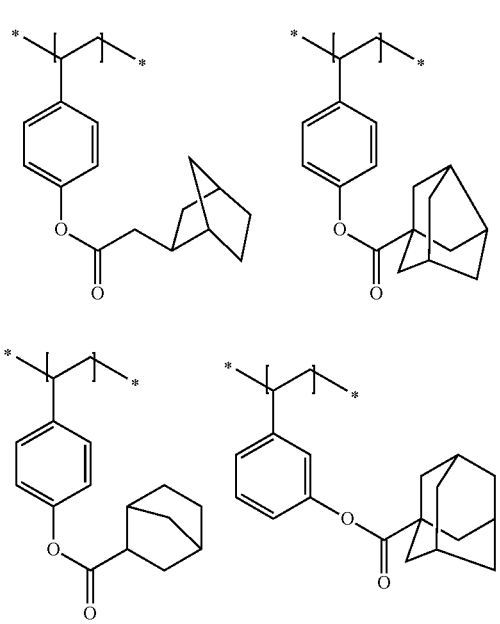
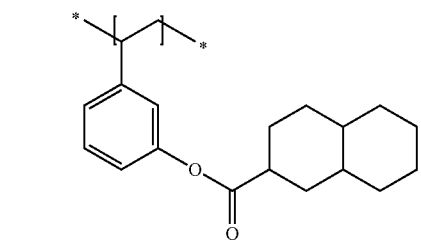
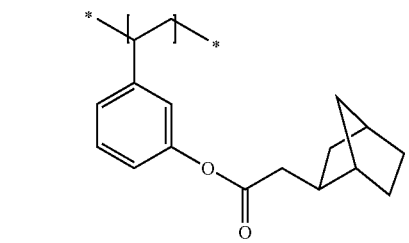
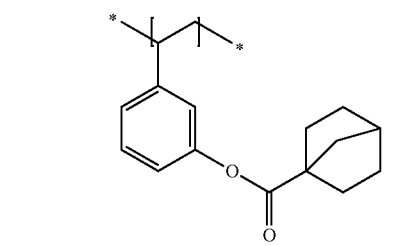

-continued
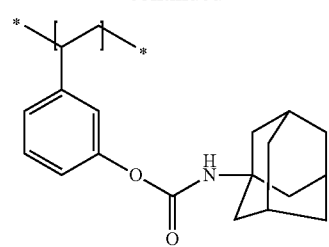
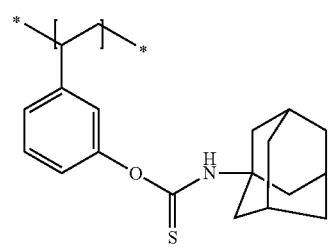
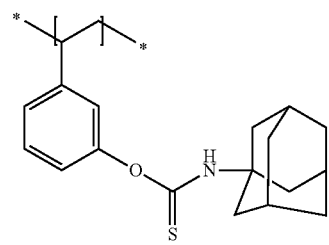
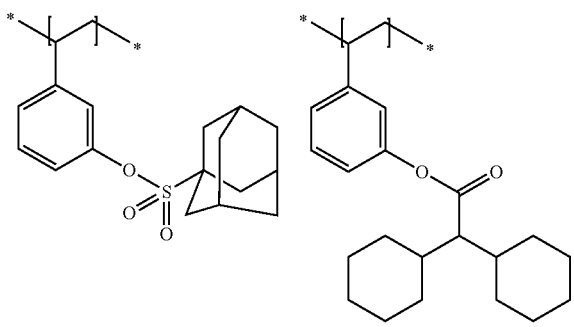
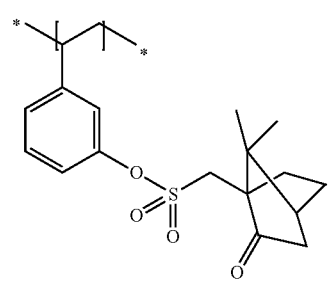
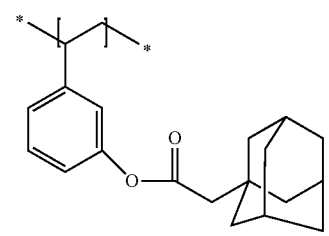
-continued
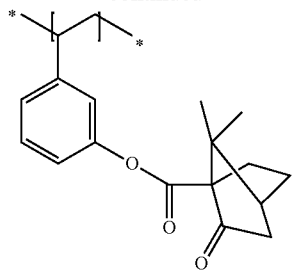
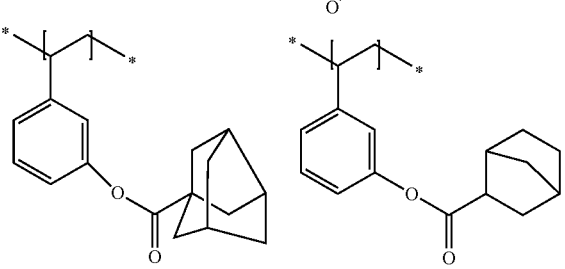
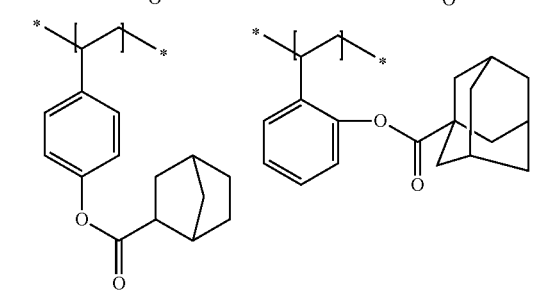
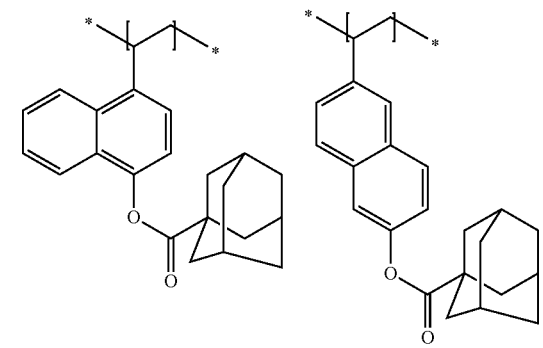
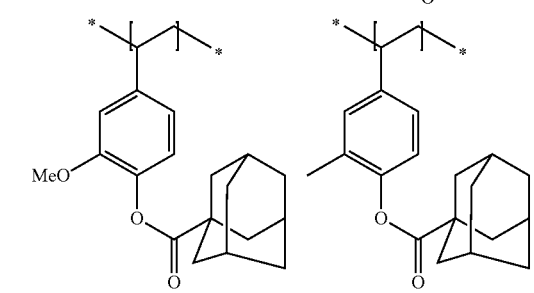
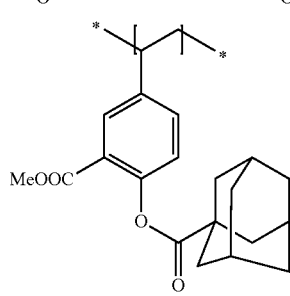

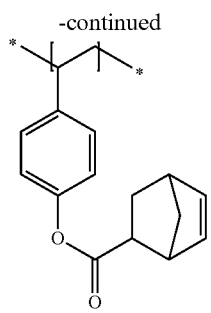

In the case where the resin (A) is a resin containing the repeating unit having the above-described "structure where a hydrogen atom of the phenolic hydroxyl group is substituted by group having a non-acid-decomposable hydrocarbon structure", the content of the repeating unit is preferably 1 mol % to 40 mol %, and more preferably 2 mol % to 30 mol %, based on total repeating units constituting the resin (A).

The resin (A) may have a crosslinkable group, and preferably has a repeating unit containing a crosslinkable group.

Examples of the repeating unit containing a crosslinkable group may preferably include the following repeating unit (Q).

(a) Repeating unit (Q)

The repeating unit (Q) is a structure containing at least one methylol group which may have a substituent.

The repeating unit (Q) is preferably represented by the following General Formula

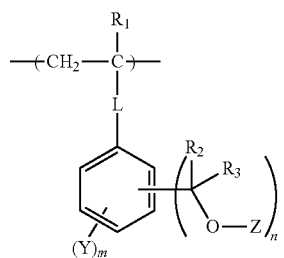

(1)

In General Formula (1), $R_1$ represents a hydrogen atom, a methyl group, or a halogen atom.

$R_2$ and $R_3$ represent a hydrogen atom, an alkyl group, or a cycloalkyl group.

L represents a divalent linking group or a single bond.

Y represents a monovalent substituent except for a methylol group.

Z represents a hydrogen atom or substituent.

m represents an integer of 0 to 4.

n represents an integer of 1 to 5.

m+n is 5 or less.

In the case where m is 2 or more, plural Y's may be the same as or different from each other.

In the case where n is 2 or more, plural $R_2$'s, $R_3$'s, and Z's may be the same as or different from each other.

Furthermore, any two or more of Y, $R_2$, $R_3$, and Z may be bonded to each other to form a ring structure. As used herein, the expression "two or more of Y, $R_2$, $R_3$, and Z may be bonded to each other to form a ring structure" means that in the case where there are plural groups represented by the same symbols, the groups represented by the same symbols may be bonded to each other to form a ring structure, or the groups represented by different symbols may be bonded to each other to form a ring.

The content of the repeating unit (Q) is preferably 5 mol % to 50 mol %, and more preferably 10 mol % to 40 mol %, based on the total repeating units included in the resin (A) from the viewpoints of crosslinking efficiency and developability.

Specific examples of the repeating unit (Q) may include the following structures.

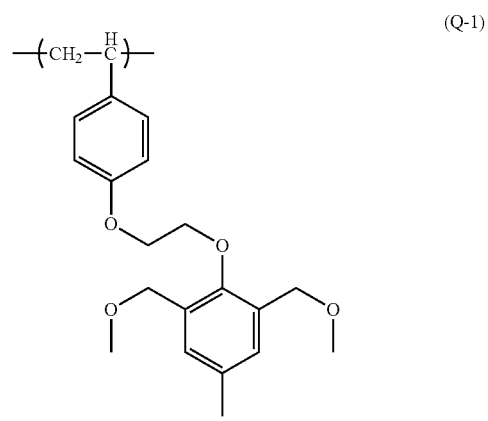

(Q-1)

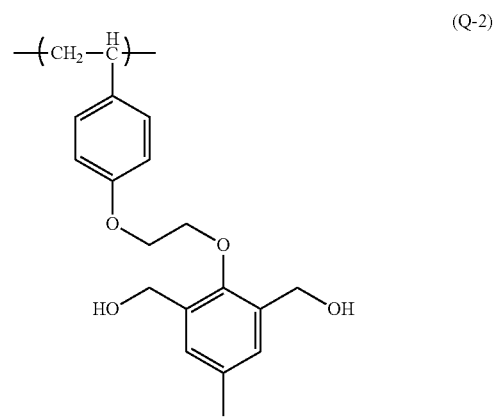

(Q-2)

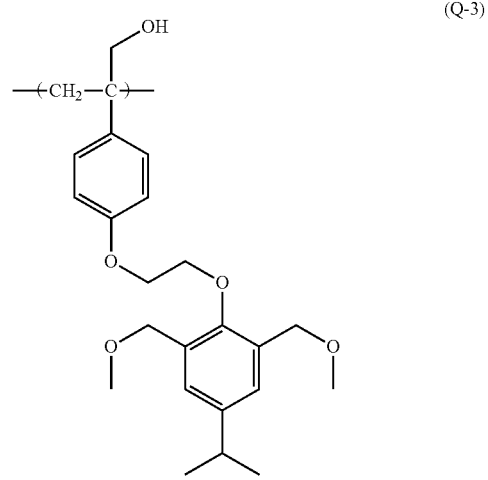

(Q-3)

-continued
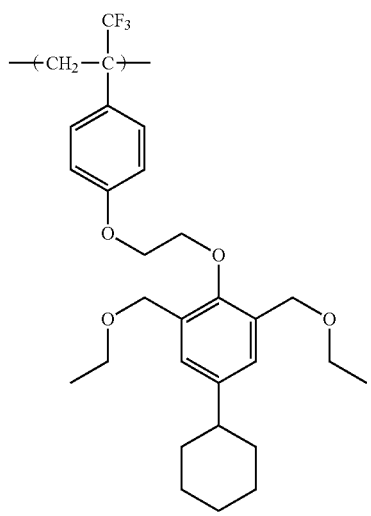
(Q-4)
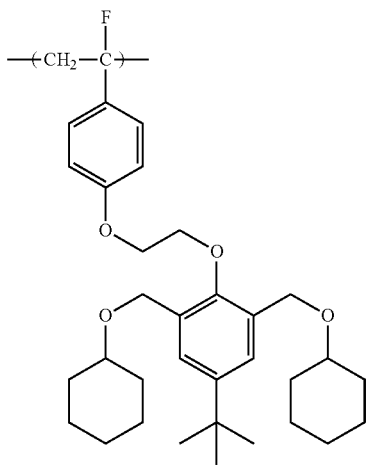
(Q-7)
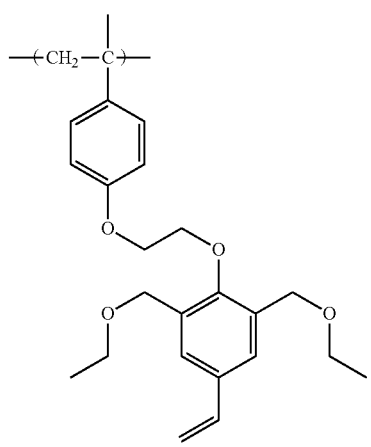
(Q-5)
(Q-8)
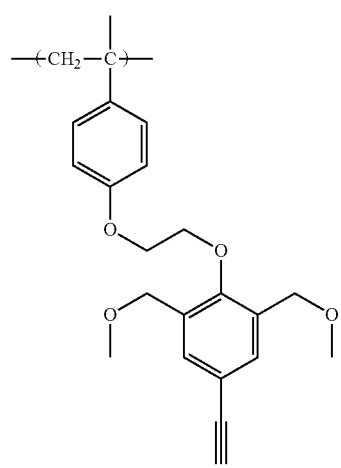
(Q-6)
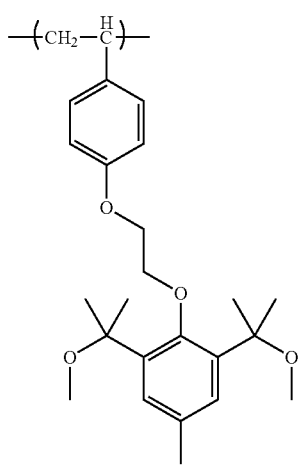
(Q-9)

(Q-10) 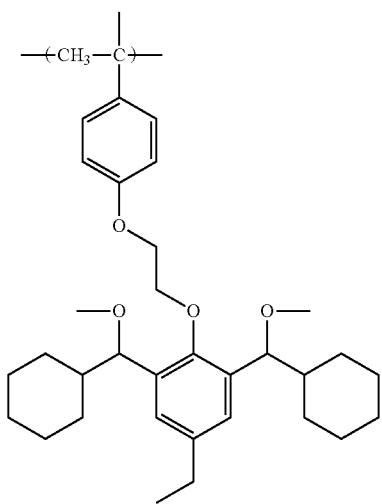
(Q-11) 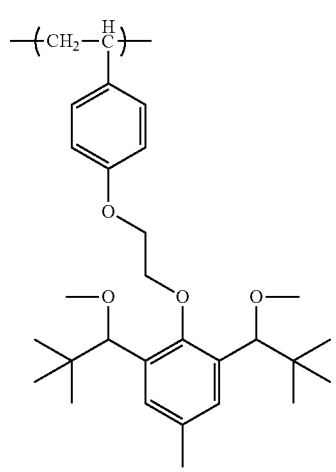
(Q-12) 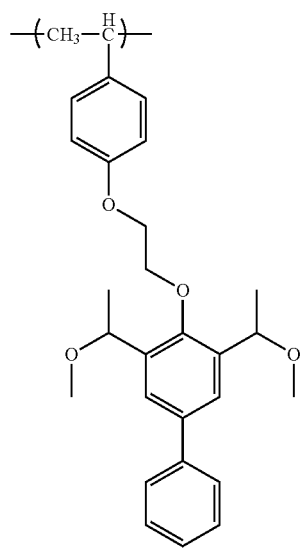
(Q-13) 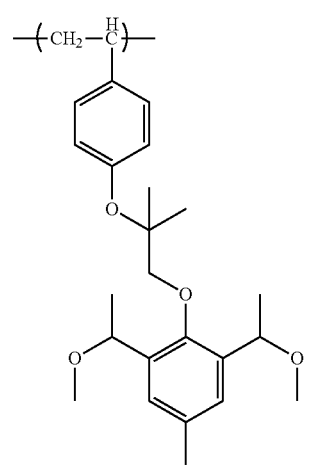
(Q-14) 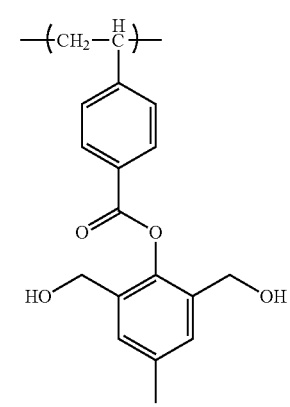
(Q-15) 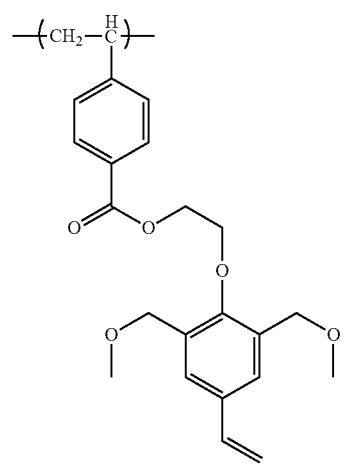
(Q-93) 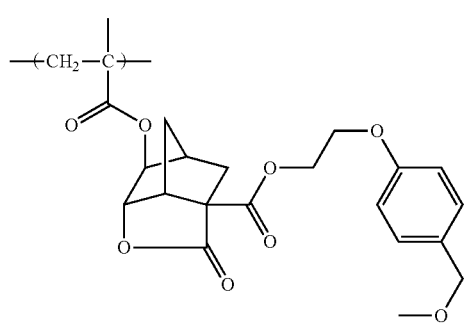

(Q-94)
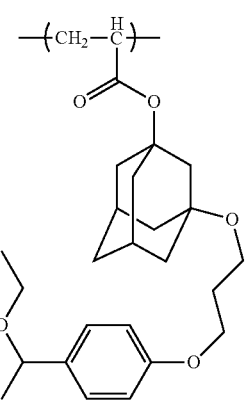
(Q-95)
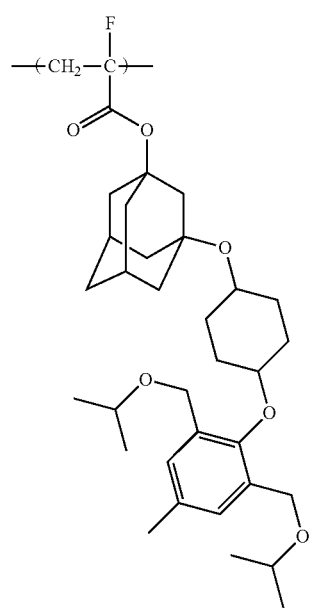
(Q-96)
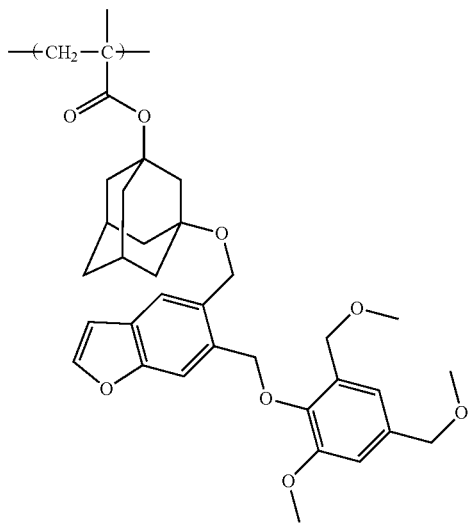
(Q-97)
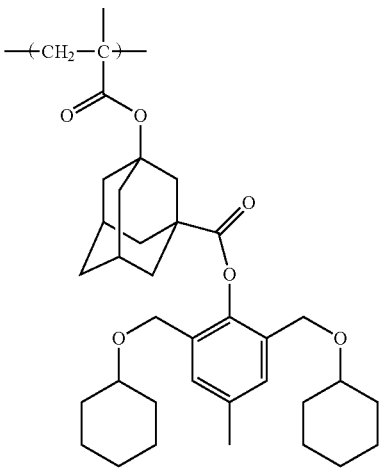
(Q-98)
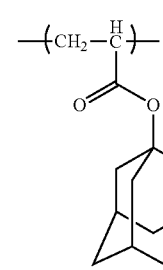
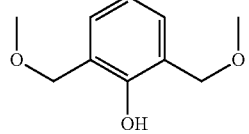
(Q-99)
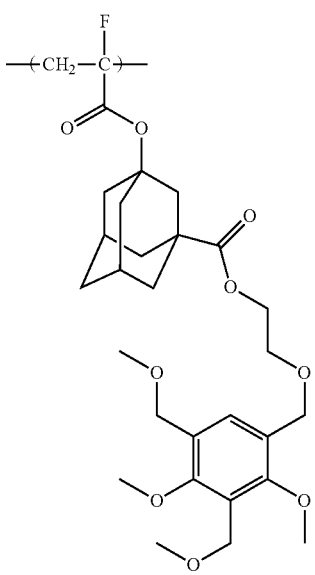

(Q-100)
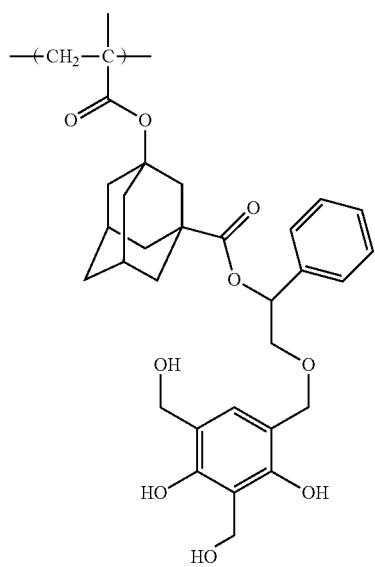
(Q-101)
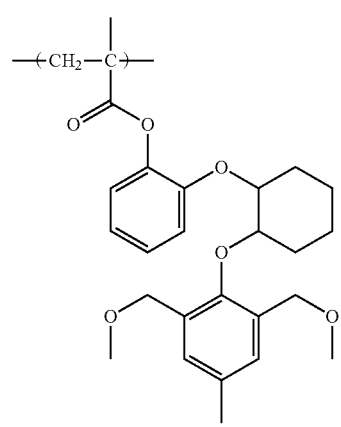
(Q-102)
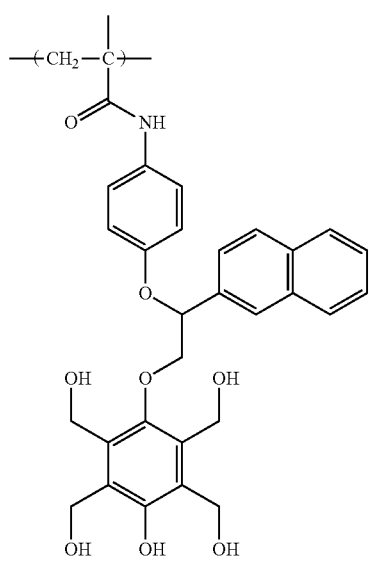
(Q-103)
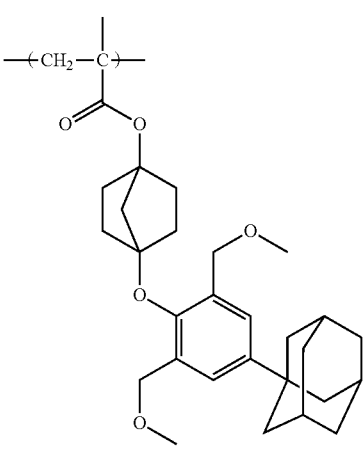
(Q-104)
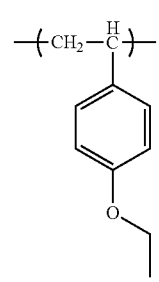
(Q-105)
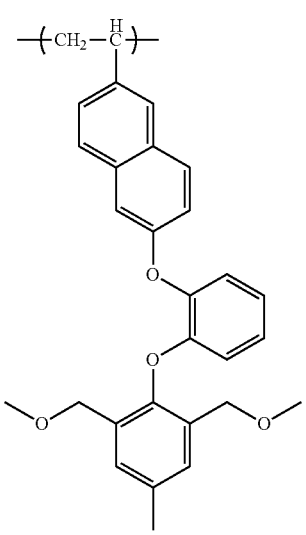
(b) Repeating Unit represented by General Formula (1-1) or (1-2)
Preferred examples of the repeating unit having a cross-linkable group may also include repeating units represented by the following General Formula (1-1) or (1-2).

(1-1)

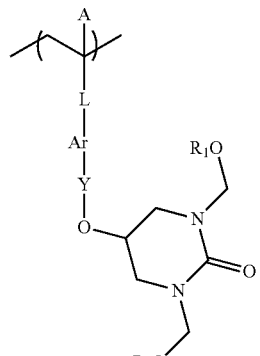

(1-2)

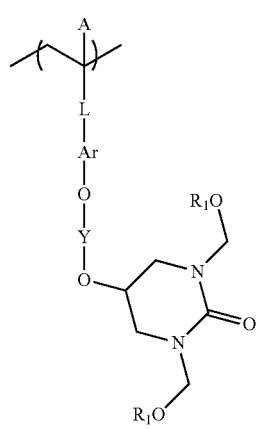

In General Formulae (1-1) and (1-2), A represents a hydrogen atom, a fluorine atom, a methyl group, or a trifluoromethyl group. $R_1$ represents a hydrogen atom, or a liner, branched or cyclic monovalent hydrocarbon group having 1 to 6 carbon atoms. L represents a single bond or a divalent linking group. Ar represents a divalent aromatic ring group. Y represents a single bond or a divalent linking group.

Preferred specific examples of the repeating unit represented by General Formulae (1-1) and (1-2) include the following repeating units, but are not limited thereto.

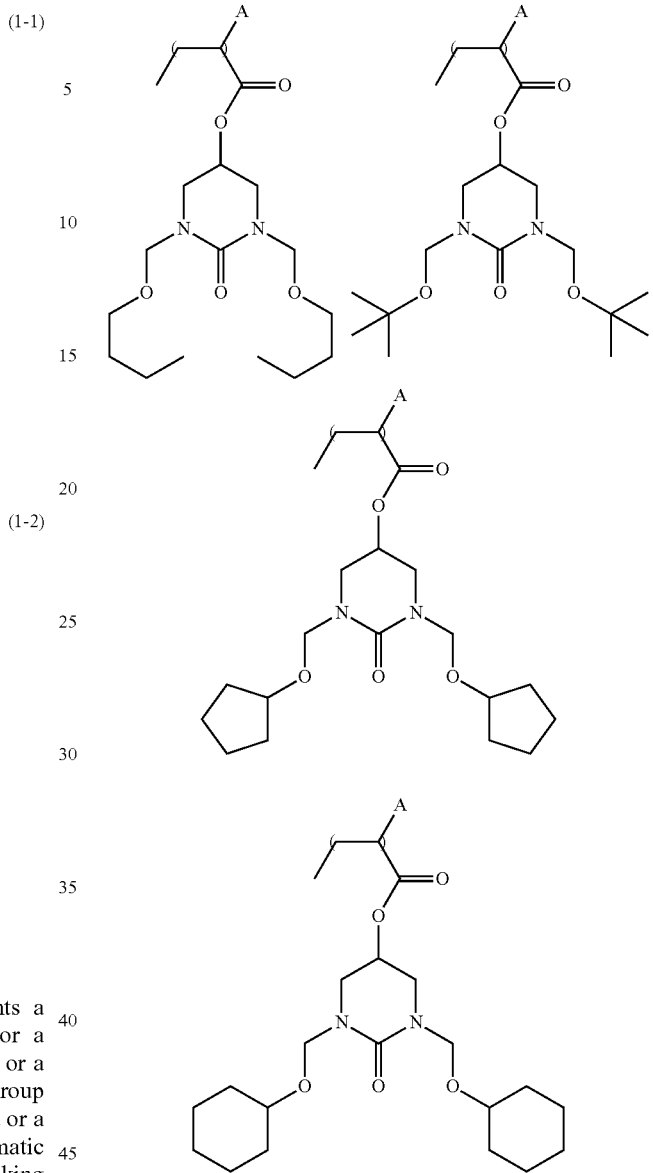

(In the formulae, A is as defined above)

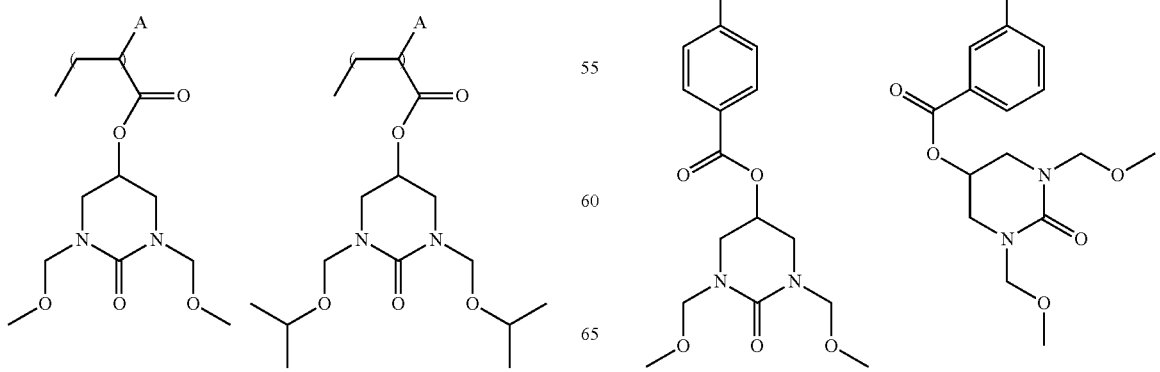

59
-continued
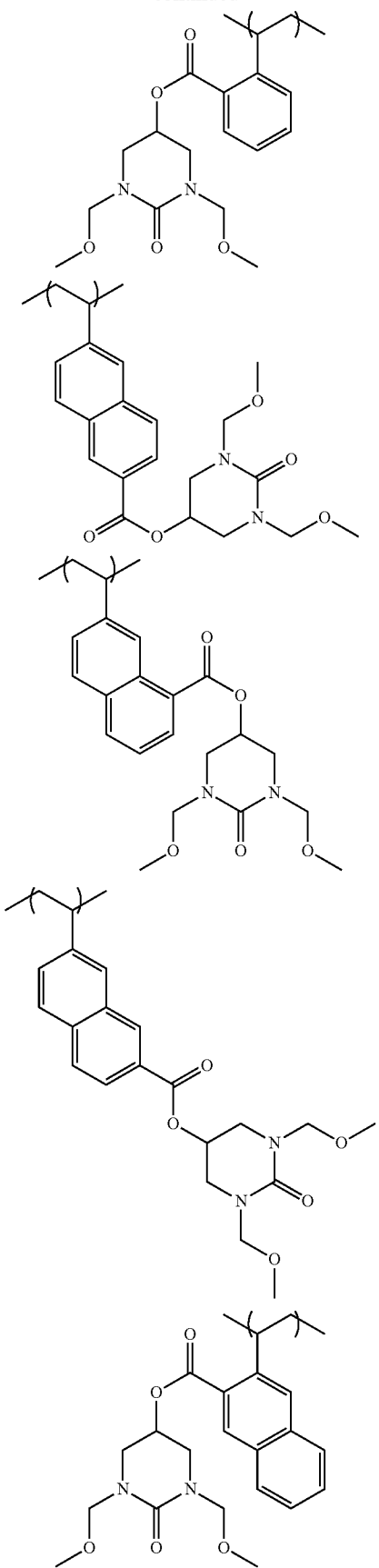
60
-continued
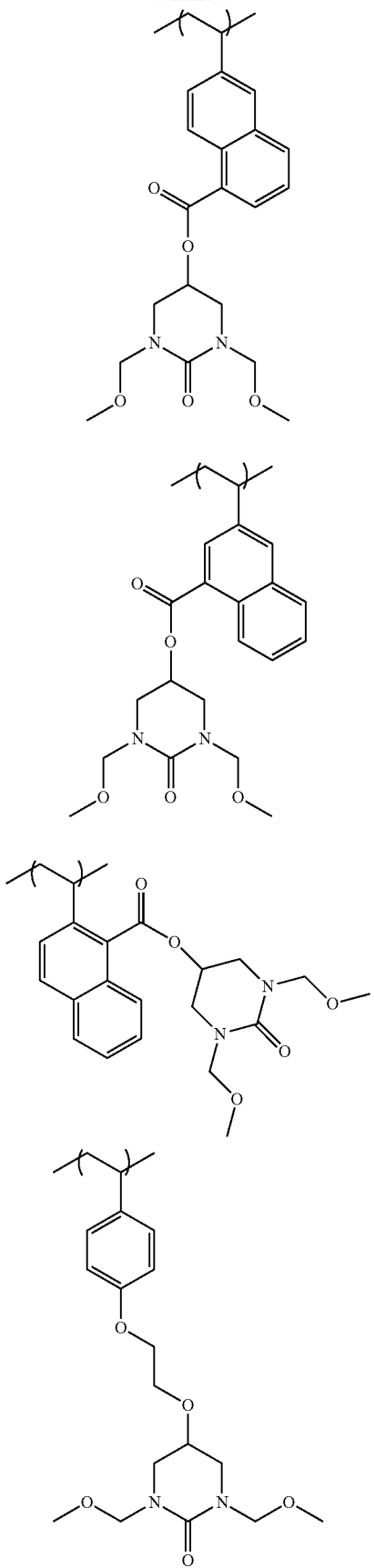

-continued

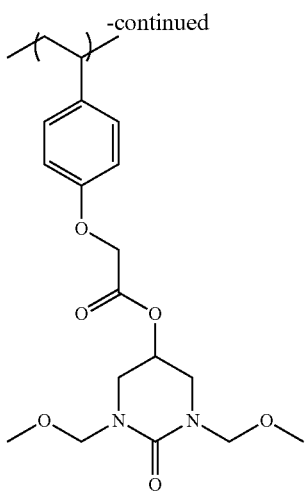

The resin (A) may or may not contain the above-mentioned repeating unit but in the case of containing them, the content of the repeating units is generally 1 mol % to 30 mol %, preferably 1 mol % to 20 mol %, and more preferably 2 mol % to 10 mol %, based on total repeating units in the resin (A).

From the viewpoint of improving at least one of resolution, roughness characteristics, or EL (exposure latitude), the resin (A) preferably contains a repeating unit (A1) having a structural moiety capable of decomposing upon irradiation with actinic rays or radiation to generate an acid on the side chain (hereinafter referred to also as "acid-generating structure (a)").

It is also preferred that the resin (A) contains a repeating unit represented by the following General Formula (5), as the repeating unit (A1) having a structural moiety capable of decomposing upon irradiation with actinic rays or radiation to generate an acid on the side chain. Further, it is preferred that the polymer resin (A) and later-described compound (B) are the same component.

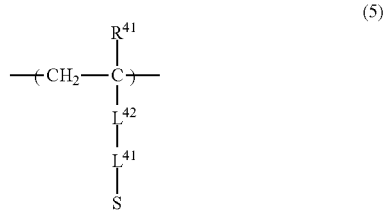
(5)

$R^{41}$ represents a hydrogen atom or a methyl group. $L^{41}$ represents a single bond or a divalent linking group. $L^{42}$ represents a divalent linking group. S represents a structural moiety capable of decomposing upon irradiation with actinic rays or radiation to generate an acid on the side chain.

$R^{41}$ is a hydrogen atom or a methyl group as described above and is more preferably a hydrogen atom.

Examples of the divalent linking group of $L^{41}$ and $L^{42}$ may include an alkylene group, a cycloalkylene group, an arylene group, —O—, —SO$_2$—, —CO—, —N(R)—, —S—, —CS—, and a combination of two or more thereof, and a linking group having a total number of 20 or less carbon atoms is preferred. Here, R represents an aryl group, an alkyl group, or a cycloalkyl group.

The divalent linking group of $L^{42}$ is preferably an arylene group, and preferred examples of the group may include an arylene group having 6 to 18 carbon atoms (more preferably 6 to 10 carbon atoms) such as phenylene group, tolylene group, and naphthylene group, and a divalent aromatic ring group containing a heterocyclic ring such as thiophene, furan, pyrrole, benzothiophene, benzofuran, benzopyrrole, triazine, imidazole, benzimidazole, triazole, thiadiazole, and thiazole.

The alkylene group of $L^{41}$ and $L^{42}$ is preferably an alkylene group having 1 to 12 carbon atoms, such as methylene group, ethylene group, propylene group, butylene group, hexylene group, octylene group, and dodecanylene group.

The cycloalkylene group of $L^{41}$ and $L^{42}$ is preferably a cycloalkylene group having 5 to 8 carbon atoms, such as cyclopentylene group and cyclohexylene group.

The arylene group of $L^{41}$ and $L^{42}$ is preferably an arylene group having 6 to 14 carbon atoms, such as phenylene group and naphthylene group.

These alkylene group, cycloalkylene group, and arylene group may further have a substituent. Examples of the substituent may include an alkyl group, a cycloalkyl group, an aryl group, an amino group, an amido group, a ureido group, a urethane group, a hydroxy group, a carboxy group, a halogen atom, an alkoxy group, a thioether group, an acyl group, an acyloxy group, an alkoxycarbonyl group, a cyano group, and a nitro group.

The acid-generating structure (a) preferably has a sulfonium salt structure or an iodonium salt structure (more preferably a sulfonium salt structure), and more preferably an ionic structural moiety containing a sulfonium salt or an iodonium salt (still more preferably an ionic structural moiety containing a sulfonium salt). More preferably, the acid-generating structure (a) is preferably a group represented by the following General Formula (PZI) or (PZII).

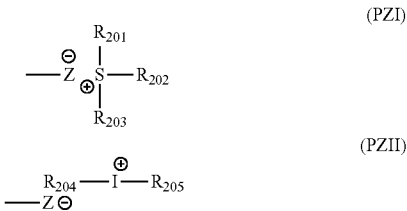

In General Formula (PZI),
$R_{201}$ to $R_{203}$ each independently represent an organic group.

The number of carbon atoms in the organic group as $R_{201}$ to $R_{203}$ is generally 1 to 30, and preferably 1 to 20.

Two members of $R_{201}$ to $R_{203}$ may be bonded to form a ring structure, and the ring may contain an oxygen atom, a sulfur atom, an ester bond, an amido bond, or a carbonyl group. Examples of the group formed by bonding two members of $R_{201}$ to $R_{203}$ may include an alkylene group (for example, butylene group, pentylene group). When a repeating unit where two members of $R_{201}$ to $R_{203}$ are bonded to form a ring structure is used, it can be advantageously expected that the exposure machine can be kept from contamination by a decomposition product during exposure.

$Z^-$ represents an acid anion generated resulting from decomposition upon irradiation with actinic rays or radiation and is preferably a non-nucleophilic anion. Examples of the non-nucleophilic anion may include sulfonate anion, carboxylate anion, sulfonylimide anion, bis(alkylsulfonyl)imide anion, and tris(alkylsulfonyl)methide anion.

The non-nucleophilic anion is an anion having an extremely low ability of causing a nucleophilic reaction, and this anion can suppress the decomposition with aging due to the intramolecular nucleophilic reaction. Thanks to this anion, the aging stability of the resin and in turn, the aging stability of the composition are enhanced.

Examples of the organic group of $R_{201}$ to $R_{203}$ may include an aryl group, an alkyl group, a cycloalkyl group, a cycloalkenyl group, and an indolyl group. Here, in the cycloalkyl group and the cycloalkenyl group, at least one of carbon atoms forming the ring may be a carbonyl carbon.

At least one of $R_{201}$, $R_{202}$, or $R_{203}$ is preferably an aryl group, and it is more preferred that those three members all are an aryl group.

The aryl group in $R_{201}$, $R_{202}$, and $R_{203}$ is preferably a phenyl group or a naphthyl group, and more preferably a phenyl group.

The alkyl group, cycloalkyl group, and cycloalkenyl group of $R_{201}$, $R_{202}$, and $R_{203}$ are preferably a linear or branched alkyl group having 1 to 10 carbon atoms (for example, methyl group, ethyl group, propyl group, butyl group, pentyl group), a cycloalkyl group having 3 to 10 carbon atoms (for example, cyclopentyl group, cyclohexyl group, norbornyl group), and a cycloalkenyl group having 3 to 10 carbon atoms (for example, pentadienyl group, cyclohexenyl group).

The organic group as $R_{201}$, $R_{202}$, and $R_{203}$, such as aryl group, alkyl group, cycloalkyl group, cycloalkenyl group, and indolyl group, may further have a substituent. Examples of the substituent include, but are not limited to, a nitro group, a halogen atom such as a fluorine atom (preferably a fluorine atom), a carboxyl group, a hydroxyl group, an amino group, a cyano group, an alkyl group (preferably having 1 to 15 carbon atoms), an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an arylthio group (preferably having 6 to 14 carbon atoms), a hydroxyalkyl group (preferably having 1 to 15 carbon atoms), an alkylcarbonyl group (preferably having 2 to 15 carbon atoms), a cycloalkylcarbonyl group (preferably having 4 to 15 carbon atoms), an arylcarbonyl group (preferably having 7 to 14 carbon atoms), a cycloalkenyloxy group (preferably having 3 to 15 carbon atoms), and a cycloalkenylalkyl group (preferably having 4 to 20 carbon atoms).

In the cycloalkyl group and cycloalkenyl group as the substituent which may be substituted on each of the groups of $R_{201}$, $R_{202}$, and $R_{203}$, at least one of carbon atoms forming the ring may be a carbonyl carbon.

The substituent which may be substituted on each of the groups of $R_{201}$, $R_{202}$, and $R_{203}$ may further have a substituent, and examples of this further substituent are the same as examples of the substituent which may be substituted on each of the groups of $R_{201}$, $R_{202}$, and $R_{203}$, but an alkyl group and a cycloalkyl group are preferred.

The preferred structure in the case where at least one of $R_{201}$, $R_{202}$, or $R_{203}$ is not an aryl group includes cation structures such as compounds illustrated in paragraphs "0046" and "0047" of JP2004-233661A, compounds illustrated in paragraphs "0040" to "0046" of JP2003-35948A, Compounds (I-1) to (I-70) illustrated in US2003/0224288A, and Compounds (IA-1) to (IA-54) and (IB-1) to (IB-24) illustrated in US2003/0077540A.

In General Formula (PZII), $R_{204}$ and $R_{205}$ each independently represent an aryl group, an alkyl group, or a cycloalkyl group. These aryl, alkyl, and cycloalkyl groups are the same as the aryl, alkyl, and cycloalkyl groups illustrated as the aryl, alkyl, and cycloalkyl groups of $R_{201}$ to $R_{203}$ in the compound (PZI).

The aryl group of $R_{204}$ and $R_{205}$ may be an aryl group having a heterocyclic structure containing an oxygen atom, a nitrogen atom, or a sulfur atom. Examples of the aryl group having a heterocyclic structure include a pyrrole residue (a group formed by removing one hydrogen atom from a pyrrole), a furan residue (a group formed by removing one hydrogen atom from a furan), a thiophene residue (a group formed by removing one hydrogen atom from a thiophene), an indole residue (a group formed by removing one hydrogen atom from an indole), a benzofuran residue (a group formed by removing one hydrogen atom from a benzofuran), and a benzothiophene residue (a group formed by removing one hydrogen atom from a benzothiophene).

The aryl group, alkyl group, and cycloalkyl group of $R_{204}$ and $R_{205}$ may have a substituent. Examples of the substituent include those of the substituent which the aryl group, alkyl group, and cycloalkyl group of $R_{201}$ to $R_{203}$ in the compound (PZI) may have.

$Z^-$ represents an acid anion generated resulting from decomposition upon irradiation with actinic rays or radiation and is preferably a non-nucleophilic anion, and examples thereof are the same as those for $Z^-$ in General Formula (PZI).

Preferred specific examples of the acid-generating structure (a) include the specific examples illustrated in paragraphs "0145" to "0148" of JP2013-80002A.

The content of the repeating unit (A1) having a structural moiety capable of decomposing upon irradiation with actinic rays or radiation to generate an acid on the side chain in the resin (A) is preferably 1 mol % to 40 mol %, more preferably 2 mol % to 30 mol %, and particularly preferably 4 mol % to 25 mol %, based on total repeating units in the resin (A).

Preferably, the resin (A) used in the present invention may further have the following repeating unit (hereinafter, also referred to as "other repeating unit") as a repeating unit other than the above-described repeating unit.

Examples of a polymerizable monomer for forming these other repeating units may include styrene, alkyl-substituted styrenes, alkoxy-substituted styrene, halogen-substituted styrene, O-alkylated styrene, O-acylated styrene, hydrogenated hydroxystyrene, a maleic anhydride, an acrylic acid derivative (for example, acrylic acid, acrylic acid ester), a methacrylic acid derivative (for example, methacrylic acid and methacrylic acid ester), N-substituted maleimide, acrylonitrile, methacrylonitrile, vinylnaphthalene, vinylanthracene, and indene which may have a substituent.

The resin (A) may or may not have these other repeating units. In the case where the resin (A) has these other repeating units, the content of these repeating units in the resin (A) is generally 1 mol % to 30 mol %, preferably 1 mol % to 20 mol %, and still more preferably 2 mol % to 10 mol %, based on the total repeating units constituting the resin (A).

The resin (A) may be synthesized by a known method such as a radical polymerization method, an anionic polymerization method, or a living radical polymerization method (for example, an iniferter method). For example, in the anionic polymerization method, vinyl monomers are dissolved in an appropriate organic solvent, and reacted usually under a cooling condition by using a metal compound (for example, butyllithium) as an initiator, whereby the polymer can be obtained.

As the resin (A), a polyphenol compound produced by a condensation reaction of an aromatic ketone or aromatic aldehyde and a compound containing 1 to 3 phenolic hydroxyl groups (see, for example, JP2008-145539A), a calixarene derivative (see, for example, JP2004-18421A), a Noria derivative (see, for example, JP2009-222920A), and a polyphenol derivative (see, for example, JP2008-94782A) can also be applied, and these may be modified by a polymer reaction to synthesize the compound.

The resin (A) is preferably synthesized by modifying a polymer synthesized by a radical polymerization or anionic polymerization method, through a polymer reaction.

The weight average molecular weight of the resin (A) is preferably 1,000 to 200,000, more preferably 2,000 to 50,000, still more preferably 2,000 to 15,000, and particularly preferably 3,000 to 10,000.

The polydispersity (molecular weight distribution) (Mw/Mn) of the resin (A) is preferably 2.0 or less, and from the viewpoint of enhancing the sensitivity and resolution, the polydispersity is preferably 1.0 to 1.80, more preferably 1.0 to 1.60, and most preferably 1.0 to 1.20. The use of living polymerization such as living anionic polymerization is preferred because the obtained polymer compound may have a uniform polydispersity (molecular weight distribution). The weight average molecular weight (Mw), number average molecular weight (Mn), and polydispersity (Mw/Mn) of the resin are defined as values in terms of polystyrene by GPC (solvent: tetrahydrofuran, column: TSK gel Multipore HXL-M manufactured by Tosoh Corporation, column temperature: 40° C., flow velocity: 1.0 mL/min, detector: RI) measurement.

The content of the resin (A) used in the composition of the present invention is preferably 30 mass % to 95 mass %, more preferably 40 mass % to 90 mass %, and particularly preferably 50 mass % to 85 mass %, based on the total solid content of the composition.

Specific examples of the resin (A) will be shown below, but the present invention is not limited thereto.

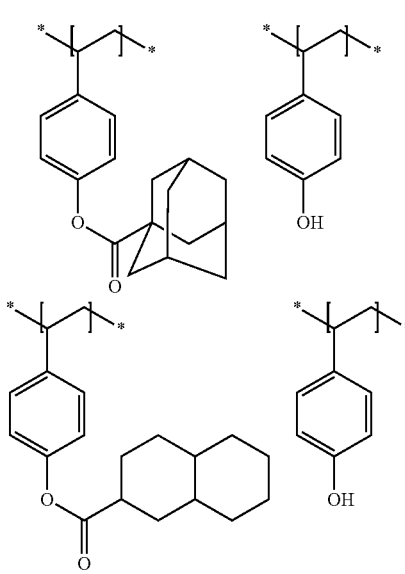

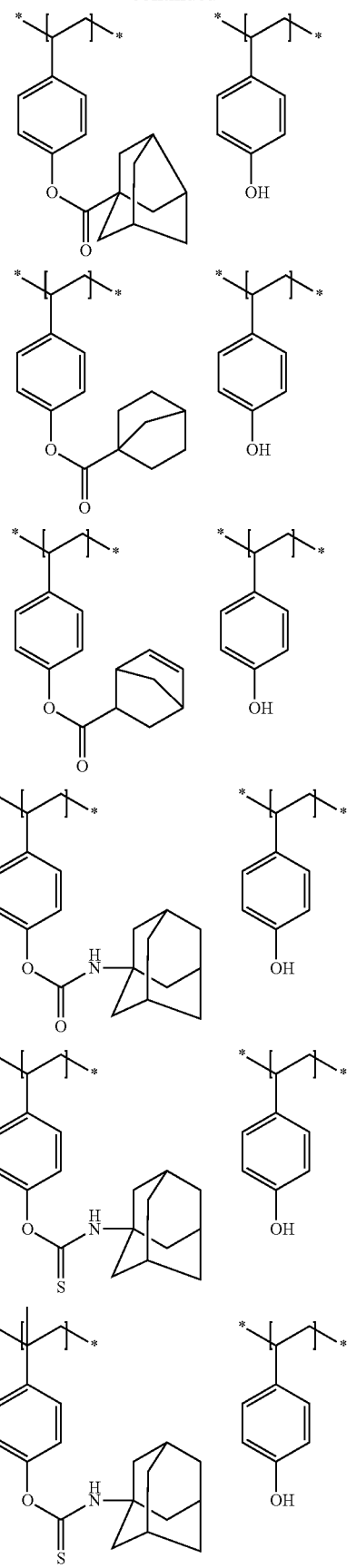

-continued
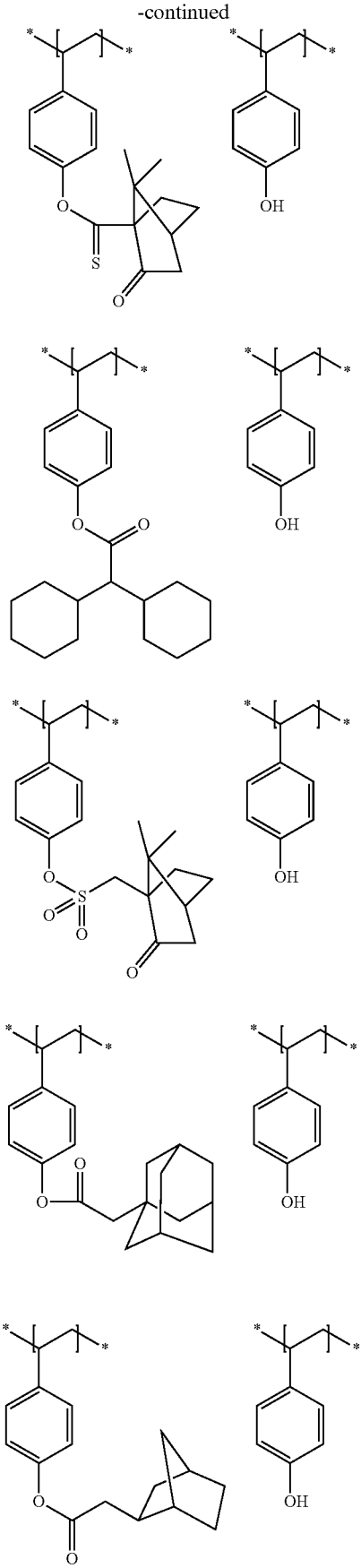 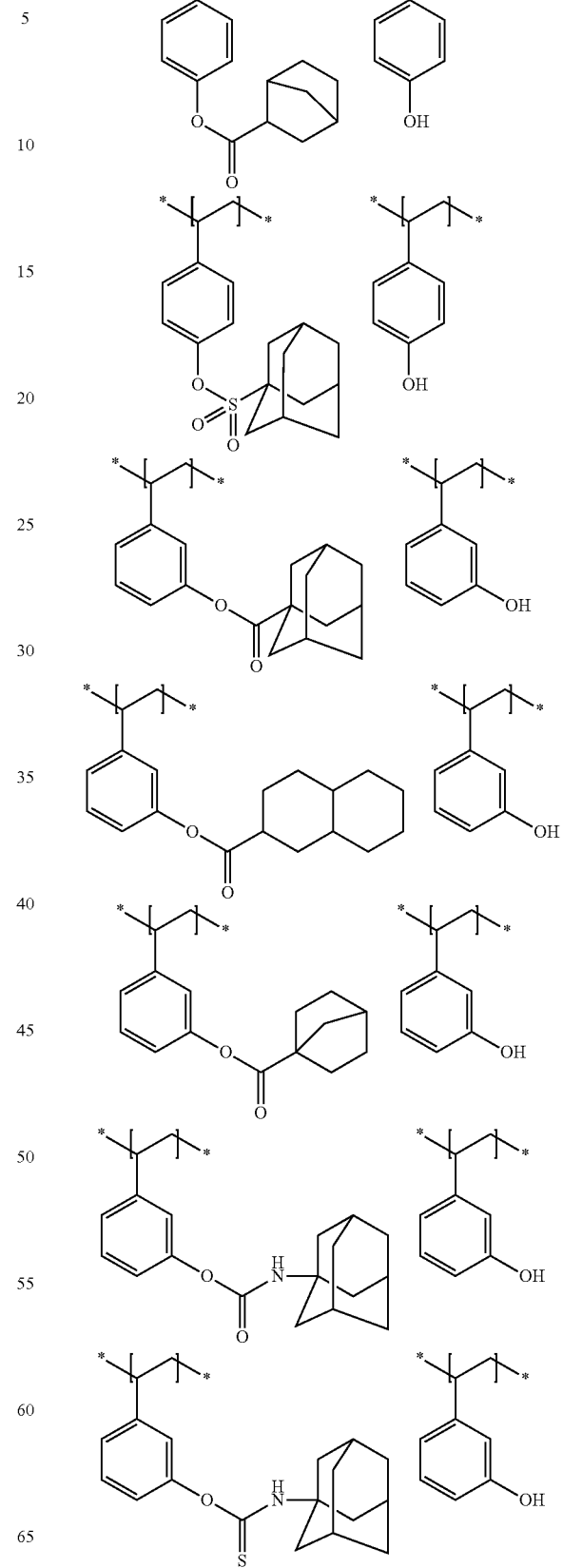

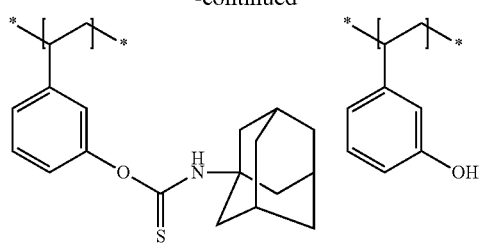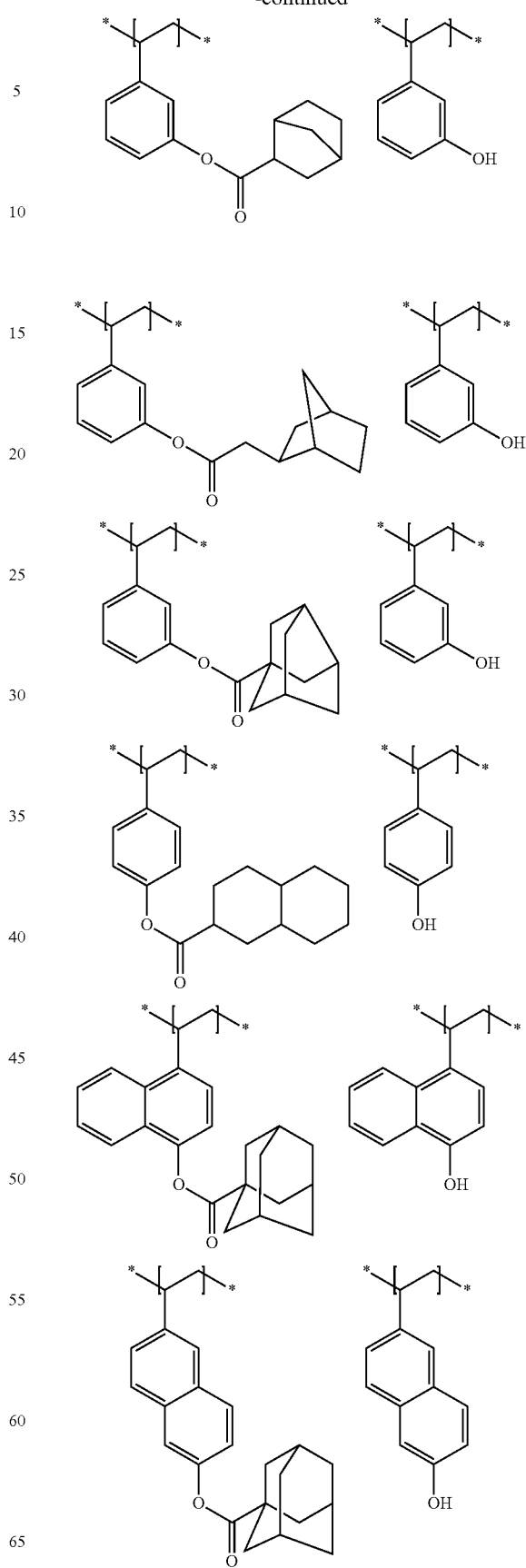

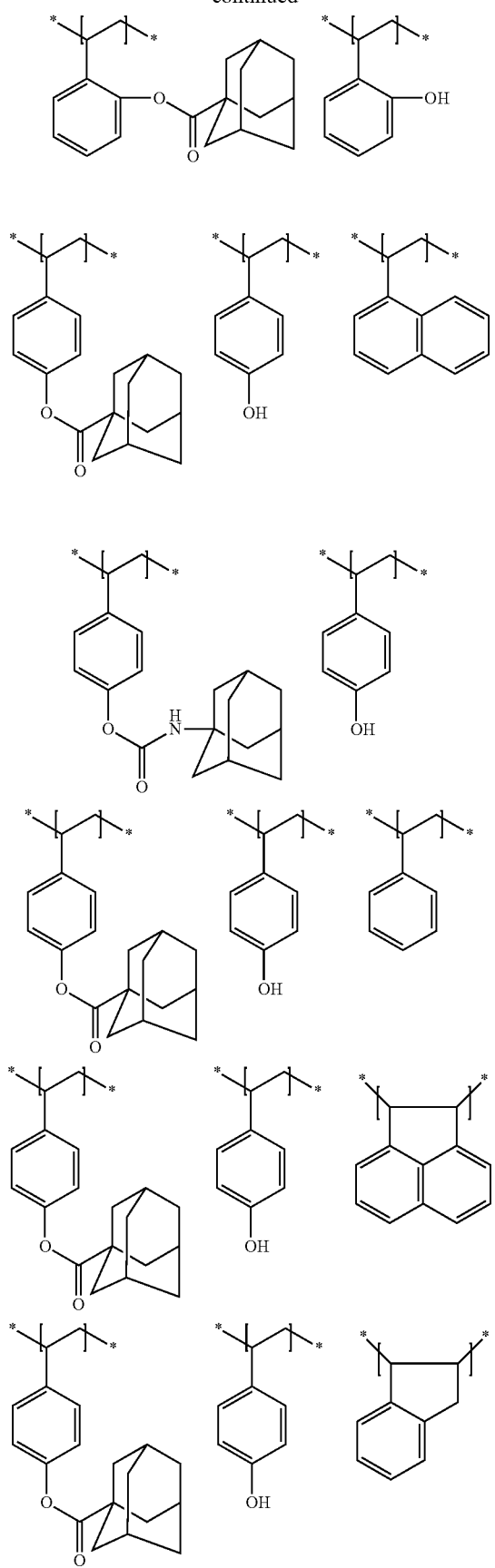
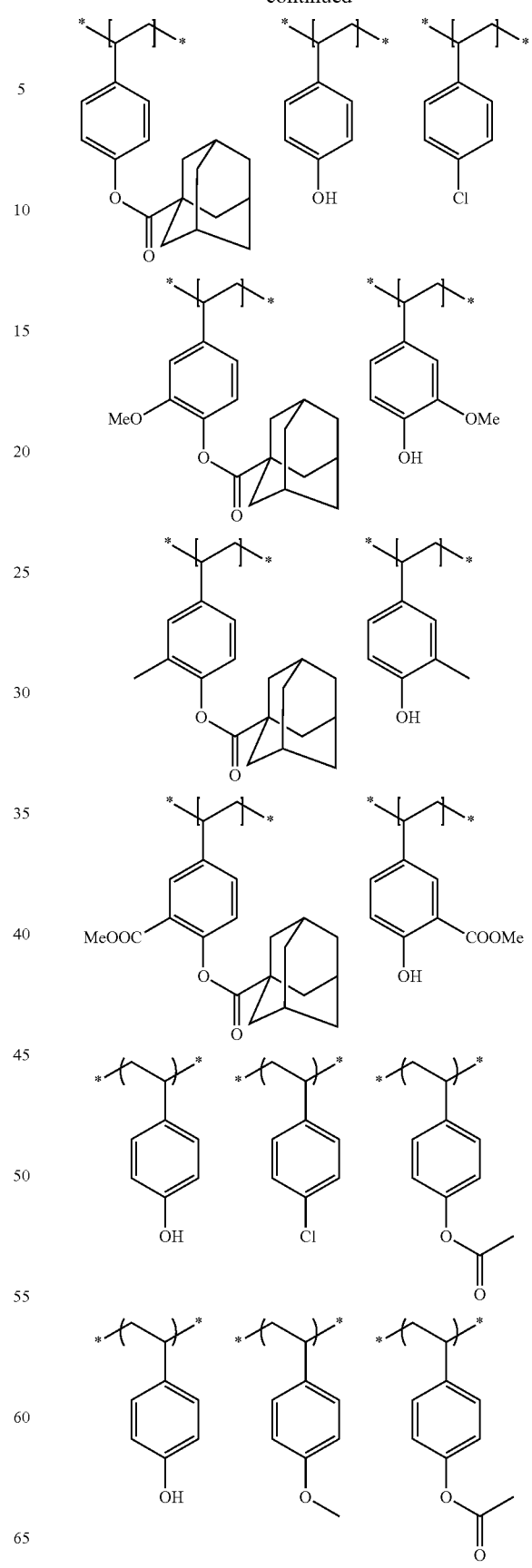

73
-continued
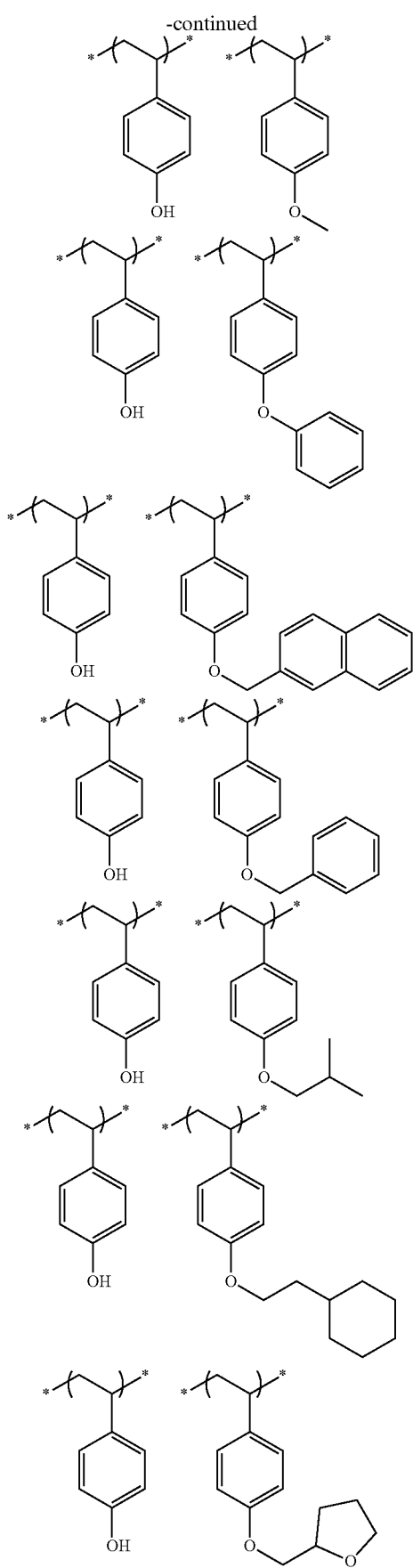
74
-continued
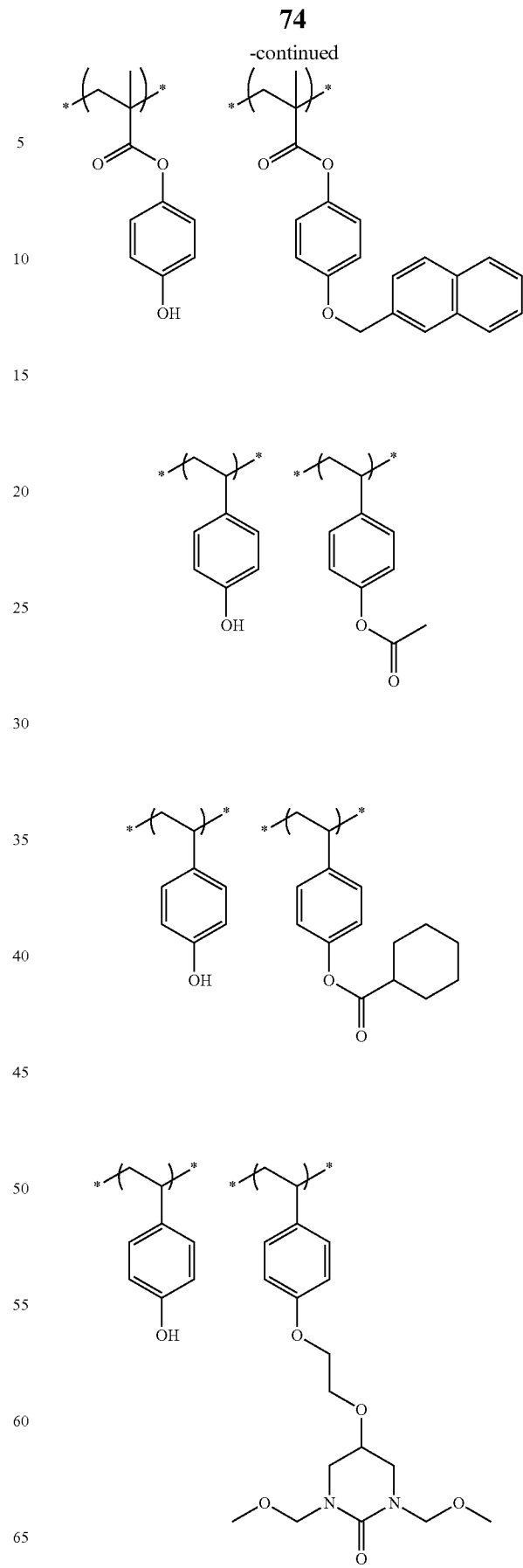

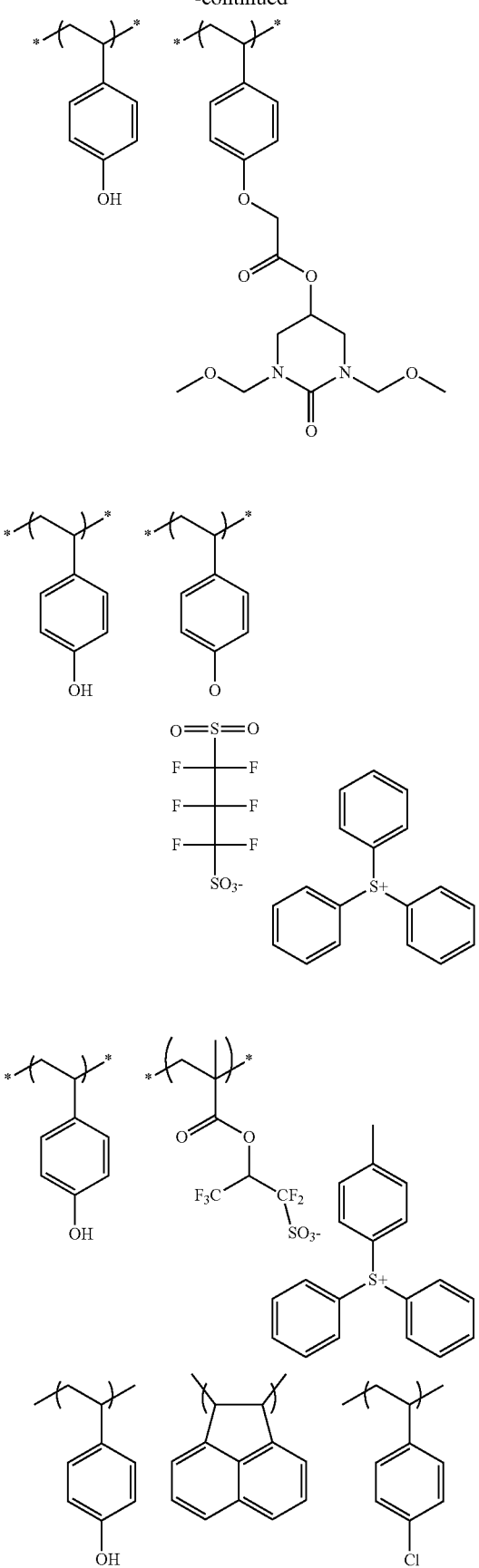
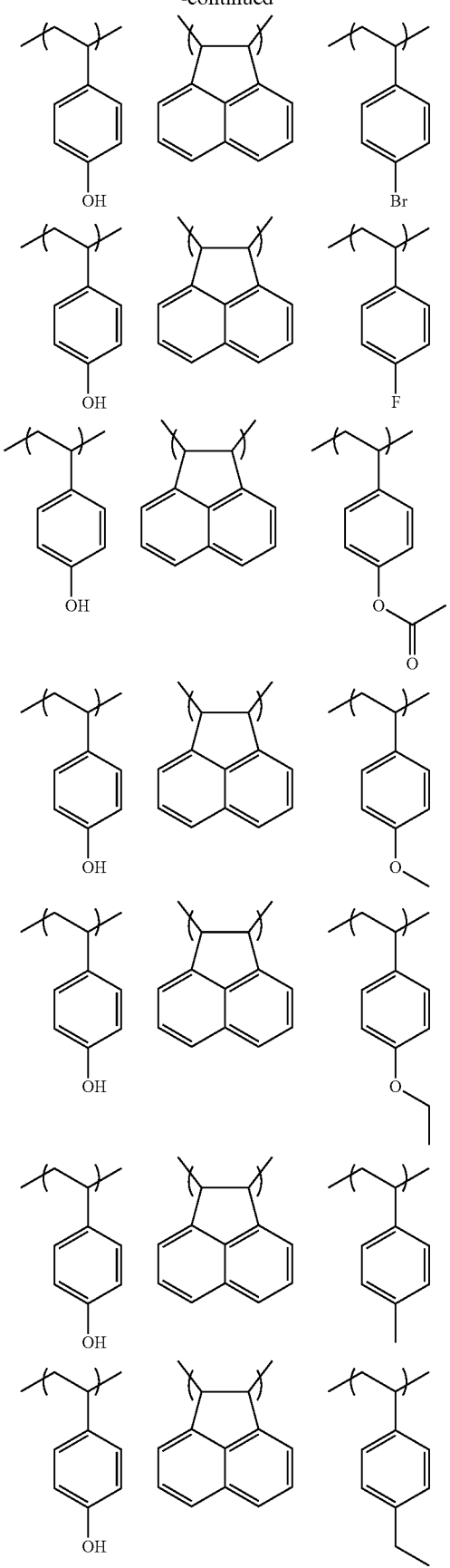

77
-continued
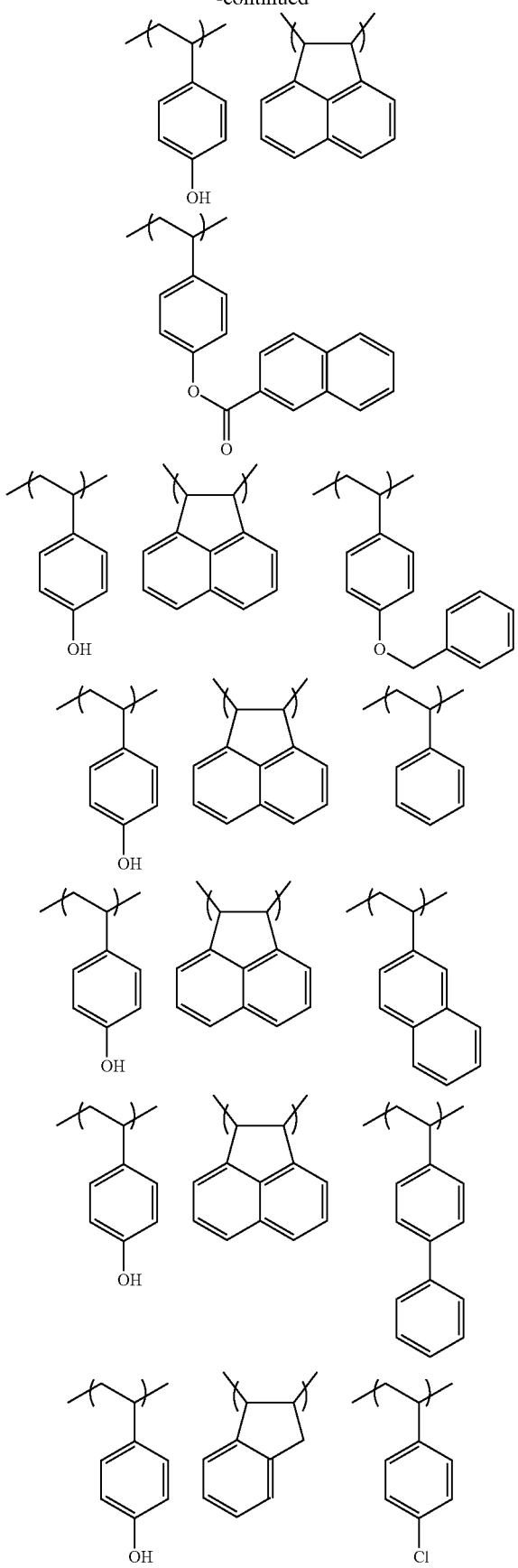
78
-continued
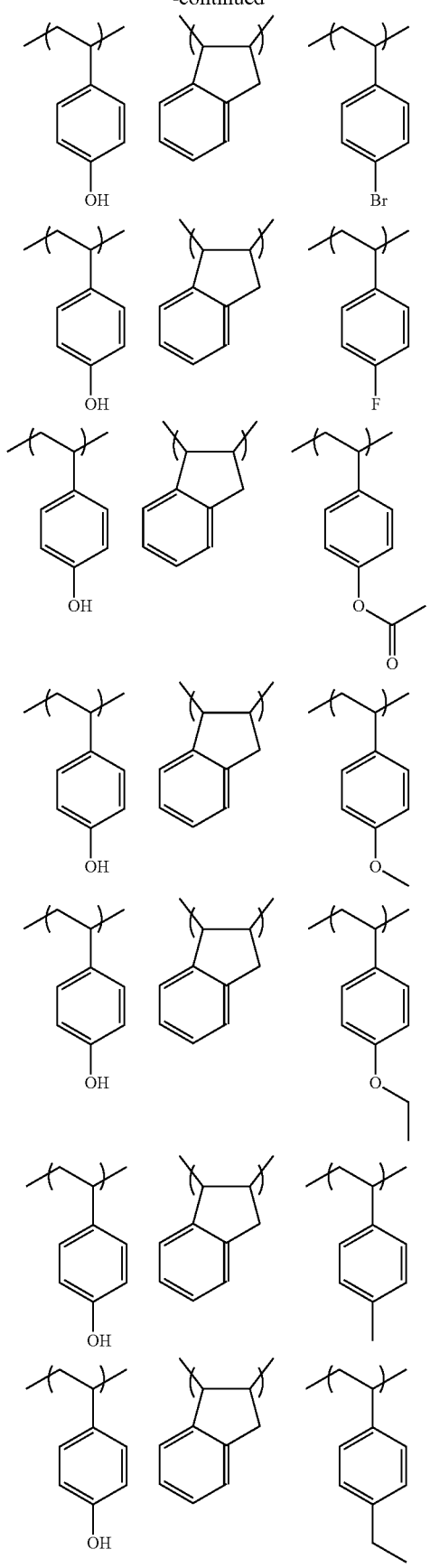

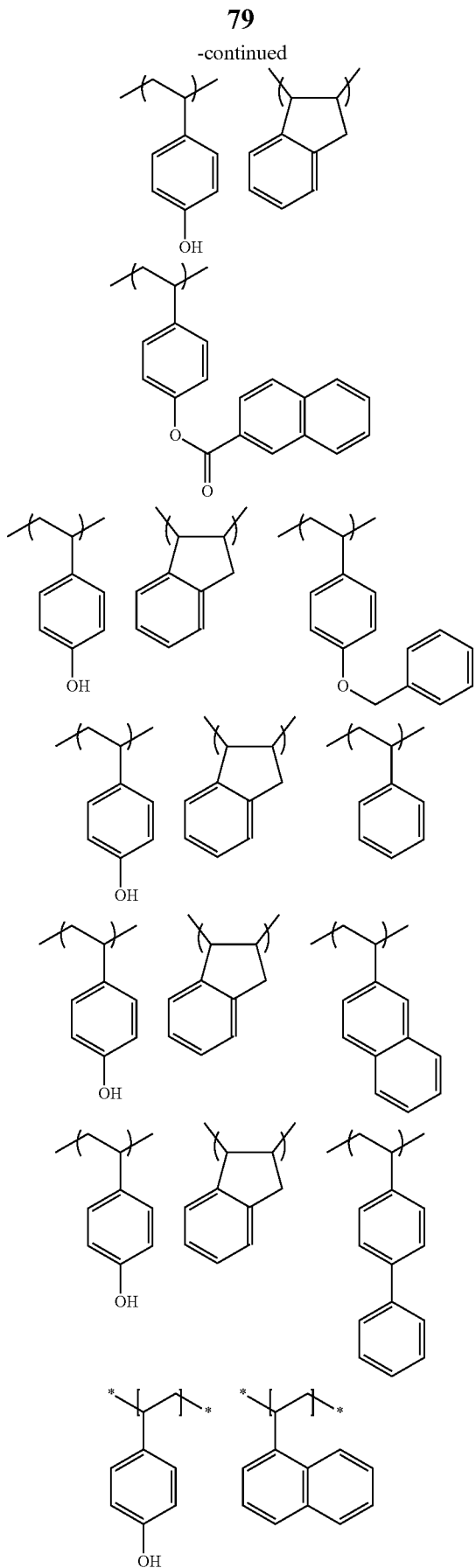

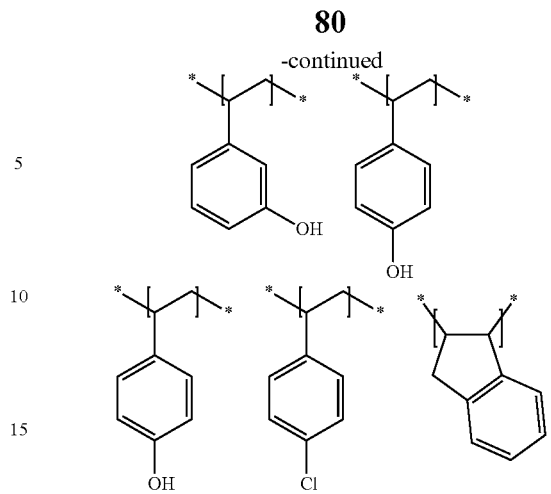

In another embodiment, the resin (A) may have an acid-decomposable repeating unit (hereinafter, simply referred to also as "repeating unit (a)"). The acid-decomposable repeating unit is, for example, a repeating unit having a group capable of decomposing by the action of an acid to generate a polar group (hereinafter, referred to also as "acid-decomposable group") on the main chain or side chain of a resin, or both main chain and side chain thereof.

The definition of the polar group is the same as the definition in the section of <Repeating Unit Having Polar Group> to be described hereinafter, but examples of the polar group generated by the decomposition of an acid-decomposable group include an alcoholic hydroxyl group, an amino group, and an acidic group.

The polar group generated by the decomposition of an acid-decomposable group is preferably an acidic group.

The acidic group is not particularly limited as long as it is a group insolubilized in an organic solvent-containing developer, but the acidic group is preferably a phenolic hydroxyl group, a carboxylic acid group, a sulfonic acid group, a fluorinated alcohol group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, or a tris(alkylsulfonyl)methylene group, and more preferably a carboxylic acid group, a fluorinated alcohol group (preferably hexafluoroisopropanol), a phenolic hydroxyl group, or an acidic group (a group capable of dissociating in an aqueous 2.38 mass % tetramethylammonium hydroxide solution that has been conventionally used as the developer for resist) such as sulfonic acid group.

The group preferred as the acid-decomposable group is a group in which a hydrogen atom of the group above is substituted with a group capable of leaving by the action of an acid.

Examples of the group capable of leaving by the action of an acid include —C($R_{36}$)($R_{37}$)($R_{38}$), —C($R_{36}$)($R_{37}$)(O$R_{39}$), and —C($R_{01}$)($R_{02}$)(O$R_{39}$).

In the formulae, $R_{36}$ to $R_{39}$ each independently represent an alkyl group, a cycloalkyl group, a monovalent aromatic ring group, a group formed by combining an alkylene group and a monovalent aromatic ring group, or an alkenyl group. $R_{36}$ and $R_{37}$ may be bonded to each other to form a ring.

$R_{01}$ and $R_{02}$ each independently represent a hydrogen atom, an alkyl group, a cycloalkyl group, a monovalent aromatic ring group, a group formed by combining an alkylene group and a monovalent aromatic ring group, or an alkenyl group.

The acid-decomposable group is preferably a cumyl ester group, an enol ester group, an acetal ester group, a tertiary alkyl ester group, or the like. The acid-decomposable group is more preferably a tertiary alkyl ester group.

Preferred specific examples of the repeating unit (a) are illustrated below, but the present invention is not limited thereto.

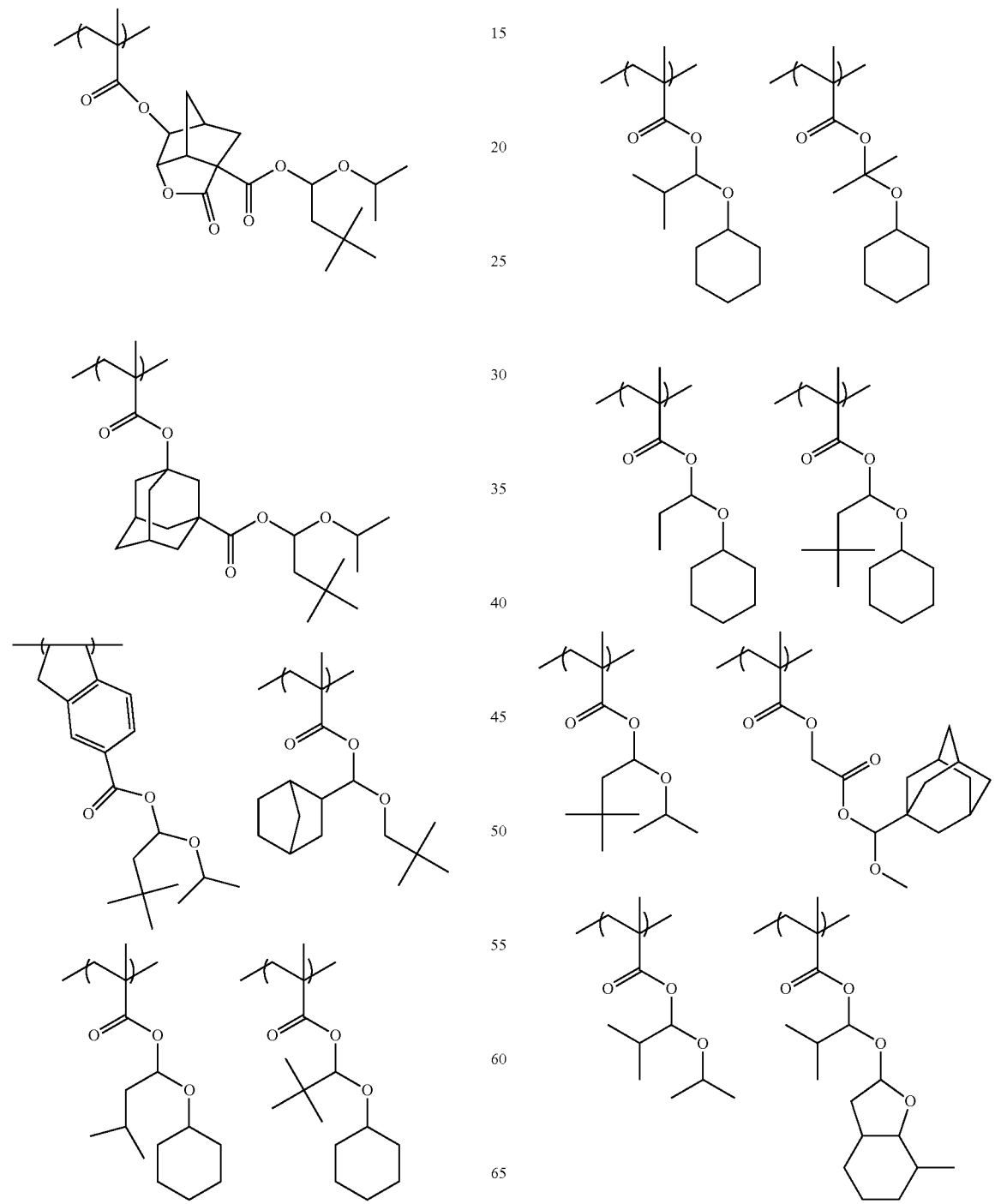

-continued
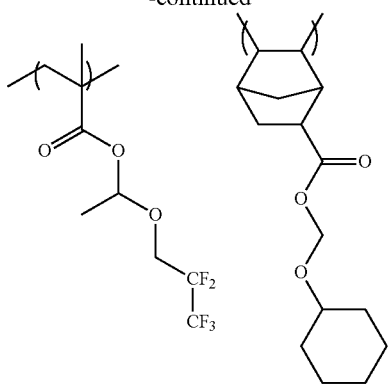
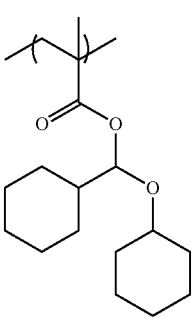
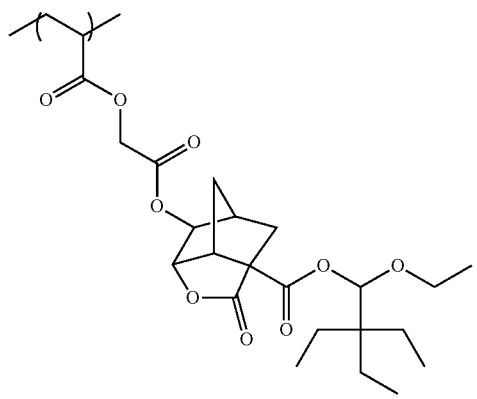
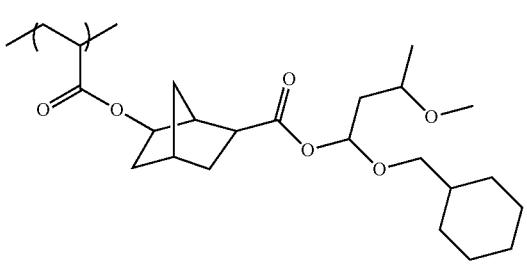
-continued
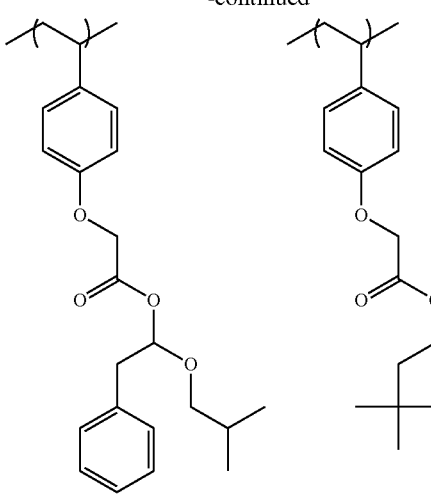
Preferred specific examples of the repeating unit (a) are illustrated below, but the present invention is not limited thereto.
(VI-1)
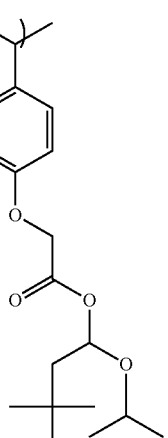
(VI-2)
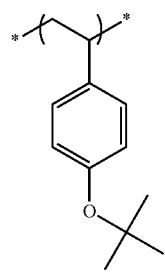
(VI-3)
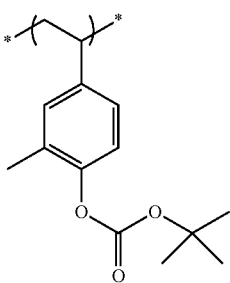

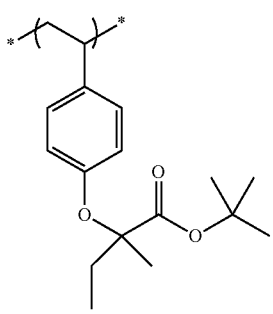 (VI-4)
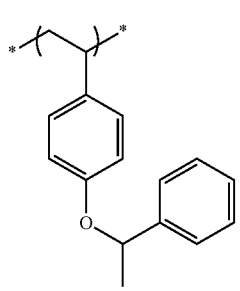 (VI-5)
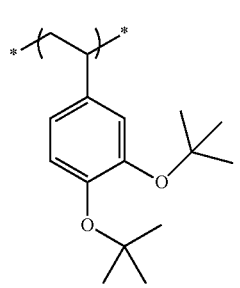 (VI-6)
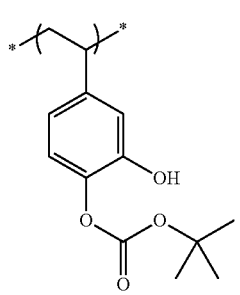 (VI-7)
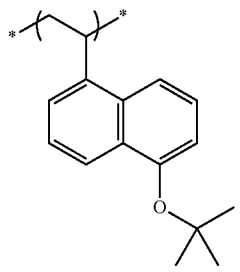 (VI-8)
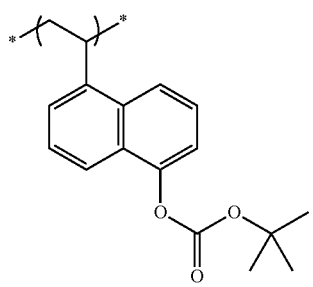 (VI-9)
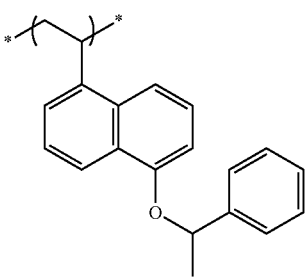 (VI-10)
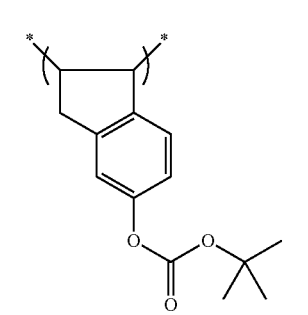 (VI-11)
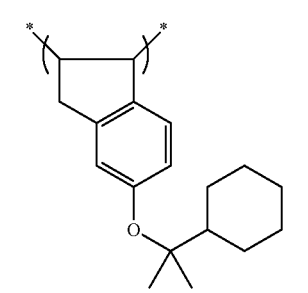 (VI-12)
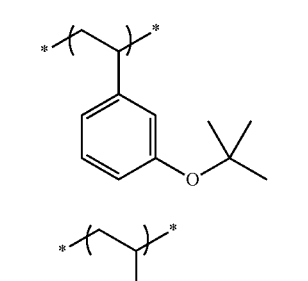 (VI-13)
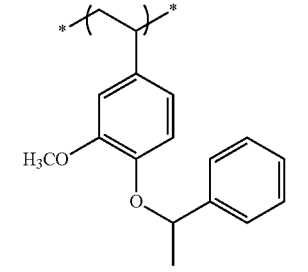 (VI-14)

(VI-15)
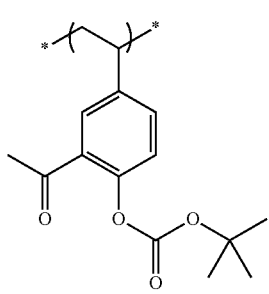
(VI-16)
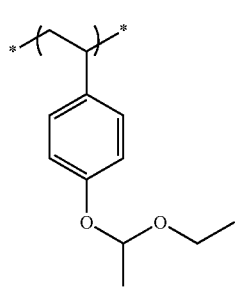
(VI-17)
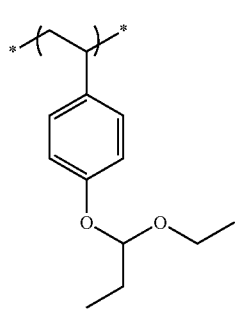
(VI-18)
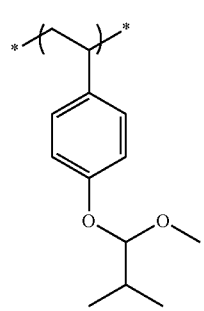
(VI-19)
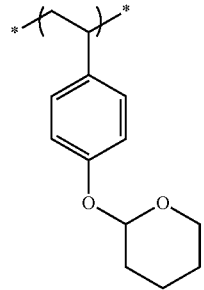
(VI-20)
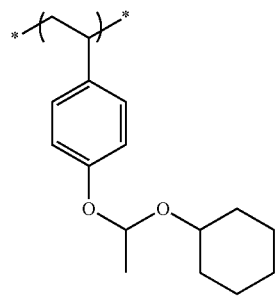
(VI-21)
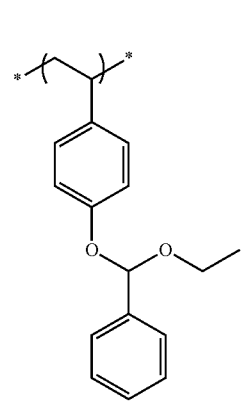
(VI-22)
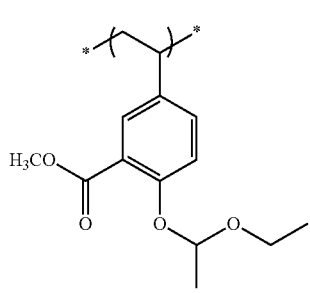
(VI-23)
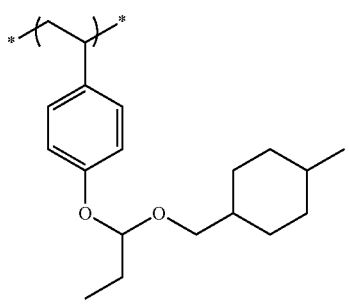
(VI-24)
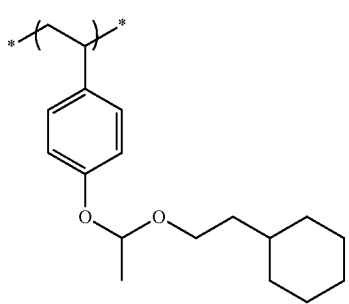

(VI-25) 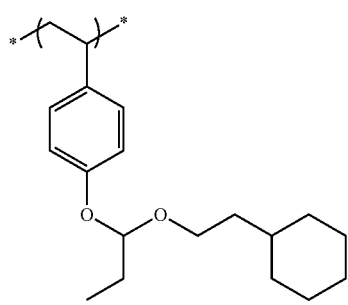
(VI-26) 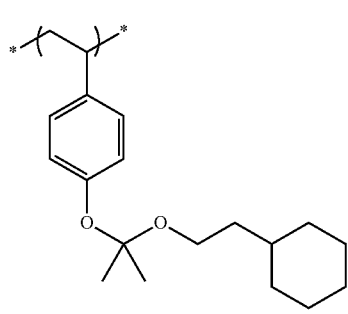
(VI-27) 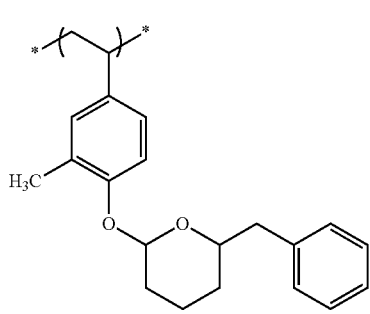
(VI-28) 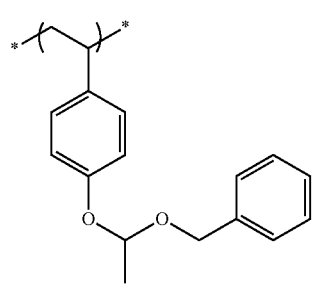
(VI-29) 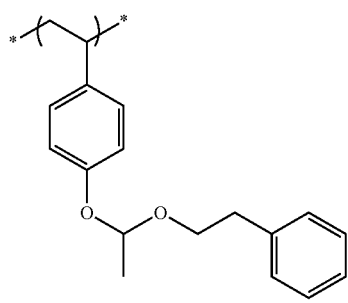
(VI-30) 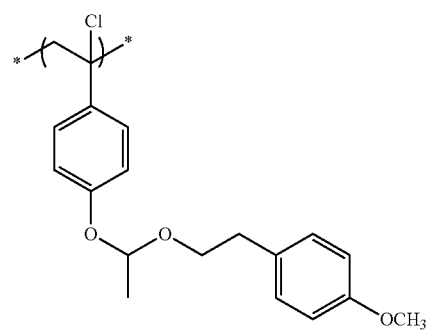
(VI-31) 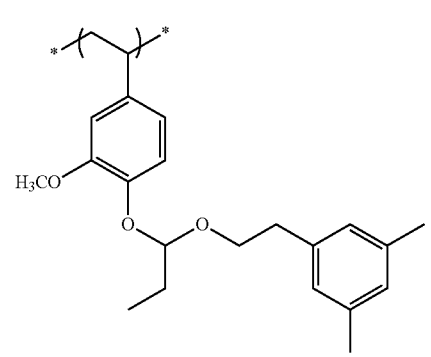
(VI-32) 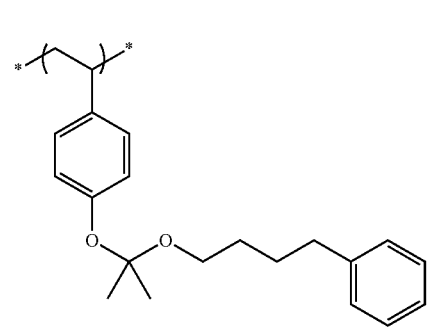
(VI-33) 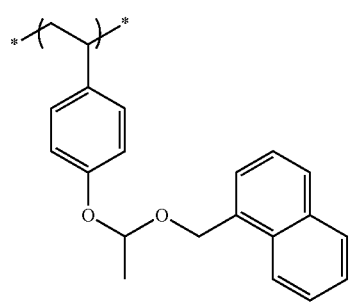
(VI-34) 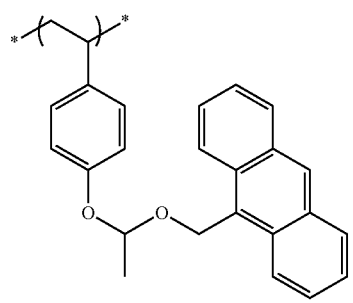

(VI-35) 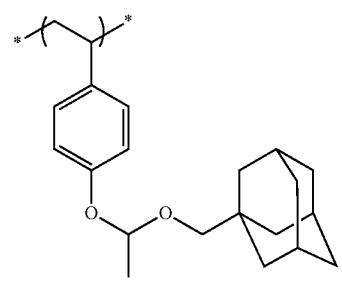
(VI-36) 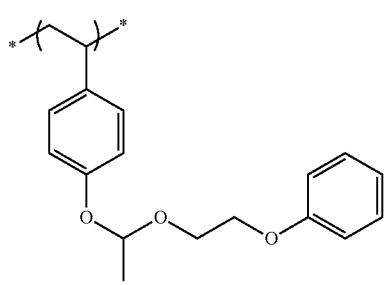
(VI-37) 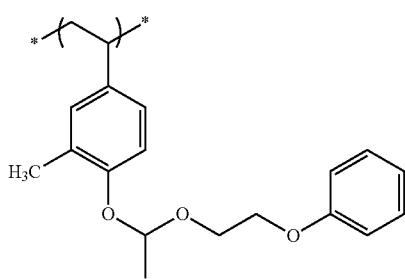
(VI-38) 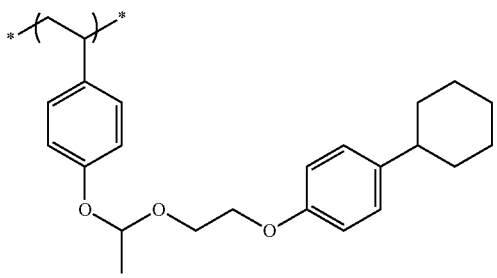
(VI-39) 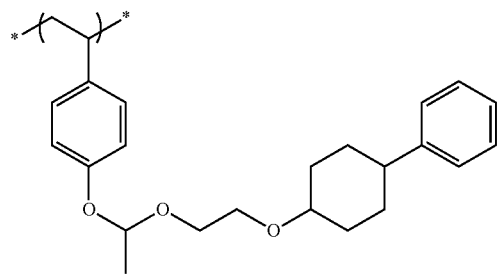
(VI-40) 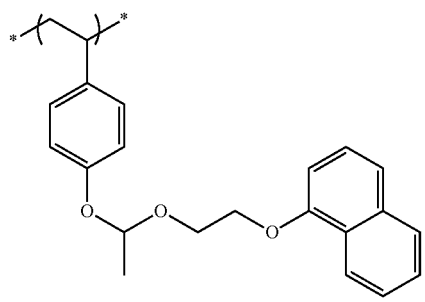
(VI-41) 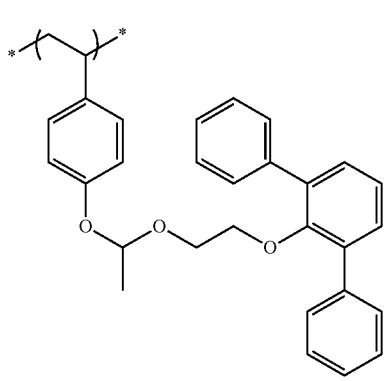
(VI-42) 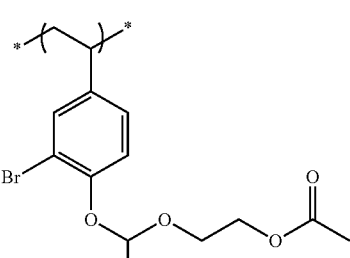
(VI-43) 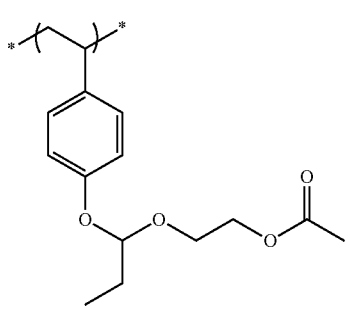
(VI-44) 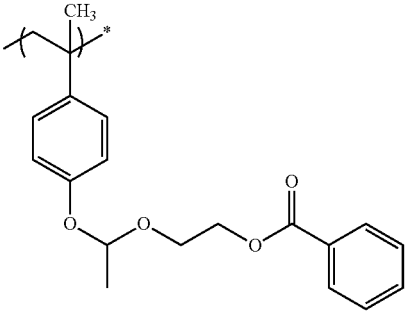

(VI-45)
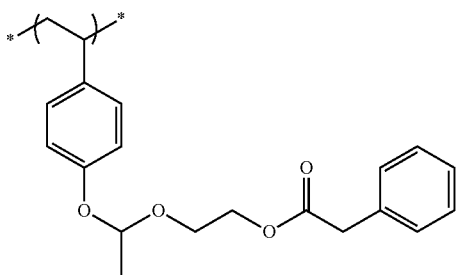
(VI-46)
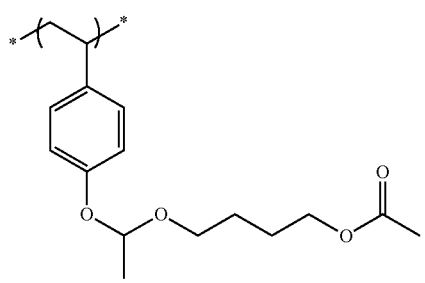
(VI-47)
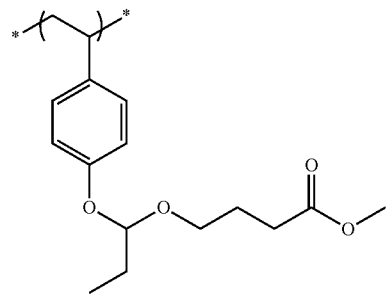
(VI-48)
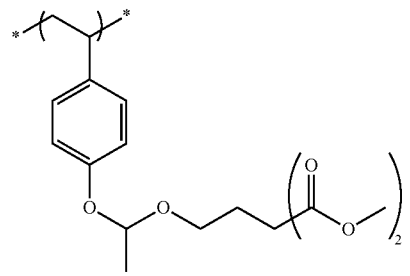
(VI-49)
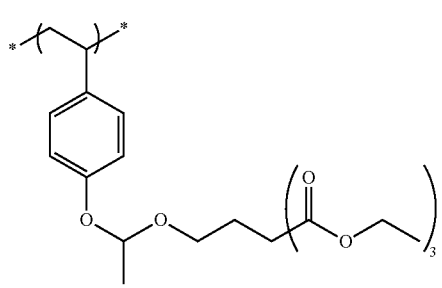
(VI-50)
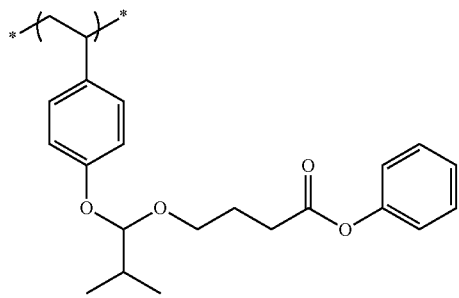
(VI-51)
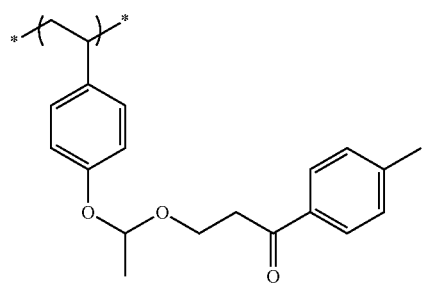
(VI-52)
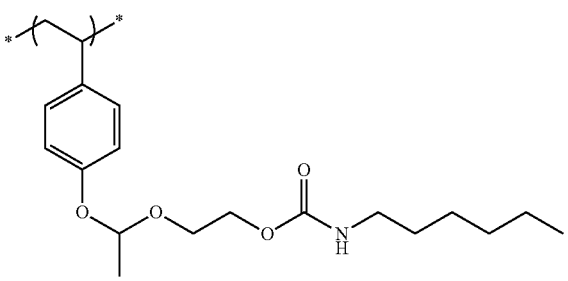
(VI-53)
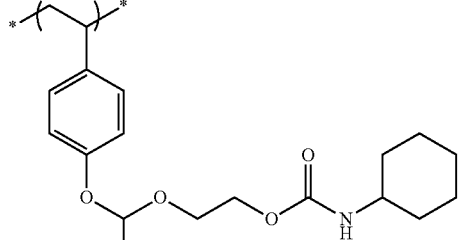
(VI-54)
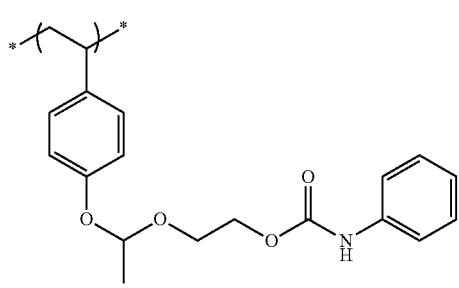

(VI-55)
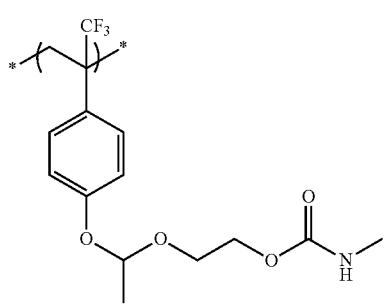
(VI-56)
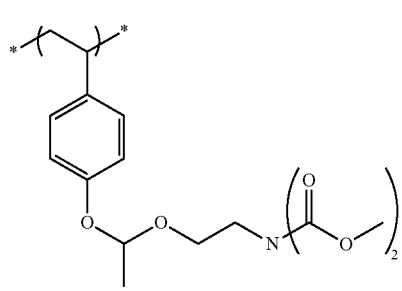
(VI-57)
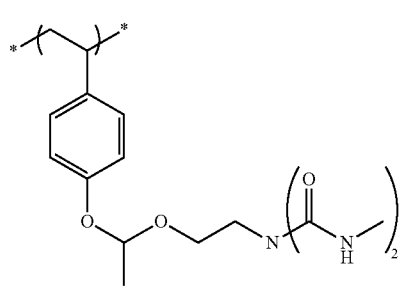
(VI-58)
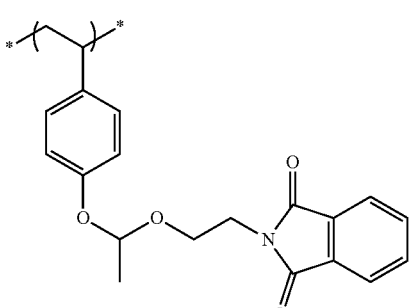
(VI-59)
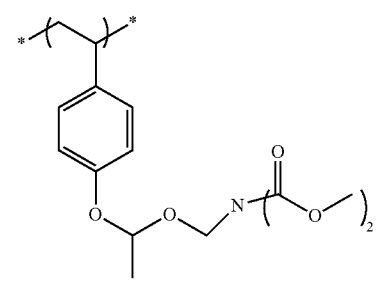
(VI-113)
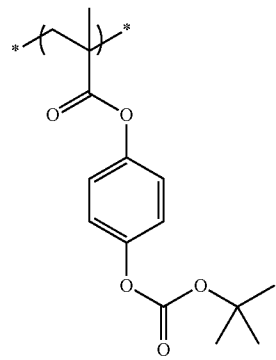
(VI-114)
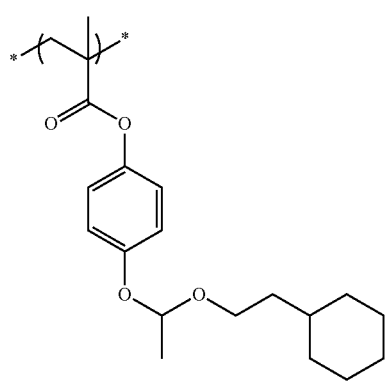
(VI-115)
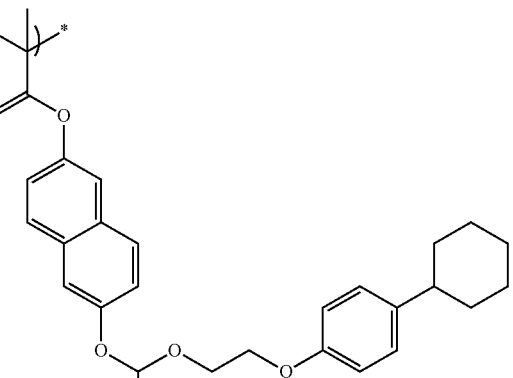
(VI-116)
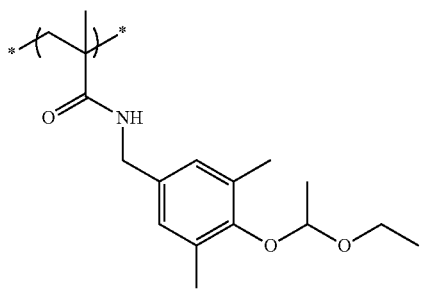

(VI-117)
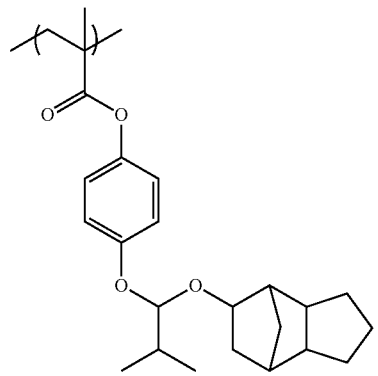
(VI-118)
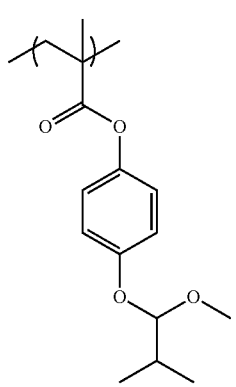
(VI-119)
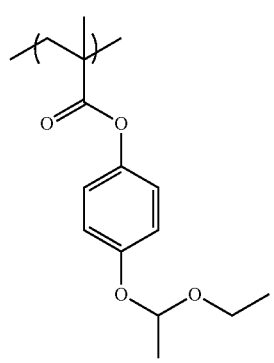
(VI-120)
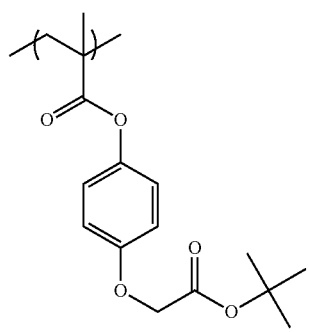
(VI-121)
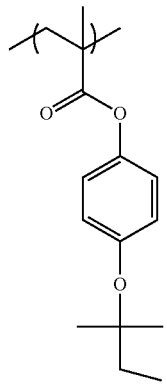
(VI-122)
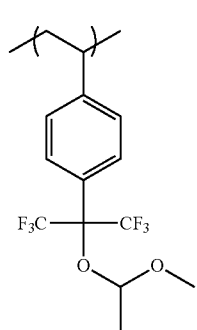
(VI-123)
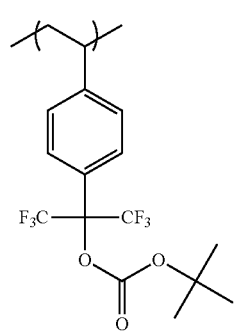
(VI-124)
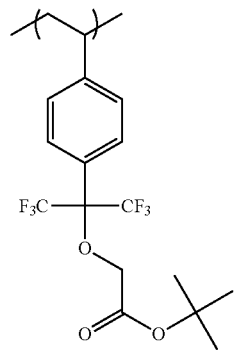

(VI-125) 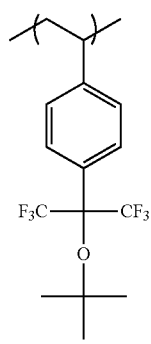
(VI-126) 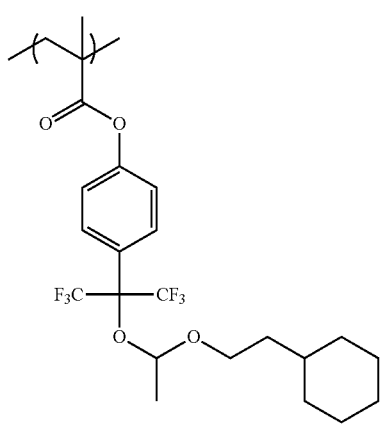
(VI-127) 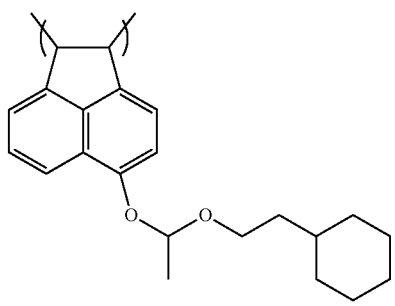
(VI-128) 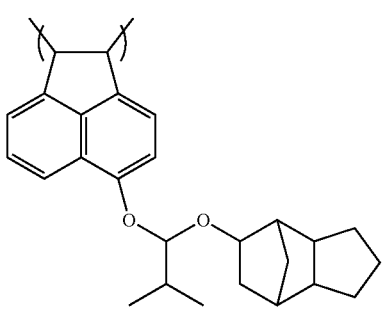
(VI-129) 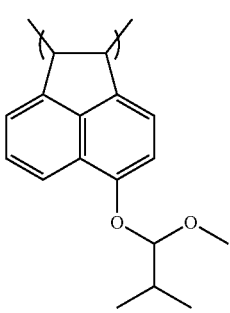
(VI-130) 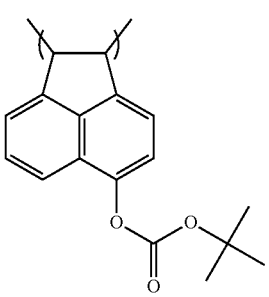
(VI-131) 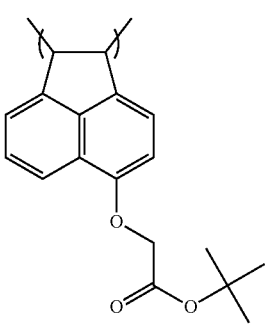
(VI-132) 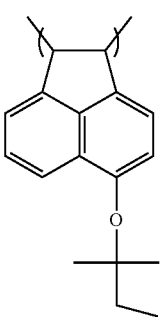
(VI-133) 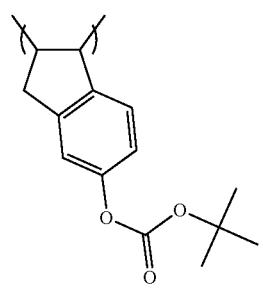

(VI-134)
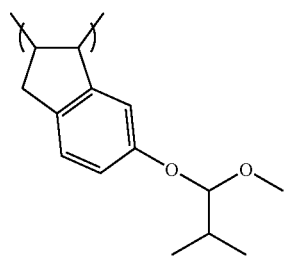
(VI-135)
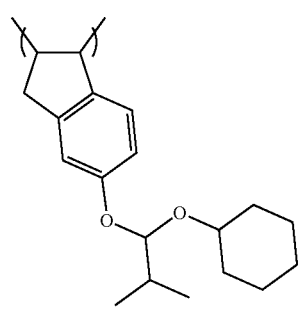
(VI-136)
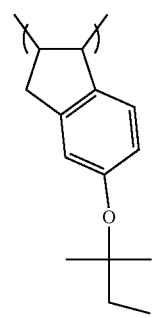
(VI-137)
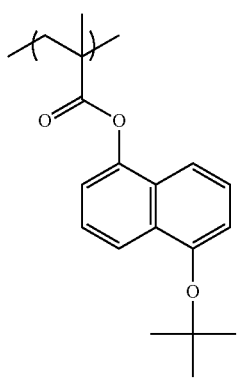
(VI-138)
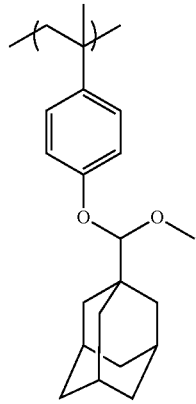
(VI-139)
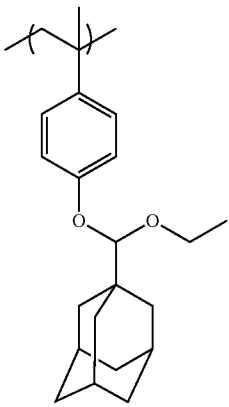
(VI-140)
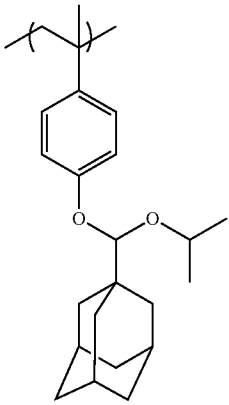
(VI-141)
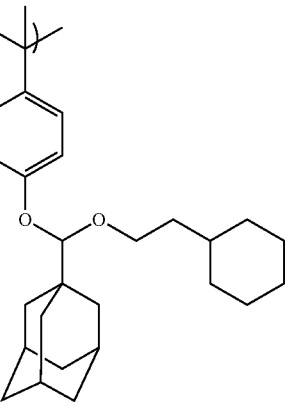

103
1
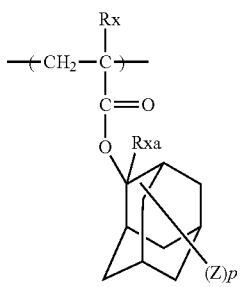
2
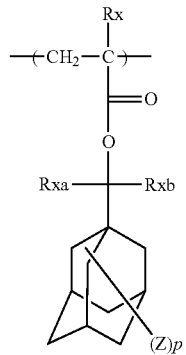
3
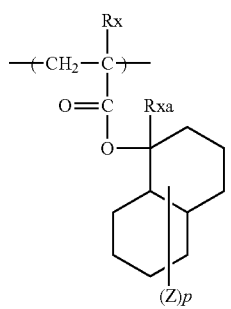
4
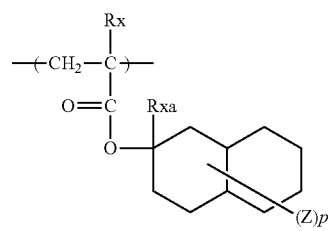
5
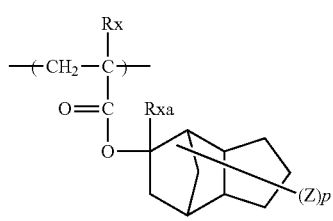
6
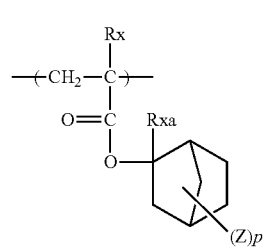
104
-continued
7
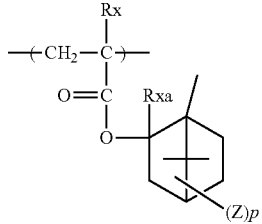
8
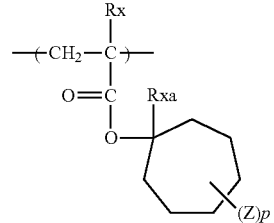
9
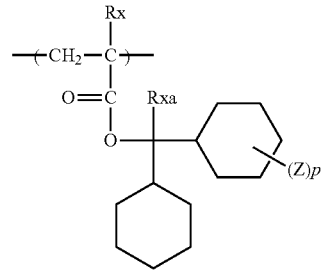
10
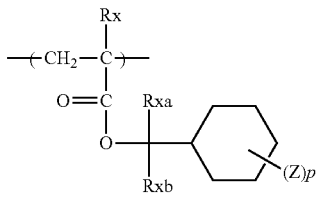
11
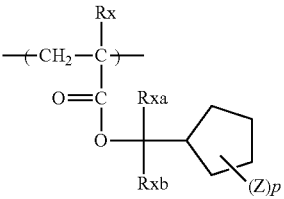
12
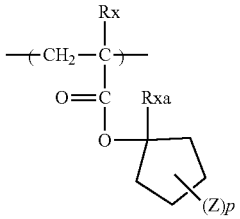
13
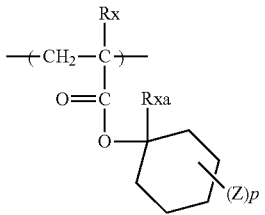

-continued
14
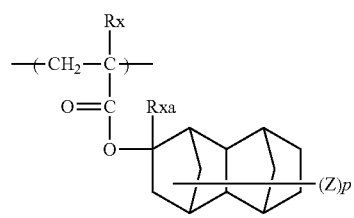
15
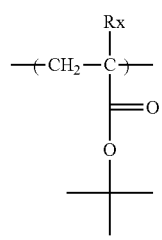
16
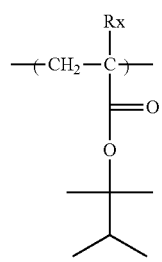
17
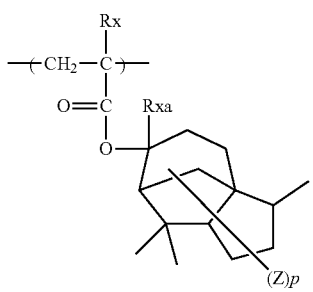
18
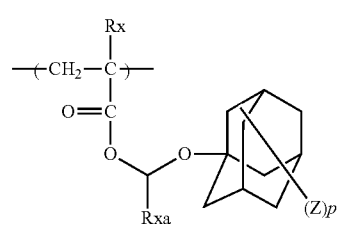
19
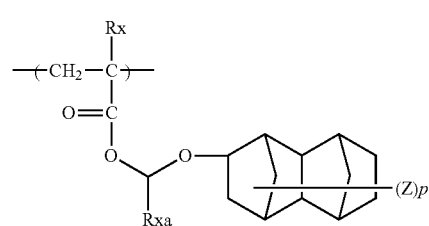
-continued
20
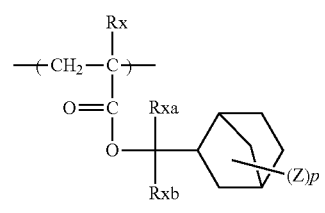
21
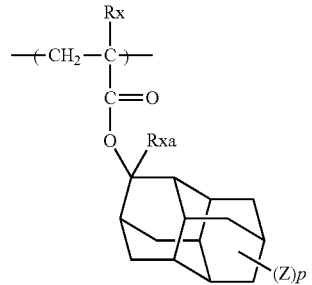
22
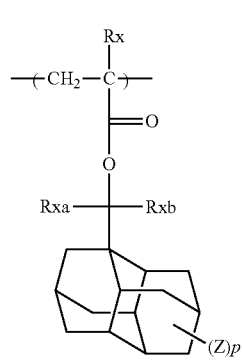
23
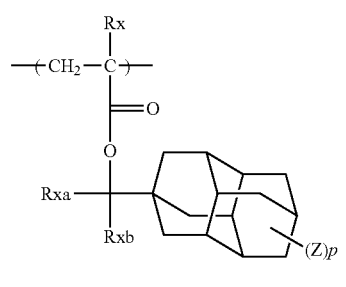
24
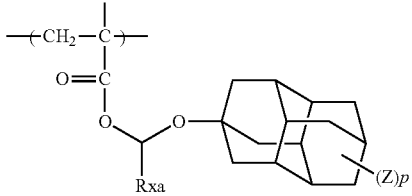
25
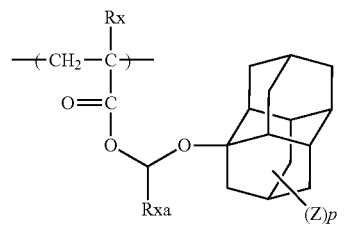

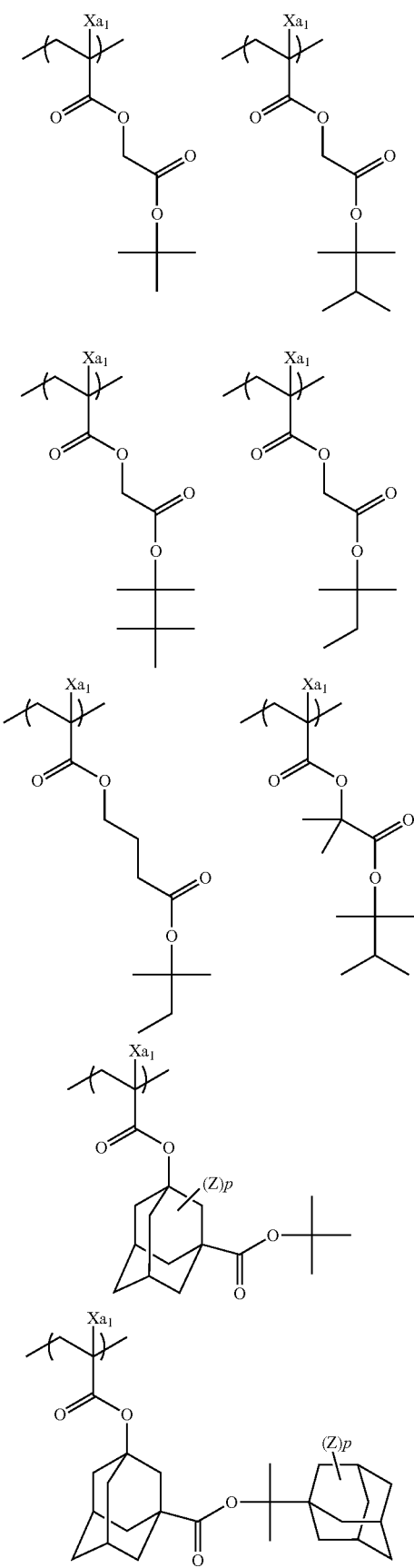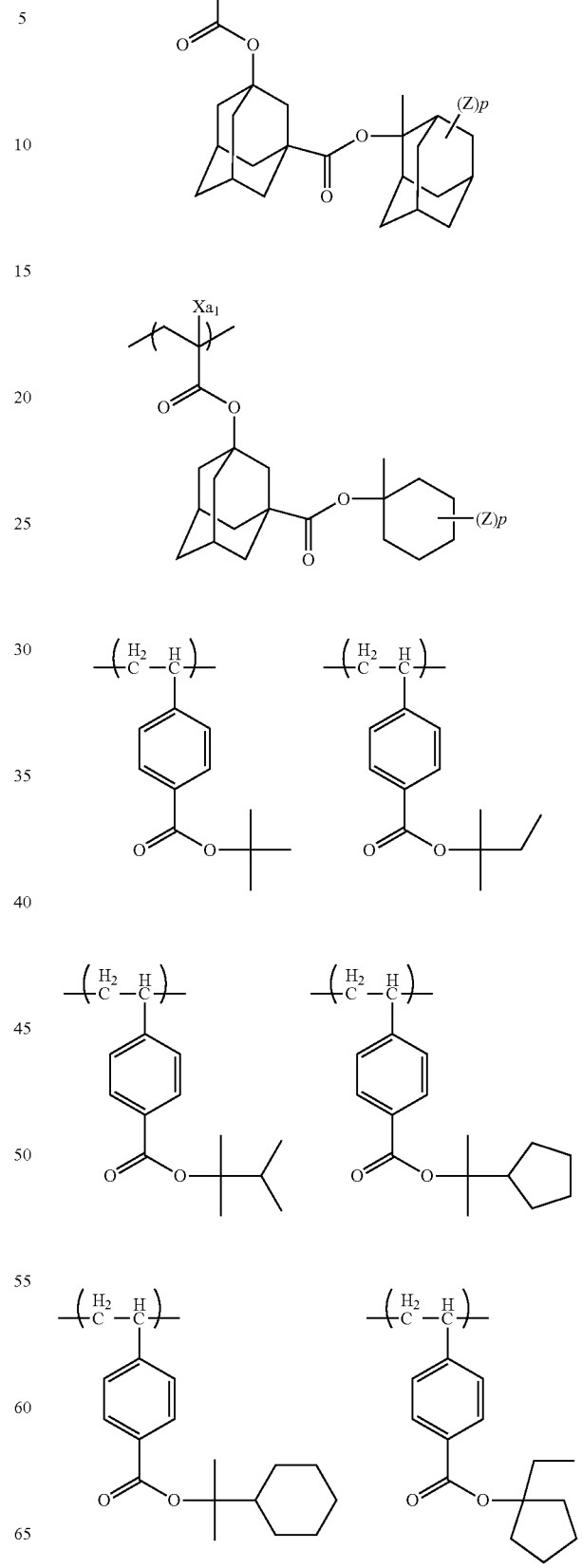

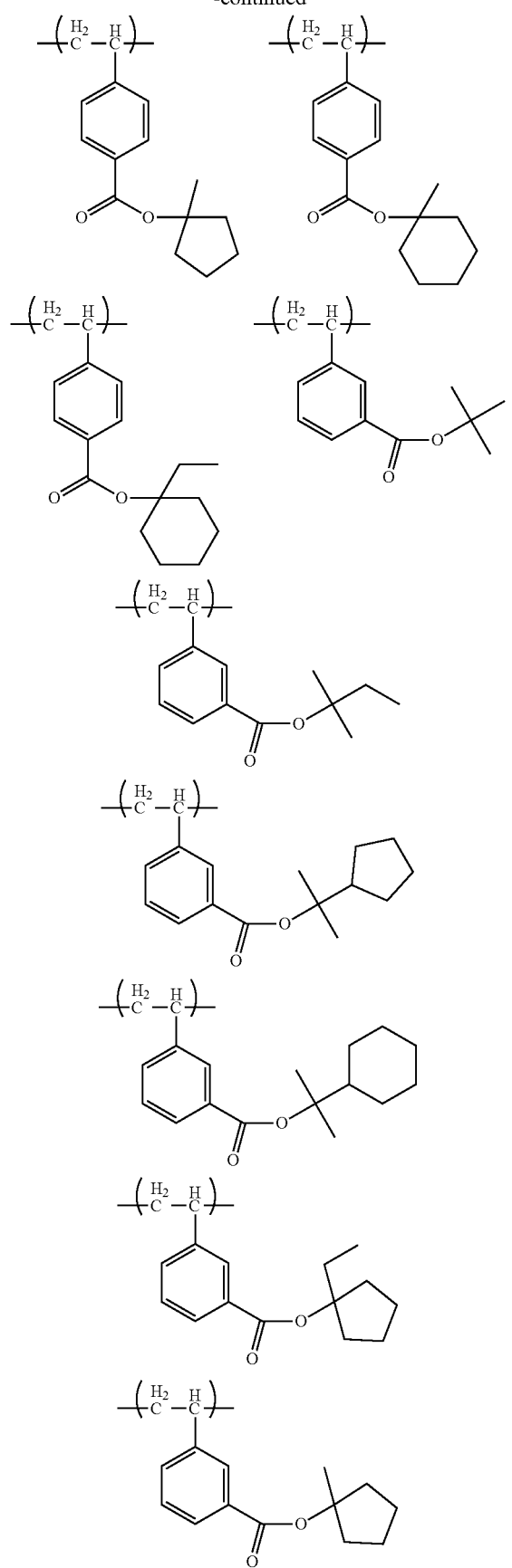
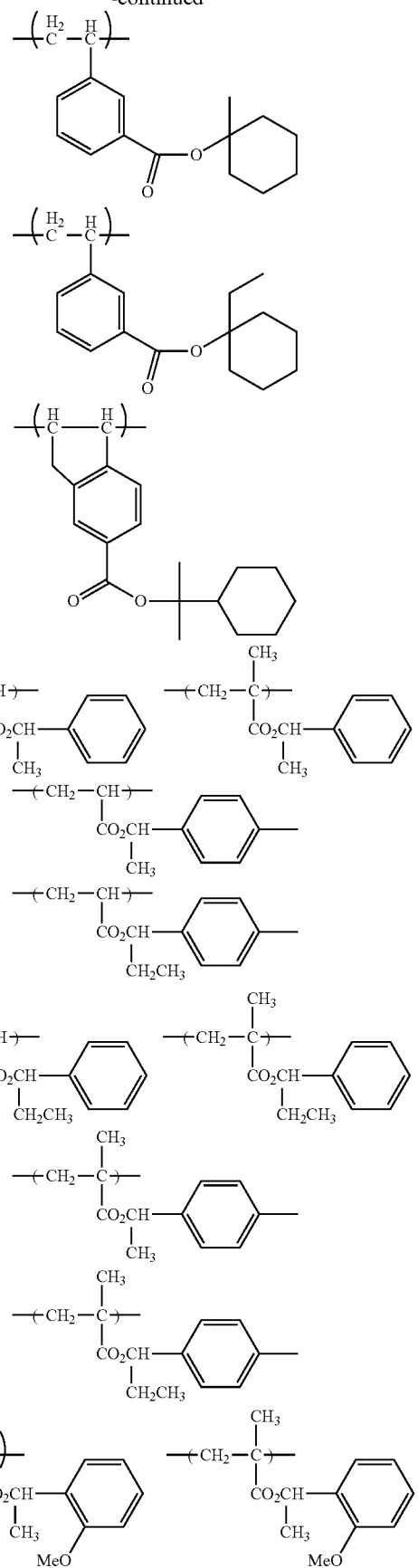

111
-continued
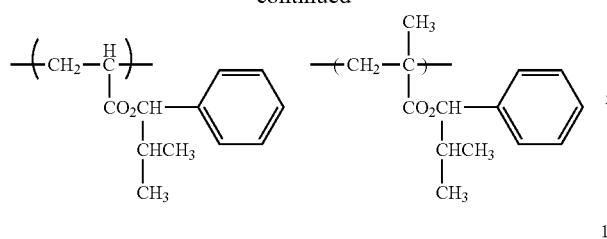
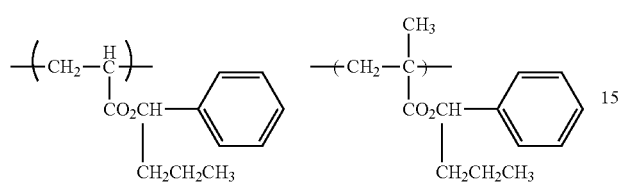
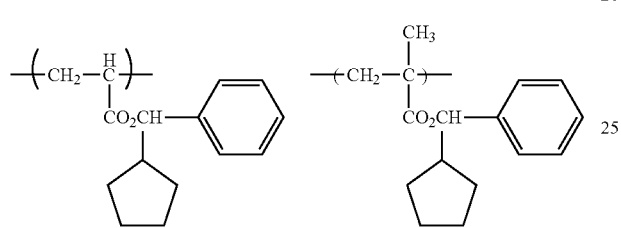
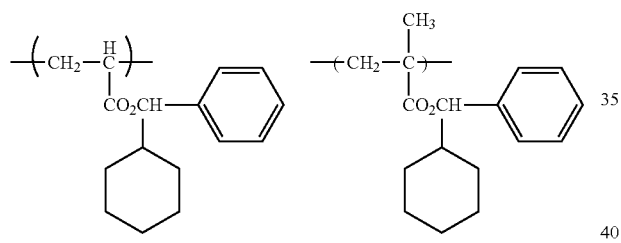
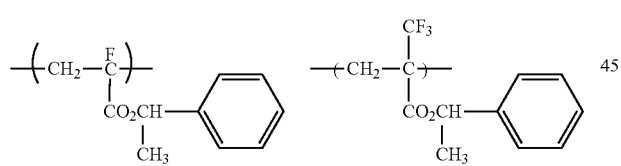
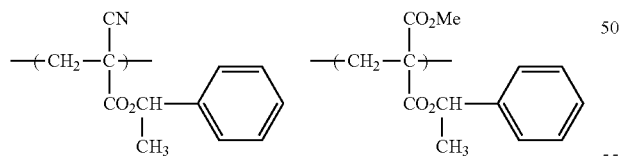
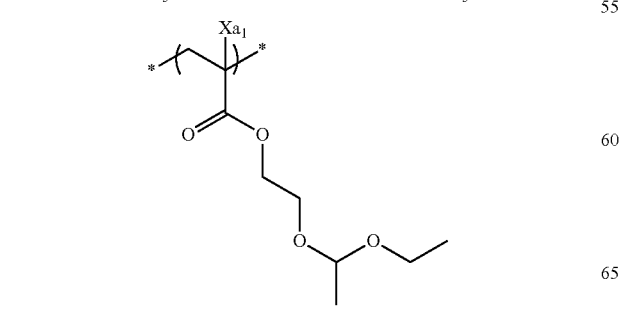
112
-continued
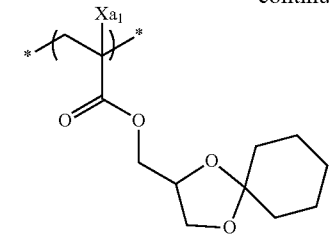
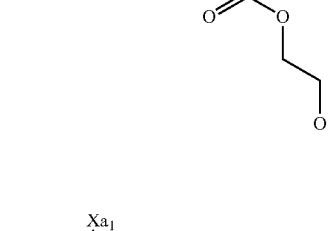
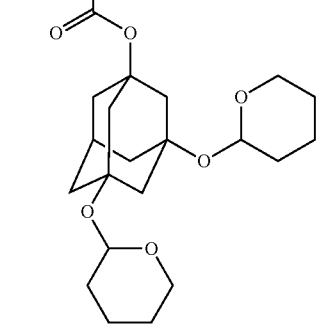
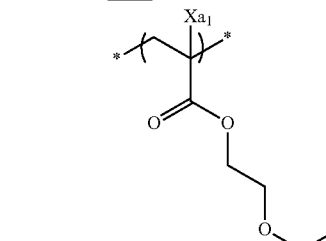
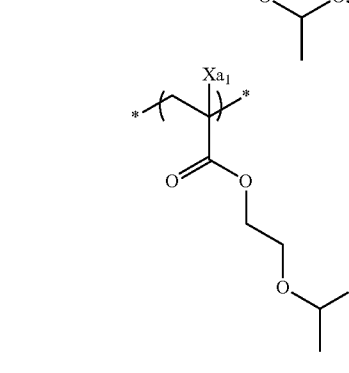

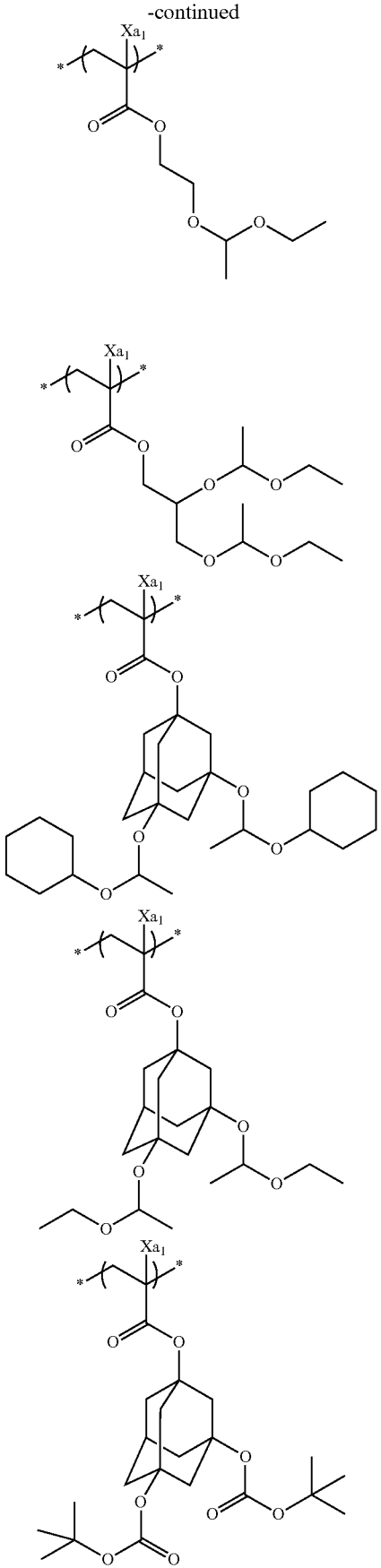

The repeating unit having an acid-decomposable group may be used alone or in combination of two or more thereof.

The resin (A) preferably further has a repeating unit as shown below, as the other repeating unit.

(Repeating Unit Having Polar Group)

The resin (A) may contain a repeating unit having a polar group, which is different from the non-acid-decomposable repeating unit (b) having a phenolic hydroxyl group as described above.

By containing the repeating unit having a polar group, for example, the sensitivity of the composition containing the resin can be enhanced. The repeating unit having a polar group is preferably a non-acid-decomposable repeating unit (that is, one having no acid-decomposable group).

The "polar group" that can be contained in the repeating unit having a polar group includes, for example, (1) to (4) described in the polar group contained in the crosslinking agent (C).

The "polar group" that can be contained in the repeating unit having a polar group is preferably, for example, at least one selected from the group consisting of (I) a hydroxy group, (II) a cyano group, (III) a lactone group, (IV) a carboxylic acid group or a sulfonic acid group, (V) an amide group, a sulfonamide group, or a group corresponding to a derivative thereof, (VI) an ammonium group or a sulfonium group, and a group formed by combining two or more thereof.

The polar group is preferably selected from a hydroxyl group, a cyano group, a lactone group, a carboxylic acid group, a sulfonic acid group, an amido group, a sulfonamide group, an ammonium group, a sulfonium group, and a group formed by combining two or more thereof, and particularly preferably an alcoholic hydroxy group, a cyano group, a lactone group, or a cyanolactone structure-containing group.

Specific examples of the repeating unit having a polar group are set forth below, but the present invention is not limited thereto.

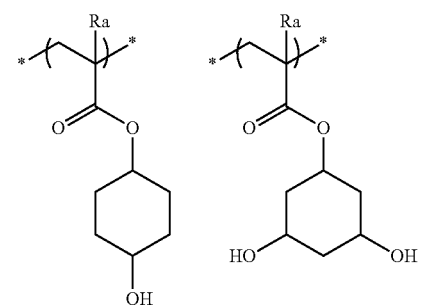
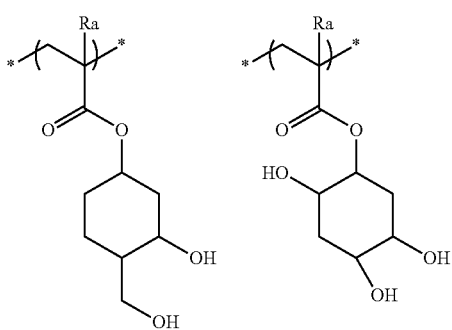
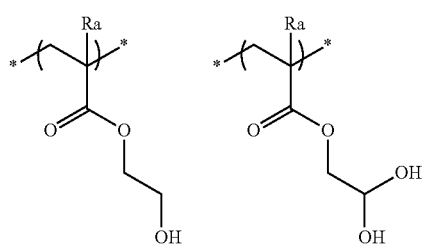
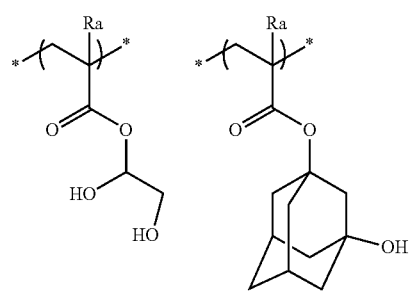

-continued

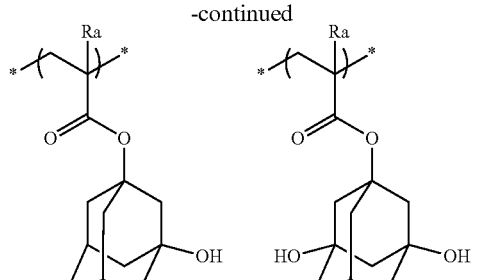
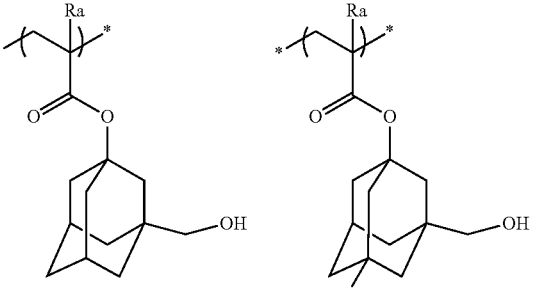
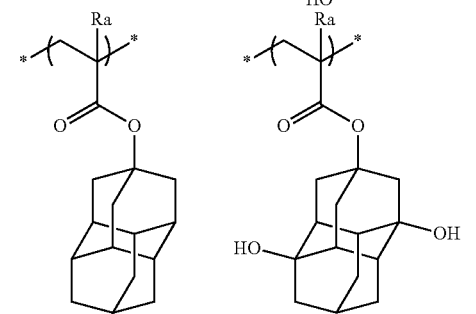
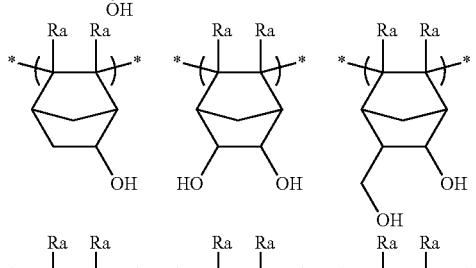
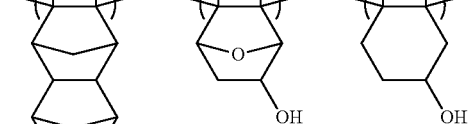
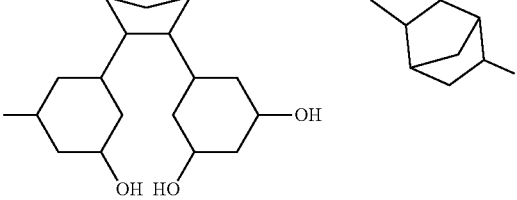

117
-continued
118
-continued
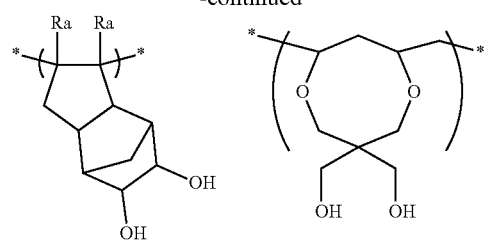
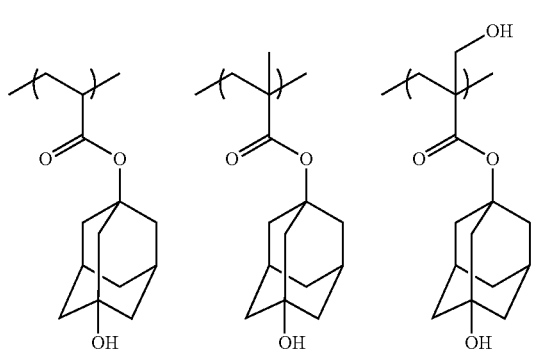
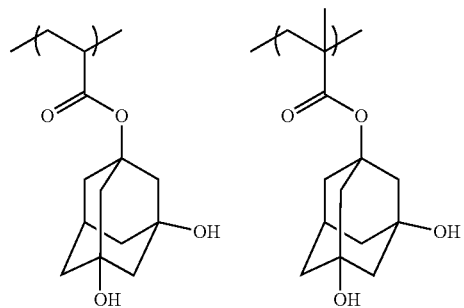
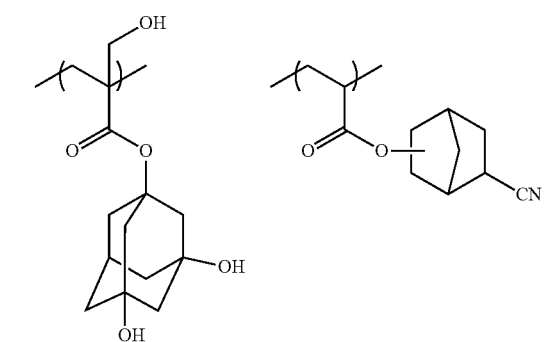
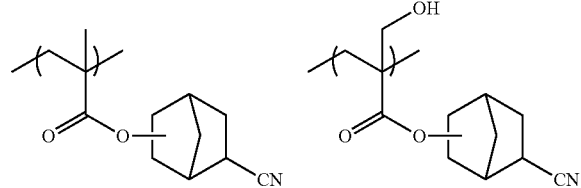
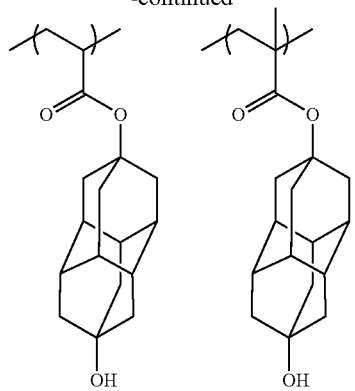
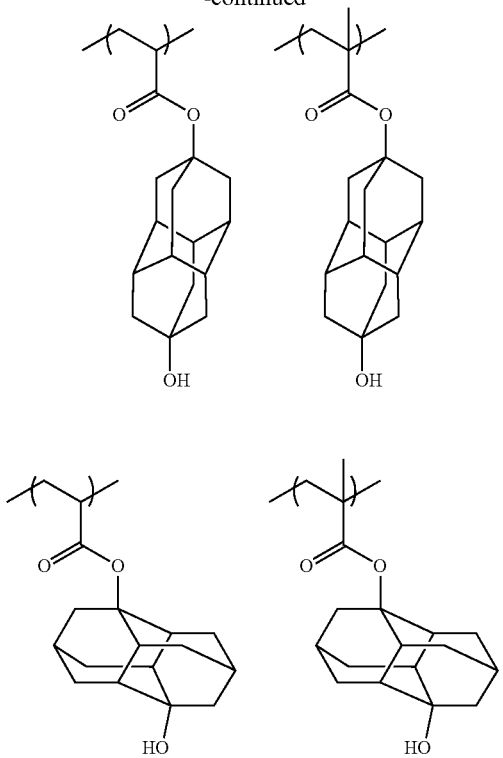
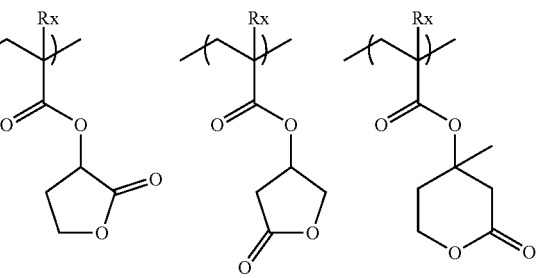
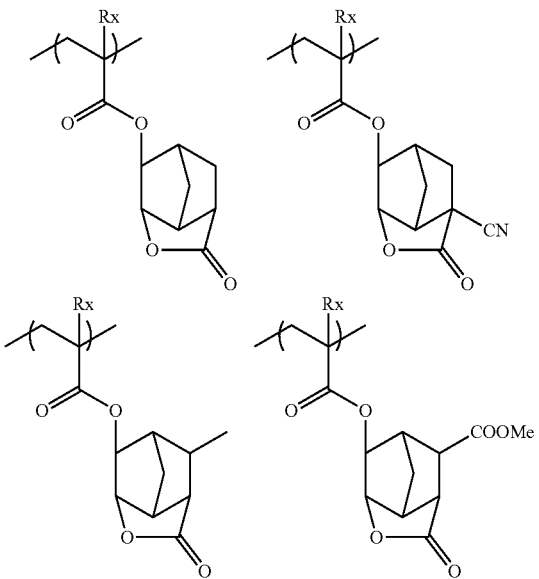

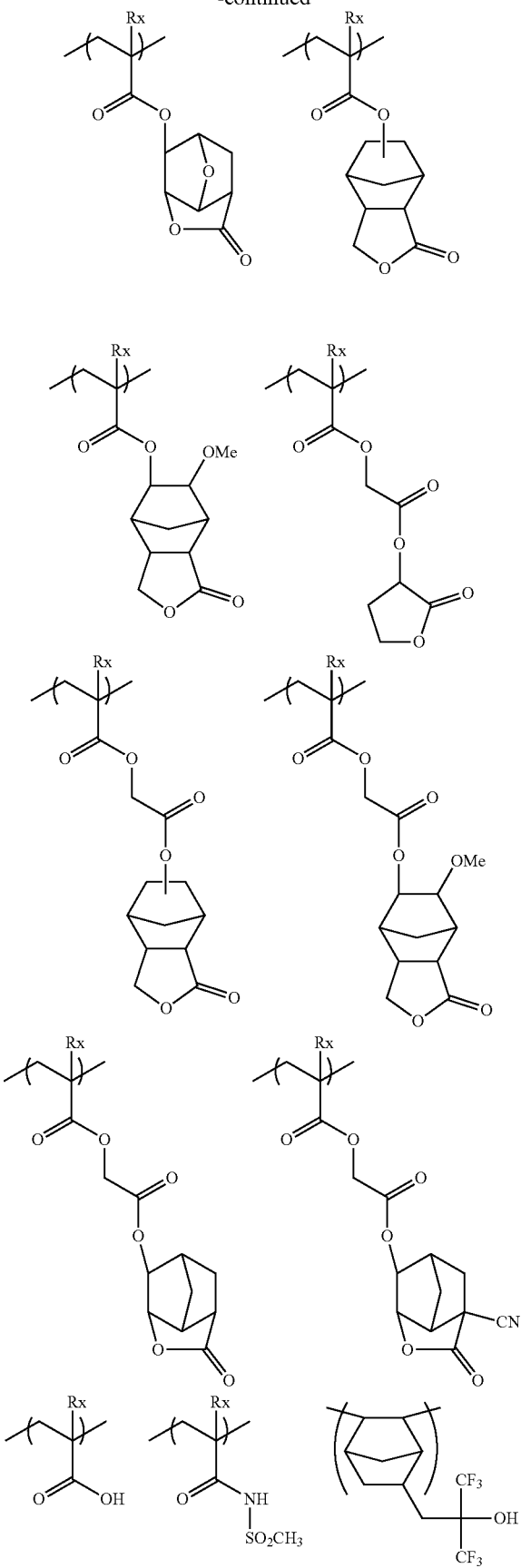
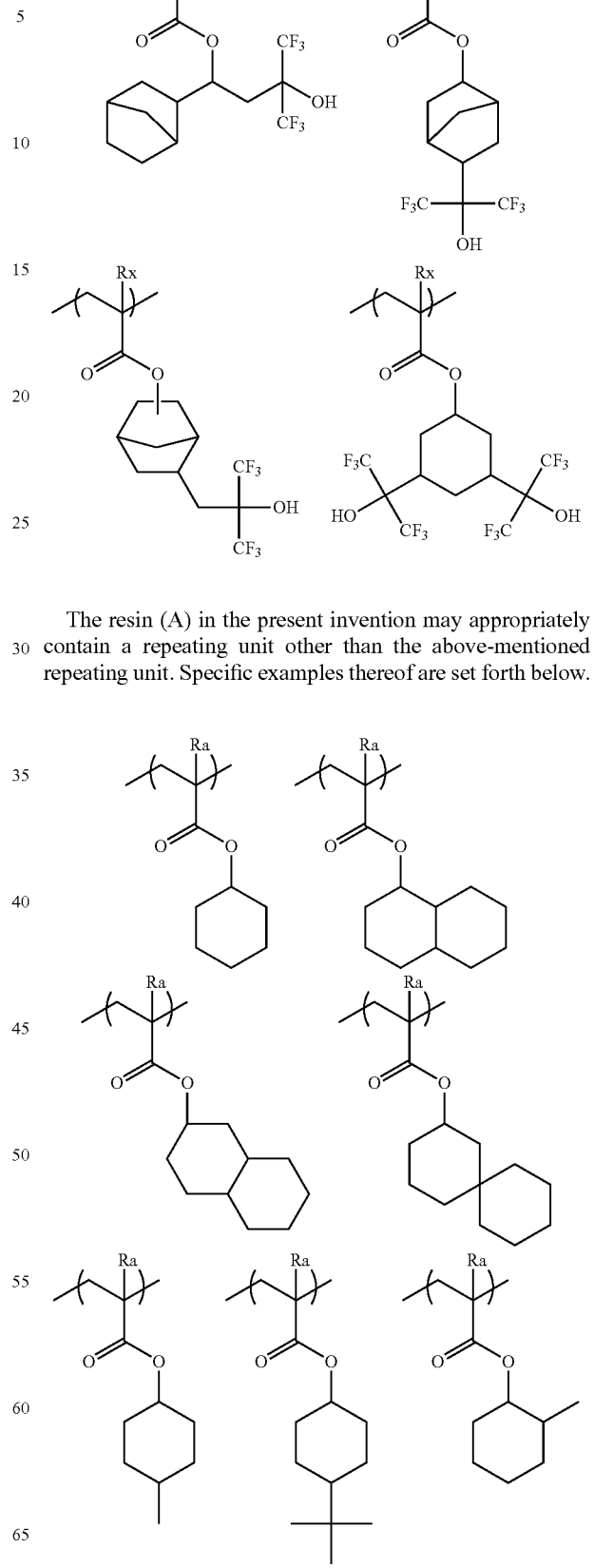
The resin (A) in the present invention may appropriately contain a repeating unit other than the above-mentioned repeating unit. Specific examples thereof are set forth below.

121
-continued
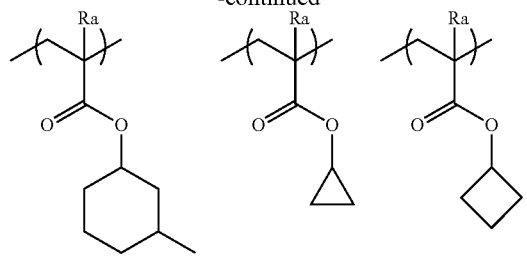
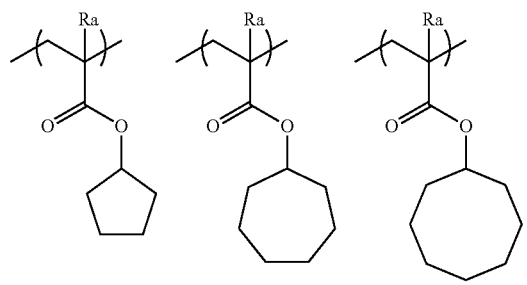
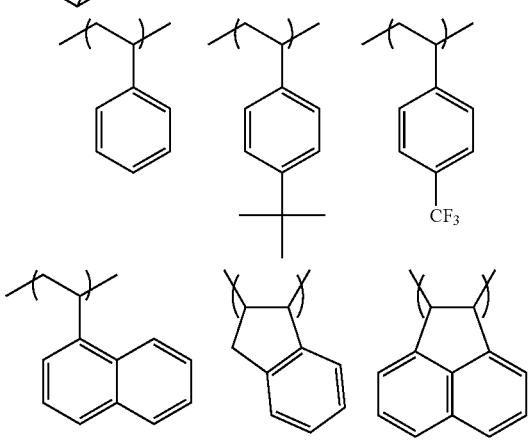
122
-continued
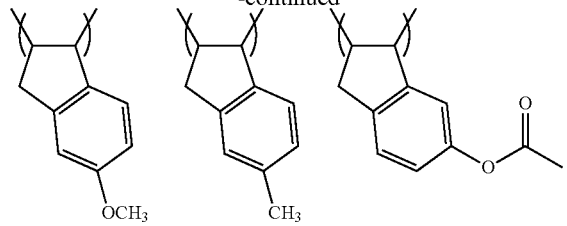
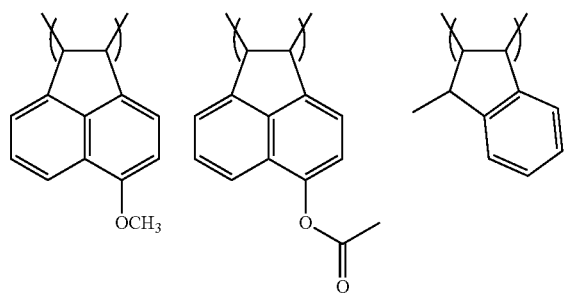
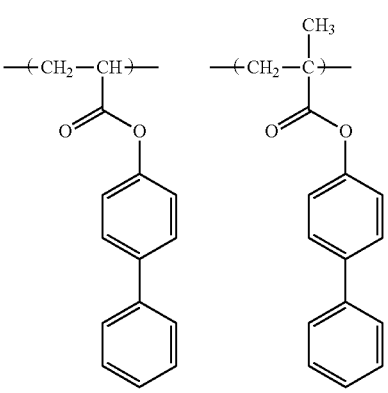
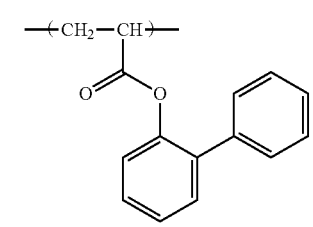
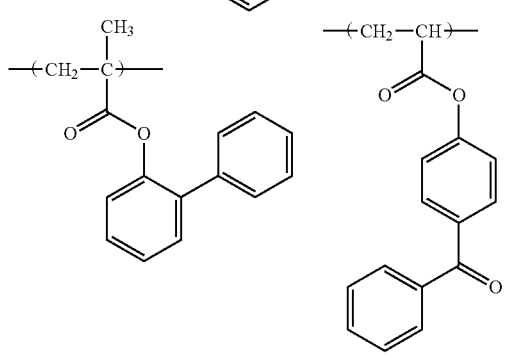

123

-continued

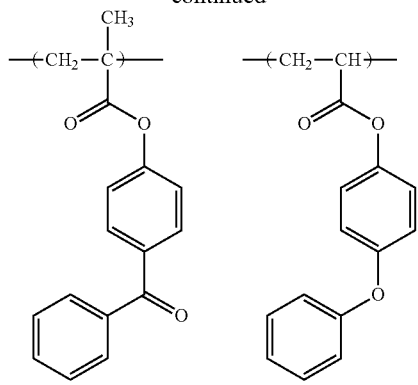

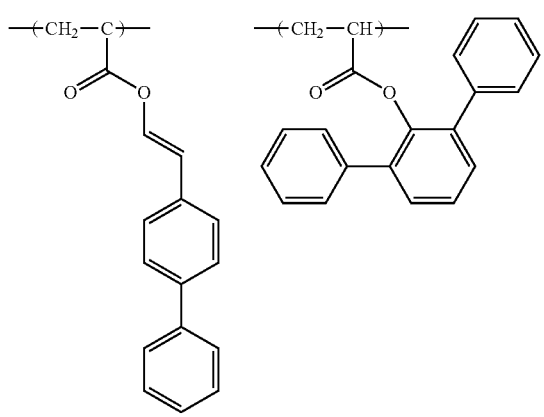

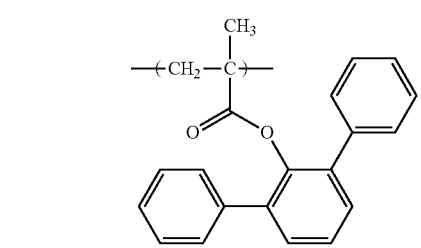

124

-continued

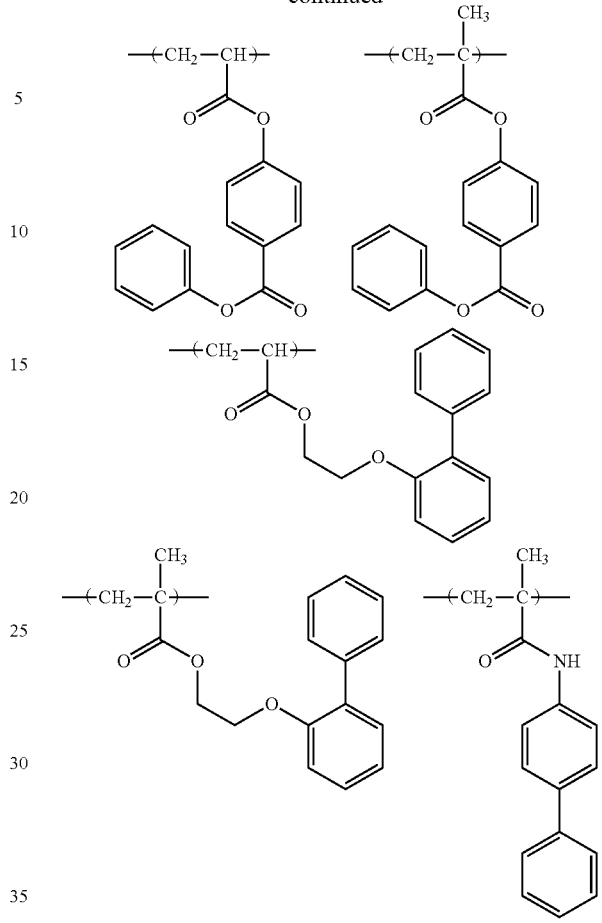

In the resin (A) for use in the composition of the present invention, the molar ratio of respective repeating structural units contained is appropriately set to adjust the dry etching resistance and standard developer suitability of a resist, adhesion to substrates, resist profile, and performances generally required for a resist, such as resolution, heat resistance, and sensitivity.

The form of the resin (A) of the present invention may be any of random, block, comb, and star types.

The resin (A) can be synthesized, for example, by radical, cationic, or anionic polymerization of unsaturated monomers corresponding to respective structures. In addition, it is also possible to obtain a desired resin by polymerizing unsaturated monomers corresponding to precursors of respective structures and then performing a polymer reaction.

Examples of a general synthesizing method include a batch polymerization method of dissolving an unsaturated monomer and a polymerization initiator in a solvent and heating the solution, thereby effecting the polymerization, and a dropping polymerization method of adding dropwise a solution of an unsaturated monomer and a polymerization initiator to a heated solvent over 1 hour to 10 hours. A dropping polymerization method is preferred.

Examples of the solvent used in polymerization include solvents which may be used in preparing an actinic ray-sensitive or radiation-sensitive resin composition to be described below, and more preferably, it is preferred to perform polymerization by using the same solvents as the solvents used in the composition of the present invention. Accordingly, generation of particles during storage may be suppressed.

The polymerization reaction is preferably carried out under the atmosphere of an inert gas such as nitrogen or argon. Polymerization is initiated using a commercially available radical initiator (an azo-based initiator, peroxides, or the like) as a polymerization initiator. The radical initiator is preferably an azo-based initiator, and an azo-based initiator having an ester group, a cyano group, or a carboxyl group is more preferred. Preferred examples of the initiator include azobisisobutyronitrile, azobisdimethylvaleronitrile, and dimethyl 2,2'-azobis(2-methylpropionate). If desired, the polymerization may be carried out in the presence of a chain transfer agent (for example, alkylmercaptan).

The concentration during the reaction is 5 mass % to 70 mass %, and preferably 10 mass % to 50 mass %. The reaction temperature is usually 10° C. to 150° C., preferably 30° C. to 120° C., and more preferably 40° C. to 100° C.

The reaction time is usually 1 hour to 48 hours, preferably 1 hour to 24 hours, and more preferably 1 hour to 12 hours.

After the completion of reaction, the reaction solution is allowed to cool to room temperature and purified. The purification may be carried out by a conventional method, for example, a liquid-liquid extraction method of applying water washing or combining it with an appropriate solvent to remove residual monomers or oligomer components; a purification method in a solution sate, such as ultrafiltration of removing by extraction only polymers having a molecular weight not more than a specific value; a re-precipitation method of adding dropwise the resin solution in a poor solvent to solidify the resin in the poor solvent and thereby remove residual monomers and the like; and a purification method in a solid state, such as washing of the resin slurry with a poor solvent after separation by filtration. For example, the resin is precipitated as a solid by bringing the reaction solution into contact with a solvent in which the resin is sparingly soluble or insoluble (poor solvent), and which is in a volume amount of 10 times or less, preferably 10 to 5 times the reaction solution.

The solvent used at the operation of precipitation or re-precipitation from the polymer solution (precipitation or re-precipitation solvent) may be sufficient if it is a poor solvent to the polymer, and the solvent which can be used may be appropriately selected from a hydrocarbon, a halogenated hydrocarbon, a nitro compound, an ether, a ketone, an ester, a carbonate, an alcohol, a carboxylic acid, water, a mixed solvent containing these solvents, and the like, according to the kind of the polymer. Among these solvents, a solvent containing at least an alcohol (particularly, methanol or the like) or water is preferred as the precipitation or re-precipitation solvent.

The amount of the precipitation or re-precipitation solvent used may be appropriately selected by taking into consideration the efficiency, yield, and the like, but in general, the amount used is 100 parts by mass to 10,000 parts by mass, preferably 200 parts by mass to 2,000 parts by mass, and more preferably 300 parts by mass to 1,000 parts by mass, based on 100 parts by mass of the polymer solution.

The temperature at the time of precipitation or re-precipitation may be appropriately selected by taking into consideration the efficiency or operability but is usually approximately 0° C. to 50° C., preferably in the vicinity of room temperature (for example, approximately 20° C. to 35° C.). The precipitation or re-precipitation operation may be carried out using a commonly used mixing vessel such as a stirring tank, by a known method such as batch system and continuous system.

The precipitated or re-precipitated polymer is usually subjected to commonly used solid-liquid separation such as filtration or centrifugation, dried and then used. The filtration is carried out using a solvent-resistant filter material preferably under pressure. The drying is carried out under normal pressure or reduced pressure (preferably under reduced pressure) at a temperature of approximately 30° C. to 100° C., and preferably approximately 30° C. to 50° C.

Meanwhile, after the resin is once precipitated and separated, the resin may be dissolved again in a solvent and then brought into contact with a solvent in which the resin is sparingly soluble or insoluble. That is, there may be used a method including, after the completion of radical polymerization reaction, bringing the polymer into contact with a solvent in which the polymer is sparingly soluble or insoluble, to precipitate a resin (step a), separating the resin from the solution (step b), dissolving the resin again in a solvent to prepare a resin solution A (step c), bringing the resin solution A into contact with a solvent in which the resin is sparingly soluble or insoluble and which is in a volume amount of less than 10 times (preferably 5 times or less) the resin solution A, to precipitate a resin solid (step d), and separating the precipitated resin (step e).

The polymerization reaction is preferably carried out under the atmosphere of an inert gas such as nitrogen or argon. Polymerization is initiated using a commercially available radical initiator (an azo-based initiator, peroxides, or the like) as a polymerization initiator. The radical initiator is preferably an azo-based initiator, and an azo-based initiator having an ester group, a cyano group, or a carboxyl group is preferred. Preferred examples of the initiator include azobisisobutyronitrile, azobisdimethylvaleronitrile, and dimethyl 2,2'-azobis(2-methylpropionate). The initiator is added additionally or in parts, if desired. After the completion of reaction, the reaction product is poured in a solvent, and the desired polymer is collected, for example, by a method for powder or solid recovery. The concentration during the reaction is 5 mass % to 50 mass %, and preferably 10 mass % to 30 mass %. The reaction temperature is usually 10° C. to 150° C., preferably 30° C. to 120° C., and more preferably 60° C. to 100° C.

<(B) Compound Capable of Generating Acid Upon Irradiation with Actinic Rays or Radiation>

The composition of the present invention may contain (B) a compound capable of generating an acid upon irradiation with actinic rays or radiation (hereinafter, appropriately, simply referred to as an "acid generator").

A preferred embodiment of the acid generator is an onium compound. Examples of the onium compound include a sulfonium salt, an iodonium salt, and a phosphonium salt.

Another preferred embodiment of the acid generator is a compound capable of generating a sulfonic acid, an imide acid, or a methide acid upon irradiation with actinic rays or radiation. Examples of the acid generator in this embodiment include a sulfonium salt, an iodonium salt, a phosphonium salt, oxime sulfonate, and imidosulfonate.

The acid generator for use in the present invention is not limited to a low molecular weight compound, and a compound where a group capable of generating an acid upon irradiation with actinic rays or radiation is introduced into the main chain or side chain of a polymer compound may also be used. Furthermore, in the case where, as described above, a group capable of generating an acid upon irradiation with actinic rays or radiation is present in a repeating unit serving as a copolymerization component of the resin (A) for use in the present invention, the acid generator (B) as a molecule different from the resin (A) of the present invention may be absent.

The acid generator is preferably a compound capable of generating an acid upon irradiation with an electron beam or extreme ultraviolet rays.

In the present invention, the onium compound is preferably a sulfonium compound represented by the following General Formula (7) or an iodonium compound represented by General Formula (8):

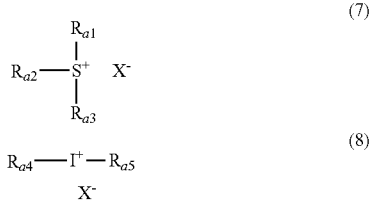

In General Formulae (7) and (8), $R_{a1}$, $R_{a2}$, $R_{a3}$, $R_{a4}$, and $R_{a5}$ each independently represent an organic group.

$X^-$ represents an organic anion.

Hereinafter, the sulfonium compound represented by General Formula (7) and the iodonium compound represented by General Formula (8) will be described in more detail.

Each of $R_{a1}$ to $R_{a3}$ in General Formula (7) and $R_{a4}$ and $R_{a5}$ in General Formula (8) independently represents an organic group, but each of at least one of $R_{a1}$, $R_{a2}$, or $R_{a3}$ and at least one of $R_{a4}$ or $R_{a5}$ is preferably an aryl group. The aryl group is preferably a phenyl group or a naphthyl group, and more preferably a phenyl group.

Examples of the organic anion of $X^-$ in General Formulae (7) and (8) include a sulfonate anion, a carboxylate anion, a bis(alkylsulfonyl)amide anion, and a tris(alkylsulfonyl)methide anion. The organic anion is preferably an organic anion represented by the following General Formula (9), (10), or (11), and more preferably an organic anion represented by the following General Formula (9).

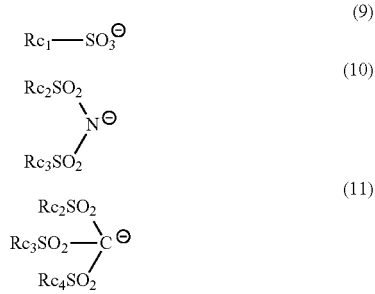

In General Formulae (9), (10), and (11), each of $Rc_1$, $Rc_2$, $Rc_3$, and $Rc_4$ represents an organic group.

The organic anion of $X^-$ corresponds to a sulfonic acid, an imide acid, or a methide acid which is an acid generated upon irradiation with actinic rays or radiation such as an electron beam and extreme ultraviolet rays.

Examples of the organic group of $Rc_1$ to $Rc_4$ include an alkyl group, a cycloalkyl group, an aryl group, and a group formed by combining a plurality of such groups. Among these organic groups, preferred are an alkyl group substituted with a fluorine atom or a fluoroalkyl group at the 1-position, a cycloalkyl group substituted with a fluorine atom or a fluoroalkyl group, and a phenyl group substituted with a fluorine atom or a fluoroalkyl group. A plurality of organic groups of $Rc_2$ to $Rc_4$ may be linked together to form a ring, and as for the group having a plurality of linked organic groups, an alkylene group substituted with a fluorine atom or a fluoroalkyl group is preferred. By containing the fluorine atom or the fluoroalkyl group, the acidity of the acid generated by light irradiation is increased, thereby improving the sensitivity. Meanwhile, it is preferred that a terminal group does not contain a fluorine atom as a substituent.

Also, in the present invention, in view of suppressing diffusion of an acid generated by exposure into a non-exposed area, thereby improving a resolution or a pattern profile, the compound (B) which generates an acid is preferably a compound which generates an acid with a volume of 130 Å$^3$ or more (more preferably, a sulfonic acid), more preferably a compound which generates an acid with a volume of 190 Å$^3$ or more (more preferably, a sulfonic acid), and still more preferably a compound which generates an acid with a volume of 240 Å$^3$ or more (more preferably, a sulfonic acid). Meanwhile, in view of the sensitivity or the coating solvent solubility, the volume is preferably 2,000 Å$^3$ or less, and more preferably 1,500 Å$^3$ or less.

The value of the volume was obtained using "WinMOPAC" manufactured by FUJITSU LIMITED. That is, the "accessible volume" of each acid may be calculated by, first, inputting a chemical structure of an acid according to each case, determining the most stable conformation of each acid by a molecular force field calculation using a MM3 method with an initial structure of this structure, and then performing a molecular orbital calculation using a PM3 method for the most stable conformation.

Further, as described above, in the case where the compound (B) is a polymer compound in which a group capable of generating an acid upon irradiation with actinic rays or radiation is introduced into the main chain or side chain of the polymer compound, the volume of the compound (B) can be regarded as the volume of the entire polymer compound. In addition, the weight average molecular weight of the polymer compound is preferably 1,500 or more from the above viewpoint. Also, as described above, in the case where the resin (A) contains a repeating unit having a group capable of generating an acid upon irradiation with actinic rays or radiation, the weight average molecular weight of the resin (A) is preferably 1,500 or more from the above viewpoint. In one embodiment of the present invention, it is preferred that the composition of the present invention contains a low molecular weight compound (for example, having a molecular weight of 2,000 or less) as the compound (B), and additionally the volume of an acid generated from the decomposition of the compound (B) upon irradiation with actinic rays or radiation is 240 Å$^3$ or more.

Hereinafter, a particularly preferred acid generator in the present invention will be exemplified. Also, some examples are given calculated values of volume (unit: Å$^3$). Meanwhile, the value calculated herein is a volume value of an acid in which a proton is bound to an anion moiety.

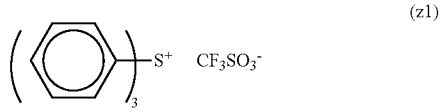

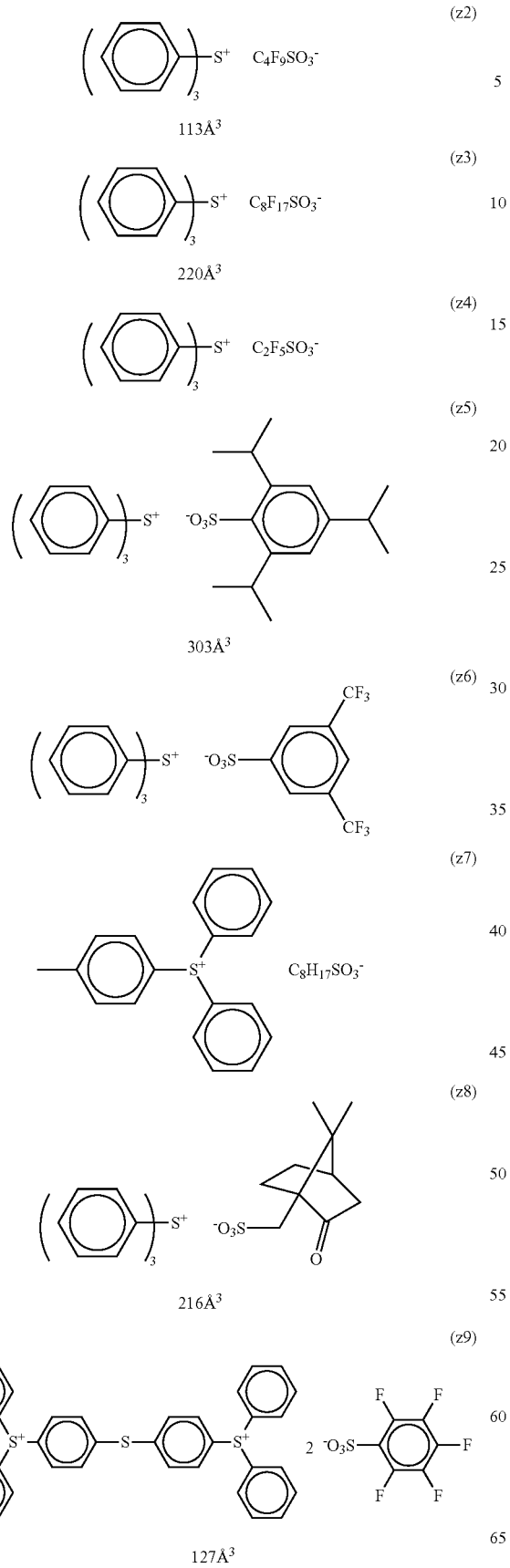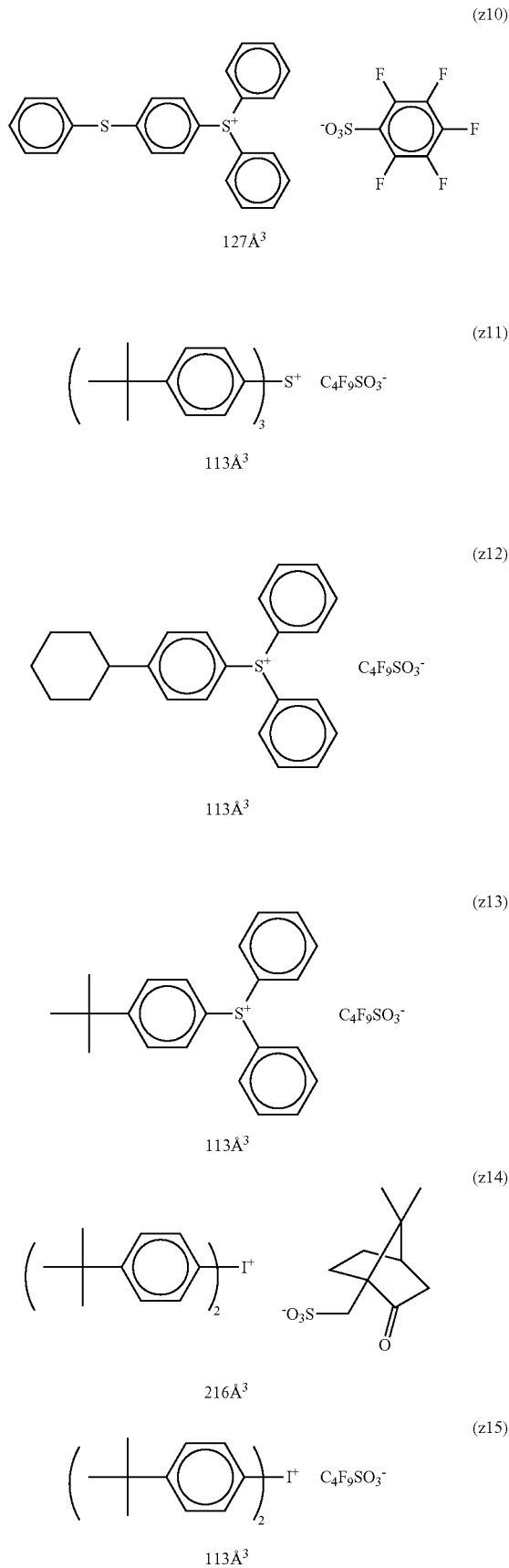

-continued
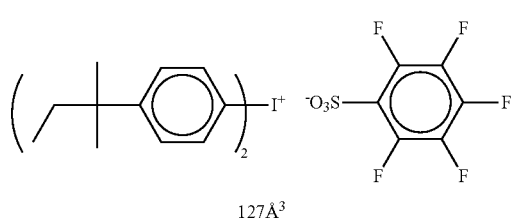 (z16)
127Å³
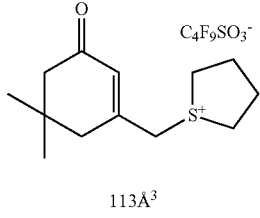 (z23)
113Å³
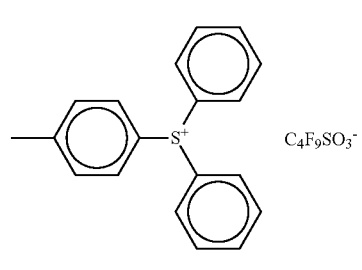 (z17)
113Å³
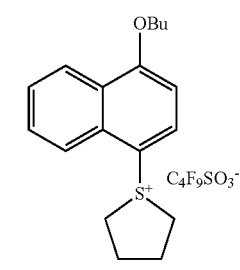 (z24)
113Å³
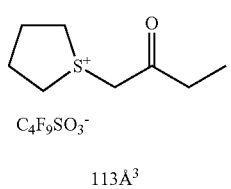 (z18)
113Å³
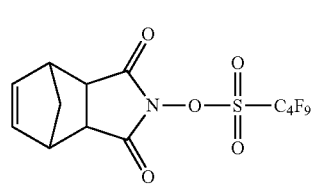 (z25)
113Å³
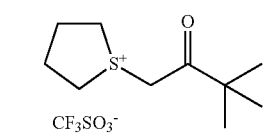 (z19)
113Å³
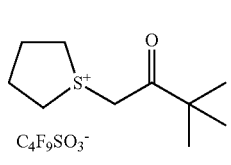 (z20)
113Å³
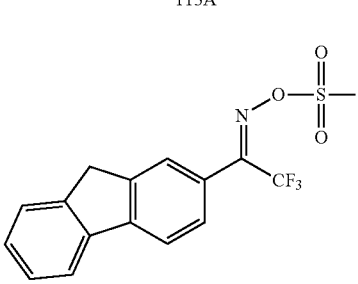 (z26)
113Å³
 (z21)
113Å³
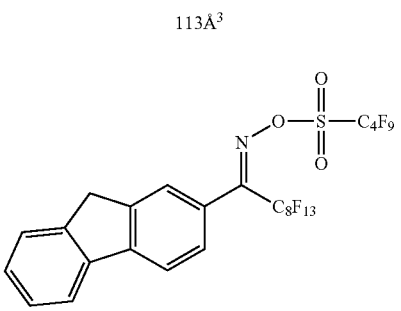 (z27)
113Å³
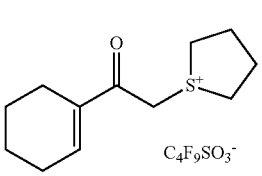 (z22)
113Å³
 (z28)
113Å³

-continued
(z29)
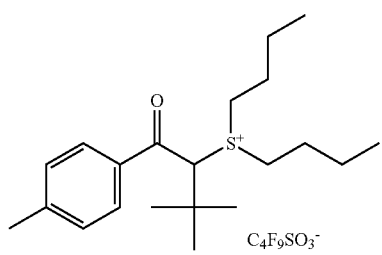
C4F9SO3-
113Å³
(z30)
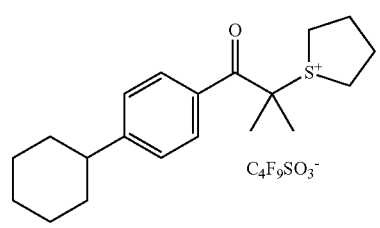
C4F9SO3-
113Å³
(z31)
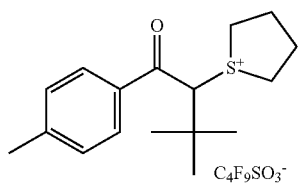
C4F9SO3-
113Å³
(z32)
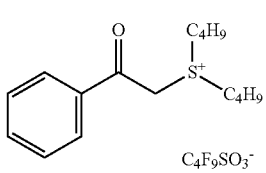
C4F9SO3-
113Å³
(z33)
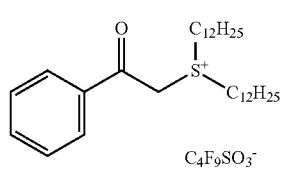
C4F9SO3-
113Å³
(z34)
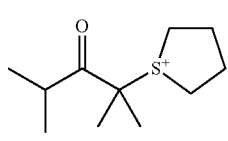
C4F9SO3-
113Å³
-continued
(z35)
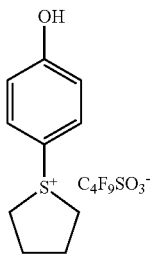
C4F9SO3-
113Å³
(z36)
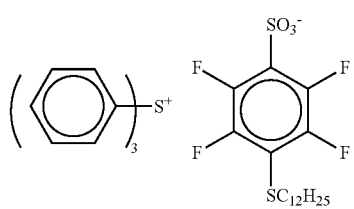
393Å³
(z37)
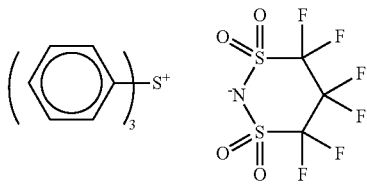
136Å³
(z38)
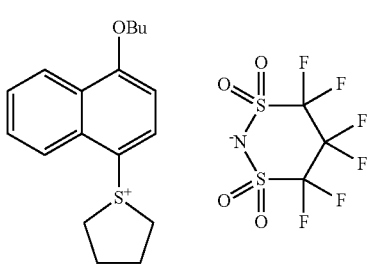
136Å³
(z39)
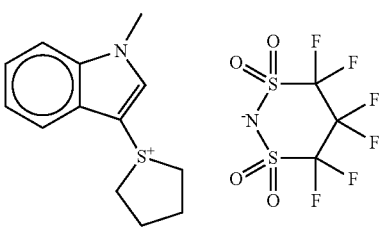
136Å³
(z40)
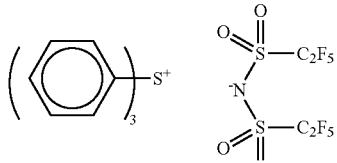
173Å³

-continued
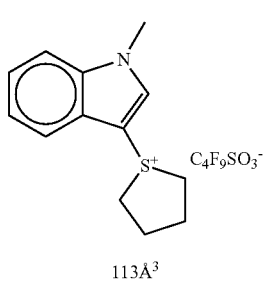
(z41)
113Å³
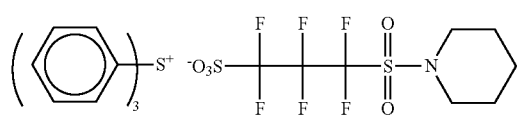
(z42)
244Å³
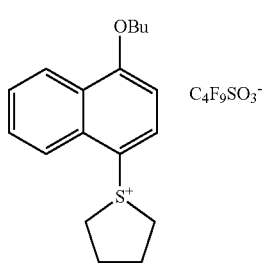
(z43)
113Å³
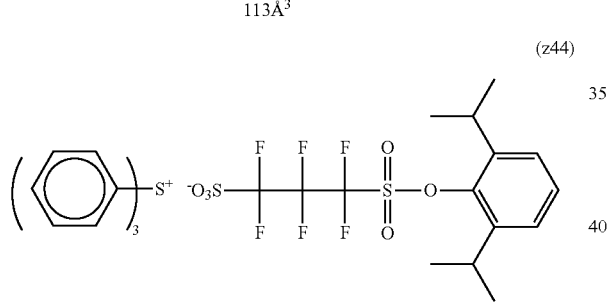
(z44)
347Å³
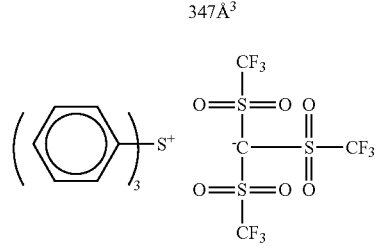
(z45)
189Å³
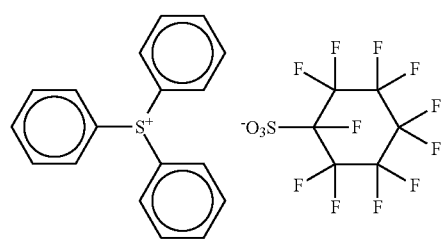
(z46)
136Å³
-continued
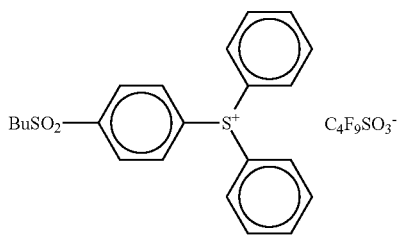
(z47)
113Å³
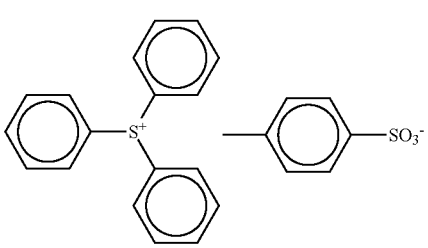
(z48)
186Å³
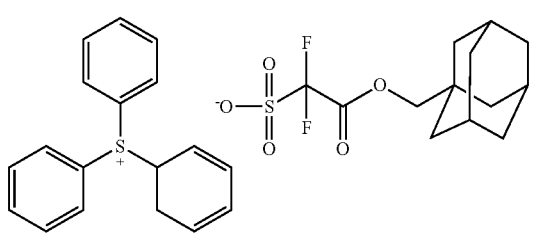
(z49)
271Å³
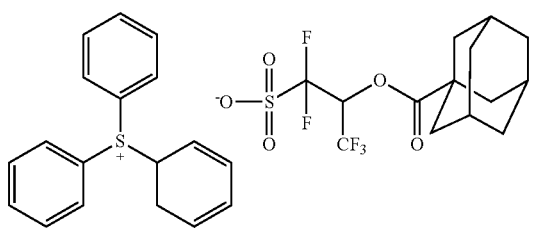
(z50)
291Å³
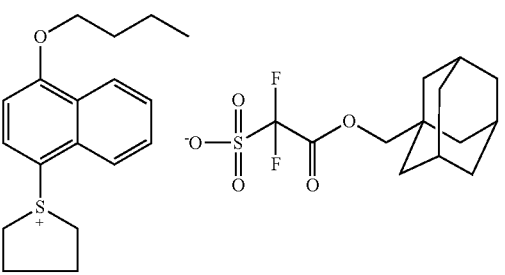
(z51)
271Å³

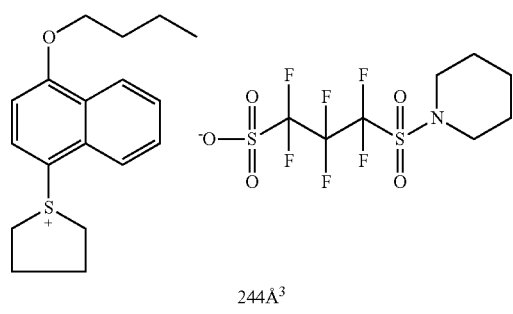
(z52) 244Å³
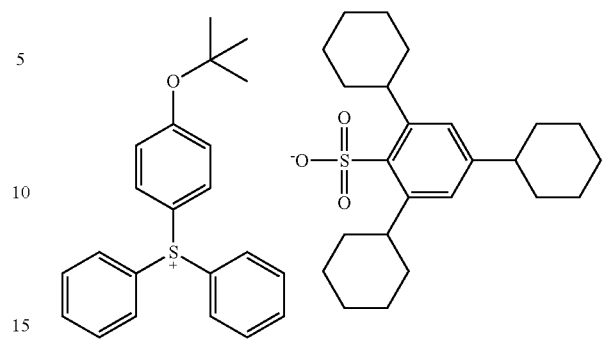
(z56) 437Å³
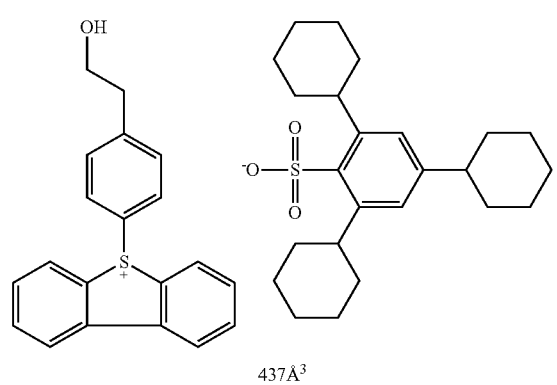
(z53) 437Å³
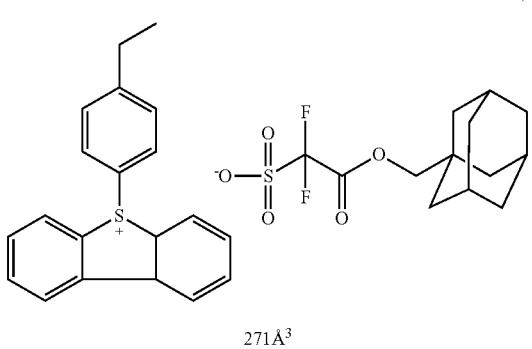
(z57) 271Å³
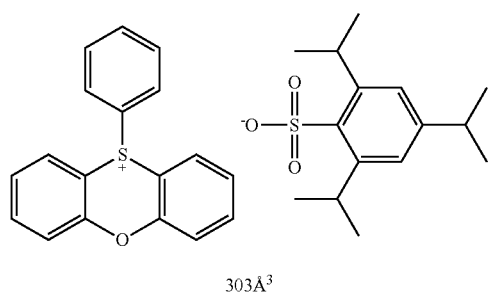
(z54) 303Å³
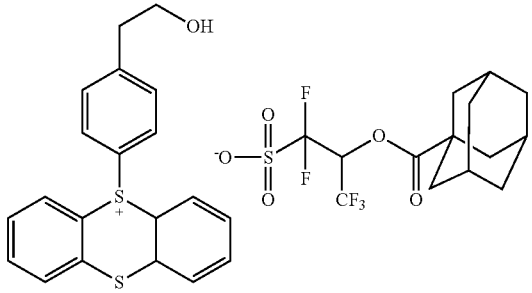
(z58) 291Å³
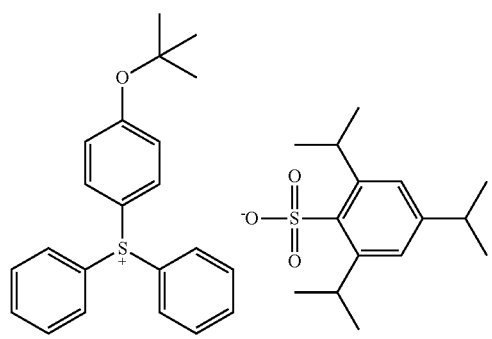
(z55) 303Å³
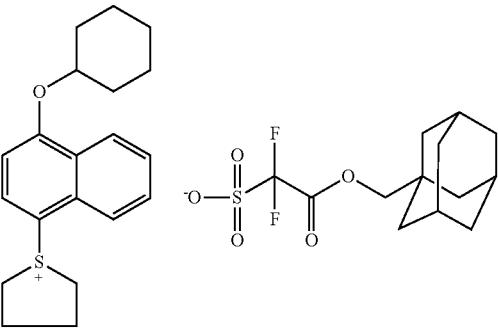
(z59) 271Å³

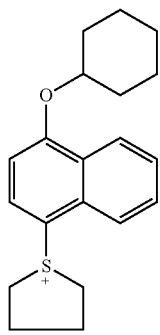
(z60)

244Å³

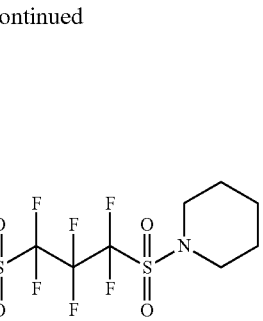

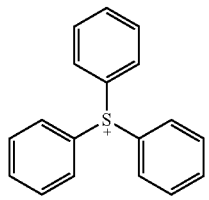
(z61)

311Å³

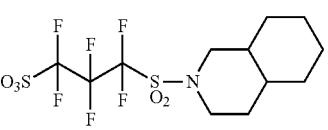

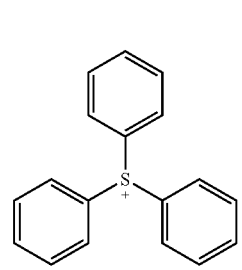
(z62)

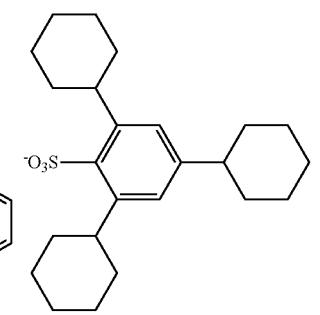

437Å³

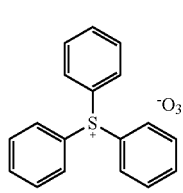
(z63)

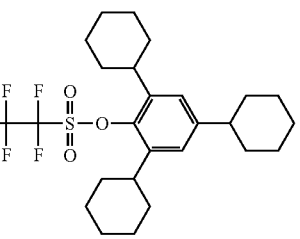

536Å³

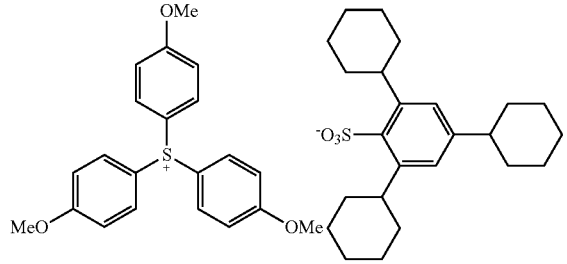
(z64)

437Å³

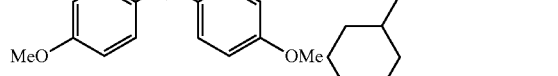
(z65)

437Å³

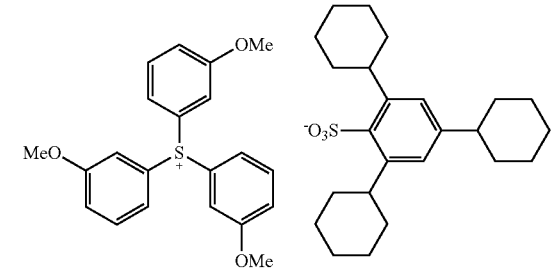

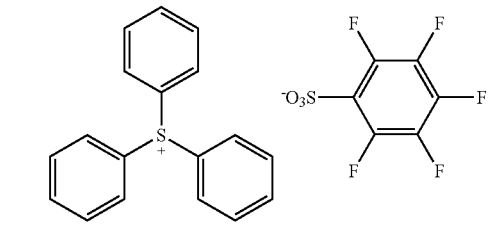
(z66)

127Å³

As the acid generator (preferably an onium compound) for use in the present invention, a polymer-type acid generator where a group capable of generating an acid upon irradiation with actinic rays or radiation (photoacid-generating group) is introduced into the main chain or side chain of a polymer compound may also be used, and this acid generator is described as a repeating unit having a photoacid-generating group in connection with the polymer compound (A).

The content of the acid generator in the composition is preferably 0.1 mass % to 25 mass %, more preferably 0.5 mass % to 20 mass %, and still more preferably 1 mass % to 18 mass %, based on the total solid content of the composition of the present invention.

The acid generator may be used alone or in combination of two or more thereof.

<Another Crosslinking Agent>

The present invention may employ another crosslinking agent (hereinafter, referred to as "crosslinking agent (Cl)") other than the above-mentioned crosslinking agent (C) of the present invention.

Examples of the preferred another crosslinking agent (Cl) include hydroxymethylated or alkoxymethylated phenol compounds, alkoxymethylated melamine-based compounds, alkoxymethyl glycoluril-based compounds, and alkoxymethylated urea-based compounds. Examples of the particularly preferred another crosslinking agent (Cl) include a phenol derivative having a molecular weight of 1,200 or less and containing, within the molecule, 3 to 5 benzene rings and a total of two or more hydroxymethyl groups or alkoxymethyl groups, a melamine-formaldehyde derivative having at least two free N-alkoxymethyl groups, and an alkoxymethyl glycoluril derivative.

The alkoxymethyl group is preferably a methoxymethyl group or an ethoxymethyl group.

Among the crosslinking agents, a phenol derivative having a hydroxymethyl group may be obtained by reacting a corresponding phenol compound having no hydroxymethyl group with formaldehyde in the presence of a base catalyst. Also, a phenol derivative having an alkoxymethyl group may be obtained by reacting a corresponding phenol derivative having a hydroxymethyl group with an alcohol in the presence of an acid catalyst.

Among the phenol derivatives synthesized as described above, a phenol derivative having an alkoxymethyl group is particularly preferred in view of the sensitivity and storage stability.

Other preferred examples of the crosslinking agent further include compounds having an N-hydroxymethyl group or an N-alkoxymethyl group, such as alkoxymethylated melamine-based compounds, alkoxymethyl glycoluril-based compounds, and alkoxymethylated urea-based compounds.

Examples of such compounds include hexamethoxymethylmelamine, hexaethoxymethylmelamine, tetramethoxymethyl glycoluril, 1,3-bismethoxymethyl-4,5-bismethoxyethyleneurea, and bismethoxymethylurea, which are disclosed in EP0133216A, DE3634671B and DE3711264B, and EP0212482A.

Among these crosslinking agents, particularly preferred are those illustrated below.

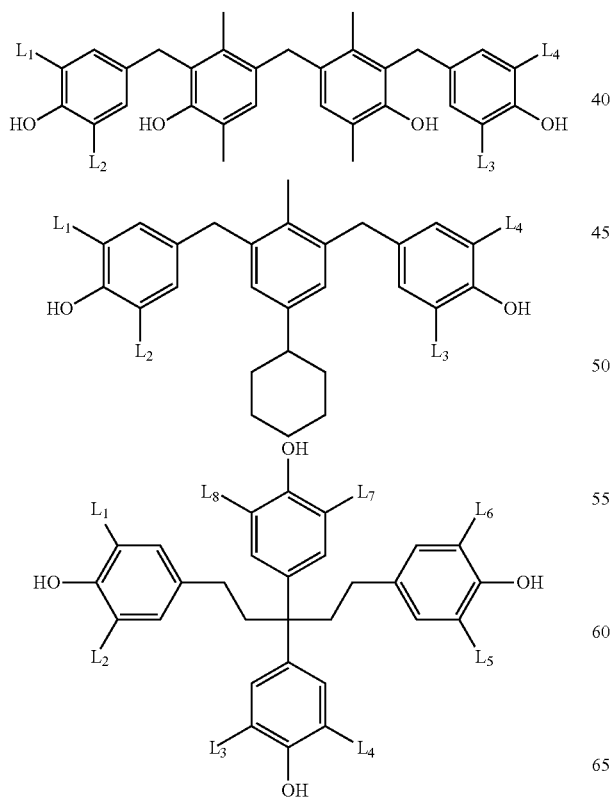

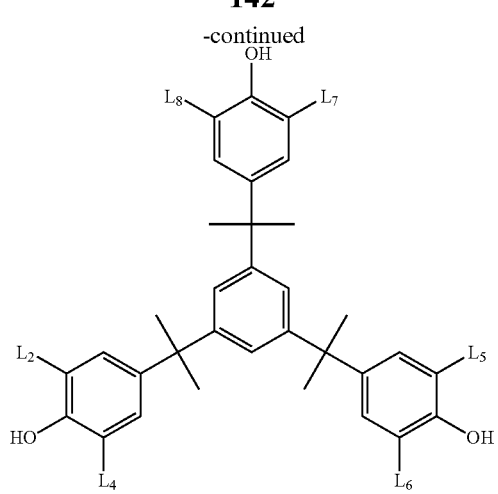

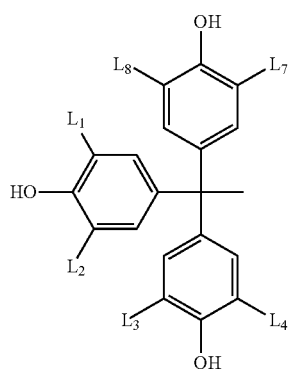

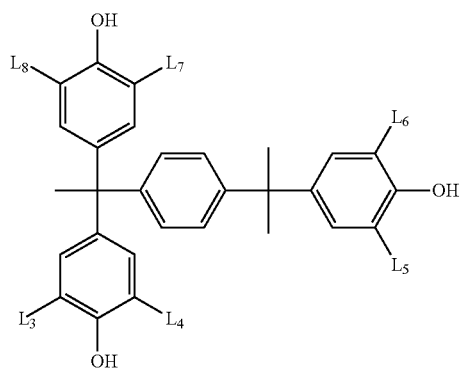

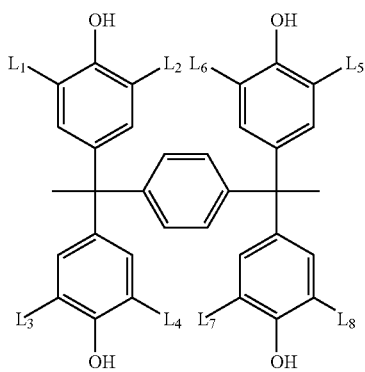

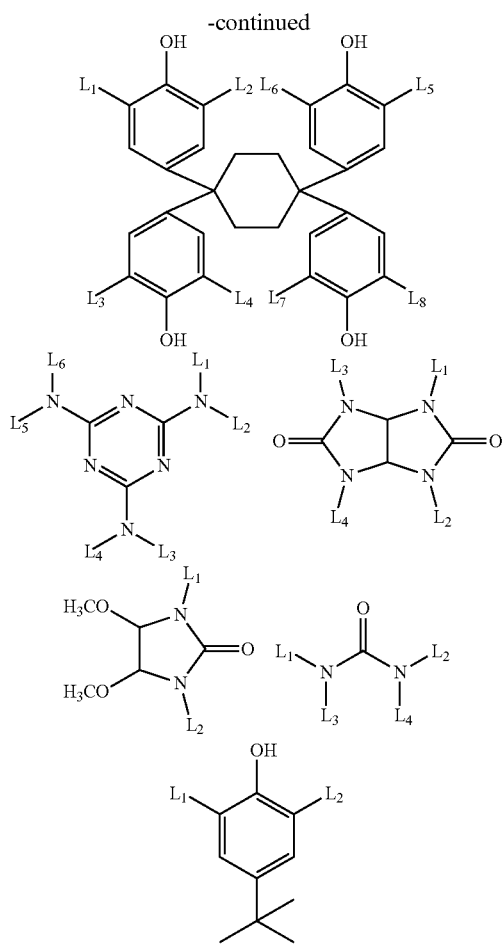

In these formulae, $L_1$ to $L_8$ each independently represent a hydrogen atom, a hydroxymethyl group, a methoxymethyl group, an ethoxymethyl group, or an alkyl group having 1 to 6 carbon atoms.

In the present invention, in the case of using another crosslinking agent (Cl), the another crosslinking agent (Cl) is used preferably in an amount of 3 mass % to 65 mass %, and more preferably 5 mass % to 20 mass %, based on the solid content of the composition of the present invention. When the amount of the entire crosslinking agent added is within the range of 3 mass % to 65 mass %, good storage stability of a resist solution can be maintained while preventing deterioration of the residual film ratio and resolution.

In the present invention, in the case of using another crosslinking agent (Cl), the another crosslinking agent (Cl) may be used alone or in combination of two or more thereof. In view of pattern profile, the another crosslinking agent (Cl) is preferably used in combination of two or more thereof.

For example, in the case where another crosslinking agent, for example, the above-mentioned compound having an N-alkoxymethyl group or the like is used in combination with the phenol derivative, the ratio of the phenol derivative to another crosslinking agent is in a molar ratio of 100/0 to 20/80, preferably 90/10 to 40/60, and more preferably 80/20 to 50/50.

<Basic Compound>

The composition of the present invention preferably contains a basic compound, in addition to the components described above, as an acid scavenger. By using the basic compound, the change of performance with aging from exposure to post bake may be reduced. The basic compound is preferably an organic basic compound, and more specific examples thereof include aliphatic amines, aromatic amines, heterocyclic amines, a nitrogen-containing compound having a carboxyl group, a nitrogen-containing compound having a sulfonyl group, a nitrogen-containing compound having a hydroxyl group, a nitrogen-containing compound having a hydroxyphenyl group, an alcoholic nitrogen-containing compound, amide derivatives, and imide derivatives. An amine oxide compound (preferably having a methyleneoxy unit and/or an ethyleneoxy unit, for example, compounds described in JP2008-102383A) and an ammonium salt (preferably a hydroxide or a carboxylate; more specifically, a tetraalkylammonium hydroxide typified by tetrabutylammonium hydroxide is preferred in view of LER) may also be appropriately used.

Furthermore, a compound whose basicity is increased by the action of an acid may also be used as a kind of the basic compound.

Specific examples of the amines may include tri-n-butylamine, tri-n-pentylamine, tri-n-octylamine, tri-n-decylamine, triisodecylamine, dicyclohexylmethylamine, tetradecylamine, pentadecylamine, hexadecylamine, octadecylamine, didecylamine, methyloctadecylamine, dimethylundecylamine, N,N-dimethyldodecylamine, methyldioctadecylamine, N,N-dibutylaniline, N,N-dihexylaniline, 2,6-diisopropylaniline, 2,4,6-tri(t-butyl)aniline, triethanolamine, N,N-dihydroxyethylaniline, tris(methoxyethoxyethyl)amine, the compounds exemplified in column 3, line 60 et seq. of U.S. Pat. No. 6,040,112A, 2-[2-{2-(2,2-dimethoxy-phenoxyethoxy)ethyl}-bis-(2-methoxyethyl)]-amine, and compounds (C1-1) to (C3-3) exemplified in paragraph "0066" of US2007/0224539A1. Examples of the compound having a nitrogen-containing heterocyclic structure may include 2-phenylbenzimidazole, 2,4,5-triphenylimidazole, N-hydroxyethylpiperidine, bis(1,2,2,6,6-pentamethyl-4-piperidyl) sebacate, 4-dimethylaminopyridine, antipyrine, hydroxyantipyrine, 1,5-diazabicyclo[4.3.0]-nona-5-ene, 1,8-diazabicyclo[5.4.0]-undeca-7-ene, and tetrabutylammonium hydroxide.

In addition, a photodecomposable basic compound (a compound which initially exhibits basicity due to the action of the basic nitrogen atom as a base but decomposes upon irradiation with actinic rays or radiation to generate a zwitterionic compound having a basic nitrogen atom and an organic acid moiety and resulting from their neutralization in the molecule, is reduced in or deprived of the basicity; for example, onium salts described in JP3577743B, JP2001-215689A, JP2001-166476A, and JP2008-102383A), and a photobase generator (for example, compounds described in JP2010-243773A) may also be appropriately used.

Among these basic compounds, an ammonium salt is preferred in view of improving resolution.

In the present invention, the basic compound may be used alone or in combination of two or more thereof.

The content of the basic compound used in the present invention is preferably 0.01 mass % to 10 mass %, more preferably 0.03 mass % to 5 mass %, and particularly preferably 0.05 mass % to 3 mass %, based on the total solid content of the composition of the present invention.

<Surfactant>

The composition of the present invention may further contain a surfactant in order to further improve the coatability. The surfactant is not particularly limited, but examples thereof may include a nonionic surfactant such as polyoxyethylene alkyl ethers, polyoxyethylene alkylallyl ethers, polyoxyethylene-polyoxypropylene block copolymers, sorbitan fatty acid esters, and polyoxyethylene sorbitan fatty acid esters, a fluorine-based surfactant such as MEGAFACE F171 (manufactured by DIC Corporation), FLORAD FC430 (manufactured by Sumitomo 3M Limited), SURFYNOL E1004 (manufactured by Asahi Glass Co., Ltd.), and PF656 and PF6320 manufactured by OMNOVA Solutions Inc., and an organosiloxane polymer.

In the case where the composition of the present invention contains a surfactant, the amount of the surfactant used is preferably 0.0001 mass % to 2 mass %, and more preferably 0.0005 mass % to 1 mass %, based on the total amount of the resist composition (excluding the solvent).

<Organic Carboxylic Acid>

The composition of the present invention preferably contains an organic carboxylic compound, in addition to the components described above. Examples of the organic carboxylic compound may include an aliphatic carboxylic acid, an alicyclic carboxylic acid, an unsaturated aliphatic carboxylic acid, an oxycarboxylic acid, an alkoxycarboxylic acid, a ketocarboxylic acid, a benzoic acid derivative, a phthalic acid, a terephthalic acid, an isophthalic acid, a 2-naphthoic acid, a 1-hydroxy-2-naphthoic acid, and a 2-hydroxy-3-naphthoic acid. However, when the electron beam exposure is carried out in vacuum, the organic carboxylic acid may vaporize from the resist film surface to contaminate the inside of a lithography chamber. Thus, a preferred compound is an aromatic organic carboxylic acid, and above all, for example, a benzoic acid, a 1-hydroxy-2-naphthoic acid, and a 2-hydroxy-3-naphthoic acid are preferred.

The blending amount of the organic carboxylic acid is preferably in the range of 0.01 parts by mass to 10 parts by mass, more preferably 0.01 parts by mass to 5 parts by mass, and still more preferably 0.01 parts by mass to 3 parts by mass, based on 100 parts by mass of the resin (A).

The composition of the present invention, as necessary, may further contain a dye, a plasticizer, and an acid amplifier (described in WO95/29968A, WO98/24000A, JP1996-305262A (JP-H08-305262A), JP1997-34106A (JP-H09-34106A), JP1996-248561A (JP-H08-248561A), JP1996-503082A (JP-H08-503082A), U.S. Pat. No. 5,445,917A, JP1996-503081A (JP-H08-503081A), U.S. Pat. No. 5,534,393A, U.S. Pat. No. 5,395,736A, U.S. Pat. No. 5,741,630A, U.S. Pat. No. 5,334,489A, U.S. Pat. No. 5,582,956A, U.S. Pat. No. 5,578,424A, U.S. Pat. No. 5,453,345A, EP665960B, EP757628B, EP665961B, U.S. Pat. No. 5,667,943A, JP1998-1508A (JP-H10-1508A), JP1998-282642A (JP-H10-282642A), JP1997-512498A (JP-H09-512498A), JP2000-62337A, JP2005-17730A, and JP2008-209889A). As for these compounds, respective compounds described in JP2008-268935A may be exemplified.

<Onium Carboxylate>

The composition of the present invention may contain an onium carboxylate. Examples of the onium carboxylate may include sulfonium carboxylate, iodonium carboxylate, and ammonium carboxylate. Particularly, the onium carboxylate is preferably iodonium carboxylate or sulfonium carboxylate. In the present invention, it is more preferred that the carboxylate residue of the onium carboxylate does not contain an aromatic group and a carbon-carbon double bond. The anion moiety is particularly preferably a linear or branched, monocyclic or polycyclic alkylcarboxylate anion having 1 to 30 carbon atoms, and more preferably the carboxylate anion above in which the alkyl group is partially or entirely fluorine-substituted. Also, the alkyl chain may contain an oxygen atom. Accordingly, the transparency to light at 220 nm or less is ensured, and thus the sensitivity and resolution are enhanced, and the iso/dense bias and exposure margin are improved.

<Hydrophobic Resin>

The actinic ray-sensitive or radiation-sensitive resin composition of the present invention may further contain a hydrophobic resin (HR), in addition to the above-mentioned resin (A). Due to the addition of such a resin, the effect of rendering a pattern close to a rectangular shape, and the effect of suppressing outgassing can be expected. In addition, it is also preferably used in the case where liquid (such as pure water) having a higher refractive index than that of air is filled between a photosensitive film and a lens to perform exposure, that is, in the case where immersion exposure is carried out.

The hydrophobic resin (HR) preferably contains a fluorine atom-containing group, a silicon atom-containing group or a hydrocarbon group having 5 or more carbon atoms so as to be unevenly distributed on the film surface. Such a group may be present in the main chain of the resin or may be substituted on the side chain thereof.

Specific examples of the hydrophobic resin (HR) include the resins described in paragraphs "0240" to "0247" of JP2010-175858A, and the resins described in paragraphs "0349" to "0354" of JP2013-80006A.

<Solvent>

Preferred examples of the solvent used for the composition of the present invention include ethylene glycol monoethyl ether acetate, cyclohexanone, 2-heptanone, propylene glycol monomethyl ether (PGME, another name: 1-methoxy-2-propanol), propylene glycol monomethyl ether acetate (PGMEA, another name: 1-methoxy-2-acetoxypropane), propylene glycol monomethyl ether propionate, propylene glycol monoethyl ether acetate, methyl 3-methoxypropionate, ethyl 3-ethoxypropionate, methyl β-methoxyisobutyrate, ethyl butyrate, propyl butyrate, methyl isobutyl ketone, ethyl acetate, isoamyl acetate, ethyl lactate, toluene, xylene, cyclohexyl acetate, diacetone alcohol, N-methylpyrrolidone, N,N-dimethylformamide, γ-butyrolactone, N,N-dimethylacetamide, propylene carbonate, and ethylene carbonate. These solvents may be used alone or in combination thereof.

The solid component of the composition of the present invention is dissolved in the solvent, and is dissolved at a solid content concentration of preferably 1 mass % to 40 mass %, more preferably 1 mass % to 30 mass %, and still more preferably 3 mass % to 20 mass %.

The present invention also relates to an actinic ray-sensitive or radiation-sensitive film formed by the composition of the present invention, and such an actinic ray-sensitive or radiation-sensitive film is formed, for example, by coating the actinic ray-sensitive or radiation-sensitive resin composition on a support such as a substrate. The thickness of the actinic ray-sensitive or radiation-sensitive film is preferably 0.02 μm to 0.1 μm. As for the method of coating the composition on the substrate, an appropriate coating method such as spin coating, roll coating, flow coating, dip coating, spray coating, and doctor coating may be used. The spin-coating is preferred, and the spinning speed is preferably 1,000 rpm to 3,000 rpm. The coating film is pre-baked at 60° C. to 150° C. for 1 minute to 20 minutes, and preferably at 80° C. to 120° C. for 1 minute to 10 minutes to form a thin film.

As for a material which constitutes a substrate to be processed and its outermost layer, for example, in the case of a wafer for a semiconductor, a silicon wafer may be used, and as an example of a material used as the outermost layer, Si, $SiO_2$, SiN, SiON, TiN, WSi, BPSG, SOG, and an organic antireflection film may be exemplified.

Further, the present invention also relates to mask blank provided with the actinic ray-sensitive or radiation-sensitive film, on which the actinic ray-sensitive or radiation-sensitive resin composition obtained as described above has been coated.

The resist-coated mask blank has mask blank and a resist film formed on the mask blank. The photomask blank has a substrate, and is used, for example, for manufacturing a photomask. The substrate for photomask blank is, for example, a transparent substrate such as quartz and calcium fluoride. In general, a light-shielding film, an antireflection film, further a phase shift film, and additionally a required functional film, such as an etching stopper film and an etching mask film, are stacked on the substrate. As for the material of the functional film, a film containing silicon or a transition metal such as chromium, molybdenum, zirconium, tantalum, tungsten, titanium, and niobium is stacked. As the material used for the outermost layer, a material containing, as a main constituent component, a material which contains silicon or contains silicon and oxygen and/or nitrogen; a silicon compound material containing, as a main constituent component, the material described above which further contains a transition metal; and a transition metal compound material containing, as a main constituent component, a material which contains a transition metal, particularly, one or more transition metals selected from chromium, molybdenum, zirconium, tantalum, tungsten, titanium, and niobium, or further contains one or more elements selected from oxygen, nitrogen, and carbon are further exemplified.

The light-shielding film may have a single-layer structure, but more preferably has a multilayer structure where a plurality of materials are applied one on another. In the case of a multilayer structure, the film thickness per layer is not particularly limited, but is preferably 5 nm to 100 nm, and more preferably 10 nm to 80 nm. The thickness of the entire light-shielding film is not particularly limited, but is preferably 5 nm to 200 nm, and more preferably 10 nm to 150 nm.

In the case where the pattern formation is carried out using an actinic ray-sensitive or radiation-sensitive resin composition on the photomask blank having the material containing chromium and oxygen or nitrogen in the outermost layer thereof among the materials described above, a so-called undercut shape having a waisted shape near the substrate is likely to be formed in general. However, in the case of using the present invention, the undercut problem may be improved as compared with the conventional mask blank.

Subsequently, this actinic ray-sensitive or radiation-sensitive film is irradiated with actinic rays or radiation (for example, an electron beam), then preferably baked (usually at 80° C. to 150° C., more preferably 90° C. to 130° C., usually for 1 minute to 20 minutes, preferably for 1 minute to 10 minutes), and subsequently developed. In this manner, a good pattern may be obtained. A photomask is prepared using this pattern as a mask. Further, after subjecting to appropriate etching, ion implantation, or the like, mask blank may also be used to produce, for example, a semiconductor fine circuit and an imprint mold structure or a photomask.

Meanwhile, the process for preparing an imprint mold by using the composition of the present invention is described, for example, in JP4109085B, JP2008-162101A, and "Basic and Technology Expansion-Application Development of Nanoimprint-Substrate Technology of Nanoimprint and Latest Technology Expansion-edited: Yoshihiko Hirai (Frontier Publishing)."

The usage form of the composition of the present invention and the resist pattern forming method will be subsequently described.

The present invention also relates to a resist pattern forming method which includes exposing the actinic ray-sensitive or radiation-sensitive resist film or the actinic ray-sensitive or radiation-sensitive resist-coated mask blank, and developing the exposed resist film or the resist-coated mask blank. In the present invention, the exposure is preferably carried out using an electron beam or extreme ultraviolet light.

In the manufacturing of a precision integrated circuit element, at the exposure on the resist film (a pattern forming step), first, it is preferred to perform patternwise irradiation of an electron beam or extreme ultraviolet (EUV) light on the actinic ray-sensitive or radiation-sensitive film of the present invention. The exposure is carried out at an exposure dose ranging from about 0.1 $\mu C/cm^2$ to 20 $\mu C/cm^2$ and preferably about 3 $\mu C/cm^2$ to 10 $\mu C/cm^2$ in a case of an electron beam, and an exposure dose ranging from about 0.1 $mJ/cm^2$ to 20 $mJ/cm^2$ and preferably about 3 $mJ/cm^2$ to 15 $mJ/cm^2$ in a case of EUV light. Then, on a hot plate, the film is subjected to post-exposure baking (PEB) at 60° C. to 150° C. for 1 minute to 20 minutes, preferably at 80° C. to 120° C. for 1 minute to 10 minutes, and then is developed, rinsed and dried to form a resist pattern. The development is carried out using an aqueous alkali solution such as tetramethylammonium hydroxide (TMAH) or tetrabutylammonium hydroxide (TBAH) (preferably 0.1 mass % to 5 mass %, and more preferably 2 mass % to 3 mass %) as for the developer through a conventional method such as a dip method, a puddle method, or a spraying method for preferably 0.1 minutes to 3 minutes, and more preferably 0.5 minutes to 2 minutes. Alcohols and/or surfactant may be added in an appropriate amount to the alkali developer. The pH of the alkali developer is generally 10.0 to 15.0. Particularly, an aqueous solution including 2.38 mass % of tetramethylammonium hydroxide is preferred. As the alkali developer, an aqueous solution of tetraethylammonium hydroxide, tetrapropylammonium hydroxide, benzyltrimethylammonium hydroxide, or the like is also preferably used.

If necessary, alcohols and/or a surfactant may be added in an appropriate amount to the developer.

The surfactant is not particularly limited but, for example, ionic or nonionic fluorine-based and/or silicon-based surfactant may be used. Examples of the fluorine and/or silicon-based surfactant may include surfactants described in JP1987-36663A (JP-S62-36663A), JP1986-226746A (JP-S61-226746A), JP1986-226745A (JP-S61-226745A), JP1987-170950A (JP-S62-170950A), JP1988-34540A (JP-S63-34540A), JP1995-230165A (JP-H07-230165A), JP1996-62834A (JP-H08-62834A), JP1997-54432A (JP-H09-54432A), and JP1997-5988A (JP-H09-5988A), and U.S. Pat. No. 5,405,720A, U.S. Pat. No. 5,360,692A, U.S. Pat. No. 5,529,881A, U.S. Pat. No. 5,296,330A, U.S. Pat. No. 5,436,098A, U.S. Pat. No. 5,576,143A, U.S. Pat. No. 5,294,511A, and U.S. Pat. No. 5,824,451A, and a nonionic surfactant is preferred. The nonionic surfactant is not particularly limited, but a fluorine-based surfactant or a silicon-based surfactant is more preferably used.

The amount of the surfactant to be used is usually 0.001 mass % to 5 mass %, preferably 0.005 mass % to 2 mass %, and more preferably 0.01 mass % to 0.5 mass %, based on the total amount of the developer.

As for the developing method, it is possible to apply, for example, a method of dipping a substrate in a bath filled with a developer for a predetermined time (a dipping method), a method of heaping up a developer on a substrate surface by a surface tension and keeping the substrate still for a fixed time, thereby performing development (a puddle method), a method of spraying a developer on a substrate surface (a spraying method), and a method of continuously ejecting a developer on a substrate spinning at a constant speed while scanning a developer ejecting nozzle at a constant rate (a dynamic dispense method).

In the case where the aforementioned various developing methods include a step of ejecting a developer toward a resist film from a development nozzle of a developing apparatus, the ejection pressure of the ejected developer (the flow rate per unit area of the ejected developer) is preferably 2 mL/sec/mm$^2$ or less, more preferably 1.5 mL/sec/mm$^2$ or less, and still more preferably 1 mL/sec/mm$^2$ or less. The flow rate has no particular lower limit, but is preferably 0.2 mL/sec/mm$^2$ or more in consideration of throughput.

By setting the ejection pressure of the ejected developer to fall within the above-described range, pattern defects resulting from the resist residue after development may be significantly reduced.

Details on the mechanism are not clear, but it is thought that it is because by setting the ejection pressure to fall within the above-described range, the pressure imposed on the resist film by the developer is decreased and the resist film/resist pattern are suppressed from being inadvertently cut or collapsing.

Meanwhile, the ejection pressure (mL/sec/mm$^2$) of the developer is the value at the outlet of the development nozzle in the developing apparatus.

Examples of the method for adjusting the ejection pressure of the developer may include a method of adjusting the ejection pressure by a pump or the like, a method of supplying a developer from a pressurized tank and adjusting the pressure to change the ejection pressure and the like.

In addition, after the step of performing development using a developer, a step of stopping the development while replacing the solvent with another solvent may be carried out.

As for the rinsing liquid in the rinse treatment carried out after the alkali development, pure water is used, and an appropriate amount of a surfactant may be added to be used therewith.

In this manner, the actinic ray-sensitive or radiation-sensitive film at an unexposed area is dissolved, and an exposed area is hardly dissolved in the developer due to crosslinking of the resin, whereby a desired pattern is formed on the substrate.

The composition of the present invention may also be used in a process of obtaining a negative pattern by means of development using a developer composed of an organic solvent as a main ingredient. As such a process, it is possible to use a process described, for example, in JP2010-217884A.

As the organic developer, use can be made of not only a polar solvent, such as an ester solvent (butyl acetate, ethyl acetate, etc.), a ketone solvent (2-heptanone, cyclohexanone, or the like), an alcohol solvent, an amide solvent, or an ether solvent, but also a hydrocarbon solvent. The content of water in the organic developer as a whole is preferably less than 10 mass %. More preferably, the organic developer contains substantially no trace of water. In addition, the organic developer may contain a basic compound. Specifically, those compounds listed as a basic compound that can be contained in the resist composition of the present invention are illustrated. Furthermore, a process with combination of alkali development and development with an organic developer may be carried out.

The present invention also relates to a photomask obtained by exposing a resist-coated mask blank and developing the exposed mask blank. As for the exposure and development, the steps described above are applied. The photomask is suitably used for manufacturing a semiconductor.

The photomask in the present invention may be a light transmission type mask used in, for example, ArF excimer laser, or a light reflective mask used in a reflective system lithography using EUV light as a light source.

Further, the present invention also relates to a method for manufacturing a semiconductor device, which includes the above-described resist pattern forming method of the present invention, and a semiconductor device manufactured by such a manufacturing method.

The semiconductor device of the present invention is suitably mounted in electrical and electronic devices (for example, home appliances, OA/media-related devices, optical devices, and communication devices).

EXAMPLES

Hereinafter, the present invention will be described in more detail with reference to examples, but is not limited thereto.

[Synthesis Example 1] Synthesis of Crosslinking Agent (C-1)

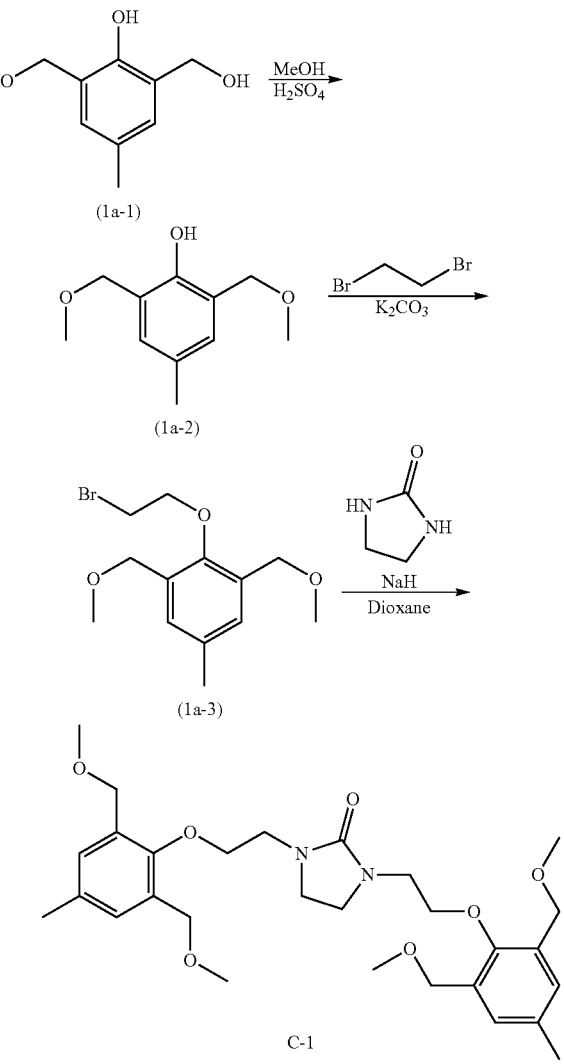

(Synthesis of Compound (1a-2))

35 g of 2,6-bis(hydroxymethyl)-p-cresol (1a-1) manufactured by Tokyo Chemical Industry Co., Ltd. was dissolved in 400 mL of methanol. 3.6 g of a 45% sulfuric acid aqueous solution was added dropwise thereto, followed by stirring at 50° C. for 5 hours. After the reaction was completed, the reaction solution was returned to room temperature. Then, sodium carbonate was added while stirring the reaction solution in an ice bath. The reaction solution was filtered through Celite. The filtrate was concentrated and then transferred to a separating funnel. 200 mL of distilled water and 200 mL of ethyl acetate were added thereto, followed by extraction, and the aqueous layer was removed. Thereafter, the organic layer was washed five times with 200 mL of distilled water. The organic layer was concentrated to give 37 g of a compound (1a-2).

$^1$H-NMR (CDCl$_3$: ppm): 2.25 (3H, s), 3.43 (6H, s), 4.56 (4H, s), 6.92 (2H, s).

(Synthesis of Compound (1a-3))

20 g of the compound (1a-2) synthesized above was dissolved in 200 mL of dimethylsulfoxide. 38.3 g of dibromoethane and 16.9 g of potassium carbonate were added thereto, followed by stirring at 40° C. for 4 hours. After the reaction was completed, the reaction solution was returned to room temperature, and 100 mL of ethyl acetate and 100 mL of distilled water were added thereto. The reaction solution was transferred to a separating funnel, and the aqueous layer was removed. Thereafter, the organic layer was washed five times with 200 mL of distilled water, and the organic layer was concentrated. The concentrate was purified by silica gel column chromatography (developing solvent: hexane/ethyl acetate=20/1). After the solvent was distilled off under reduced pressure, the concentrate was dried in vacuo to give 24.7 g of a compound (1a-3).

$^1$H-NMR (CDCl$_3$: ppm): 2.33 (3H, s), 3.70 (2H, t), 4.27 (2H, t), 4.50 (4H, s), 7.19 (2H, s).

(Synthesis of Crosslinking Agent (C-1))

To 0.5 g of 2-imidazolidinone were added 30 mL of 1,4-dioxane and 1.7 g of 50% NaH, followed by stirring at 60° C. for 1 hour. After the mixture was allowed to cool to room temperature, 5 g of the compound (1a-3) was added, followed by stirring at 100° C. for 12 hours. The mixture was allowed to cool to room temperature and filtered, and the filtrate was concentrated. Silica gel column chromatography purification was carried out to give 300 mg of a crosslinking agent (C-1). FIG. 1 shows a $^1$H-NMR spectrum (acetone-d6) of the compound (C-1).

[Synthesis Example 2] Synthesis of Crosslinking Agent (C-5)

Figure 2:
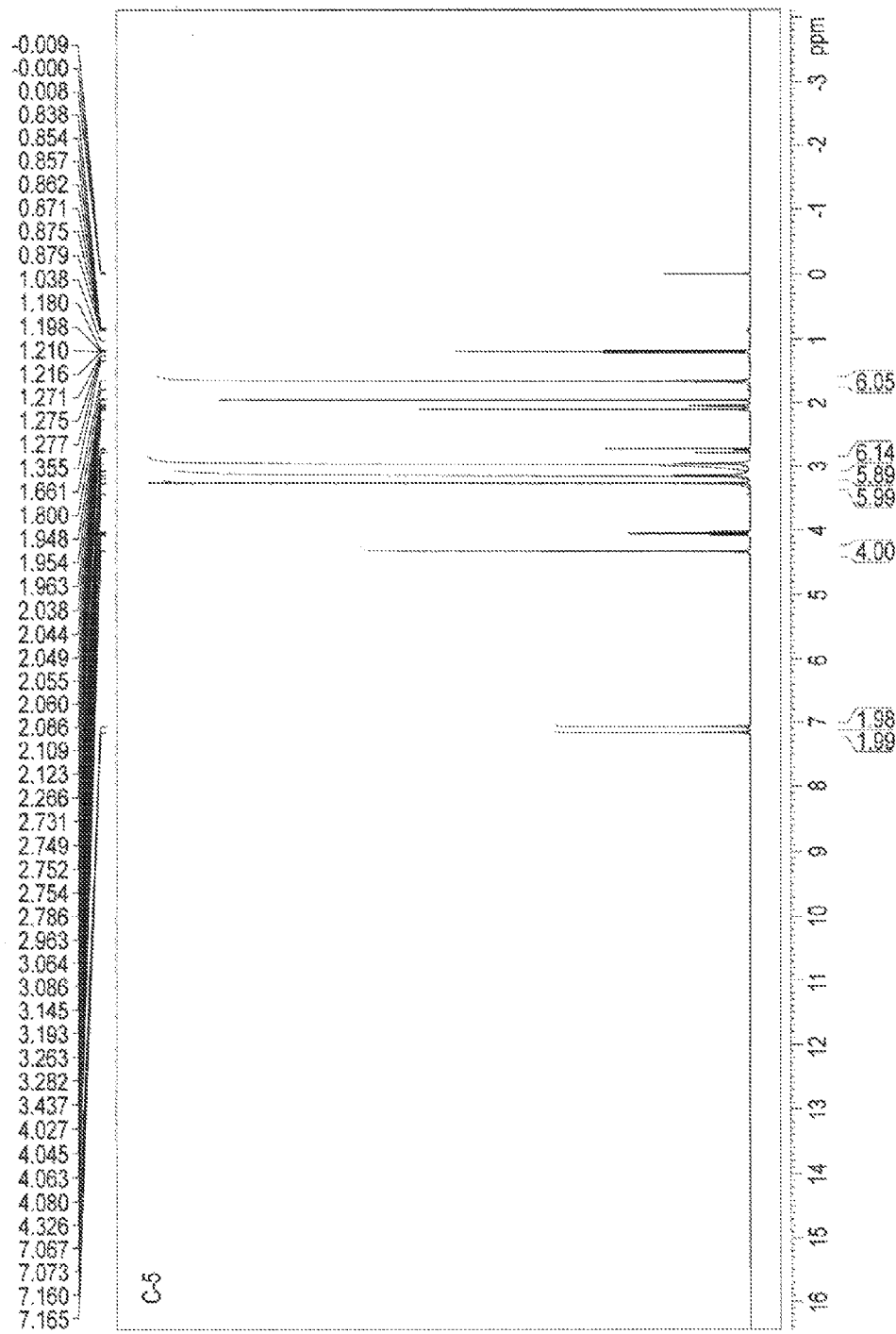
FIG. 2 shows an NMR spectrum ($^1$HNMR, acetone-d6) of a crosslinking agent (C-5) synthesized in Examples.

To 5 g of a compound (C-5A) were added 30 mL of acetonitrile and 6 g of potassium carbonate. 3.4 g of a compound (C-5B) was added dropwise thereto at room temperature. The mixture was warmed to 60° C. and stirred for 1 hour. To this mixture were added 10 mL of an aqueous ammonium chloride and 100 mL of ethyl acetate, and the organic layer was collected. After extraction from the aqueous layer with 50 mL of ethyl acetate, the organic layer was combined and the solvent was distilled off to give an extract. The extract was re-dissolved in 5 mL of ethyl acetate, and was cooled to 0° C. to carry out re-crystallization, thereby affording 6 g of a crosslinking agent (C-5). FIG. 2 shows a $^1$H-NMR spectrum (acetone-d6) of the compound (C-5).

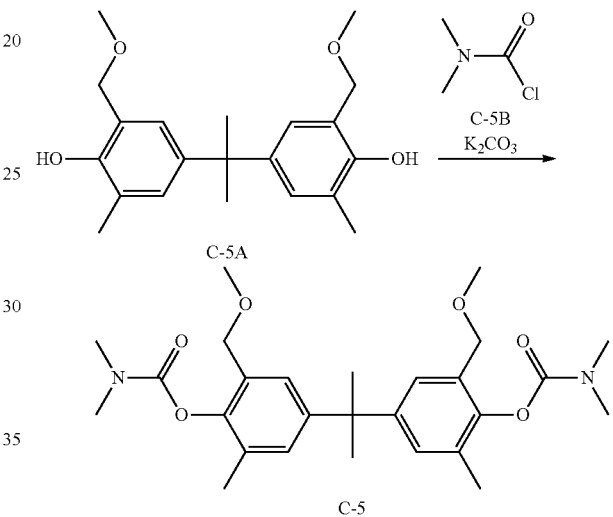

The below-described crosslinking agents other than the above-mentioned crosslinking agents were also synthesized in the same manner as the above-described synthesis method.

<Crosslinking Agent>

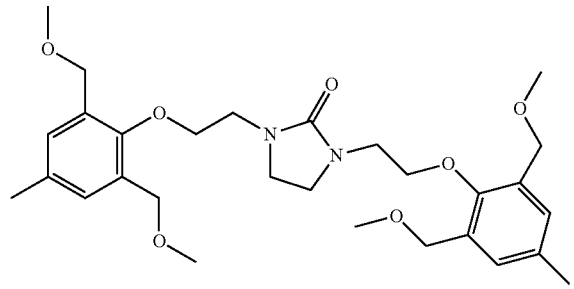

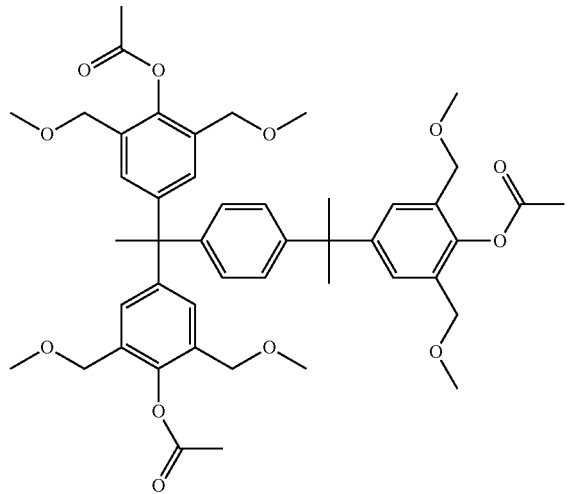

-continued
C-3
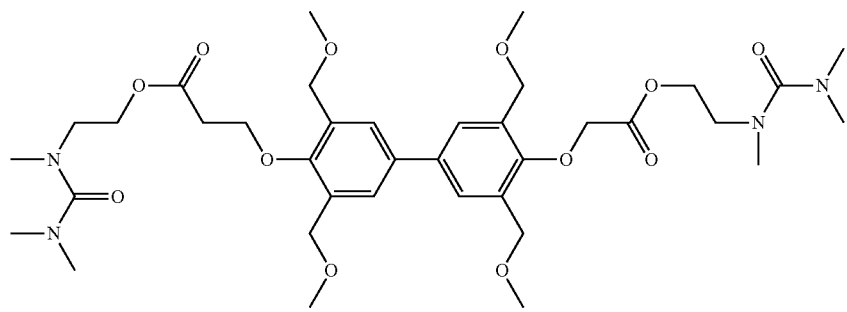
C-4
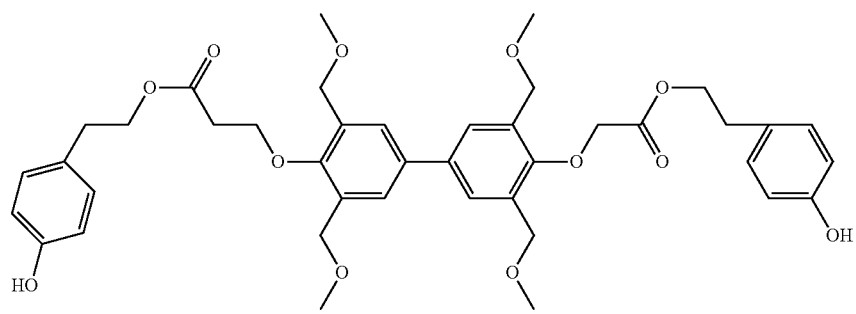
C-5
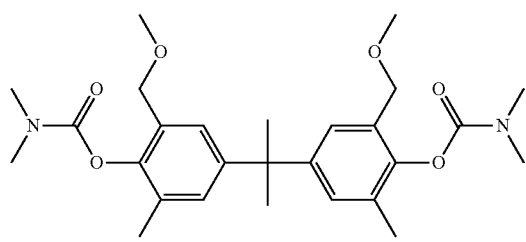
C-6
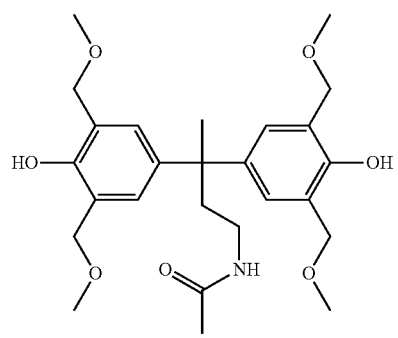
C-7
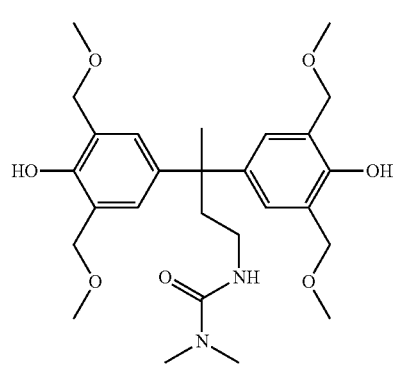
C-8
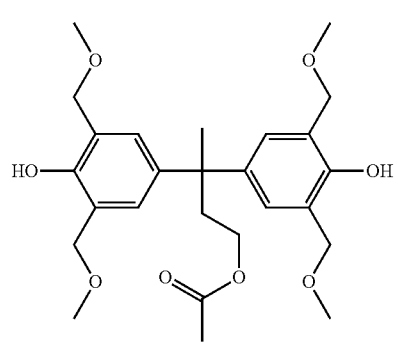
C-9
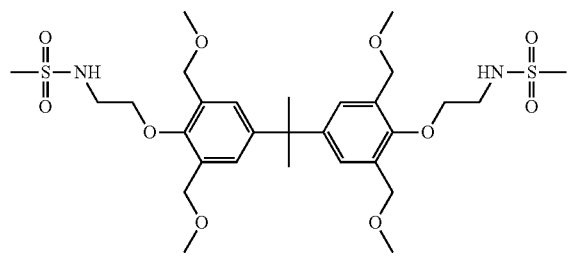
C-10
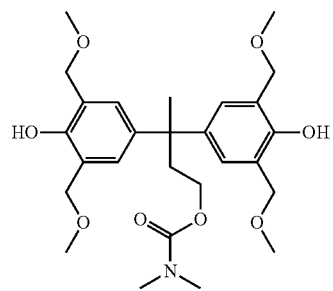

-continued
C-11
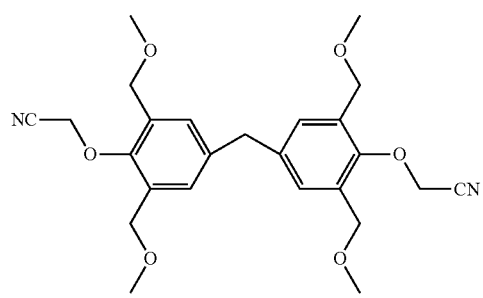
C-12
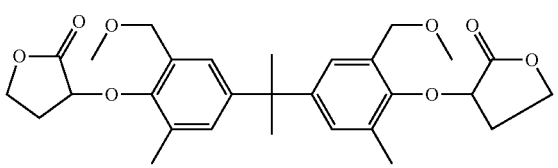
C-13
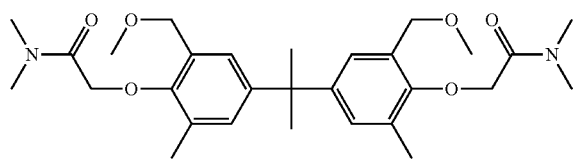
C-14
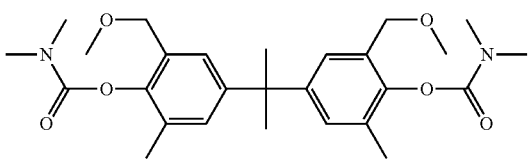
C-15
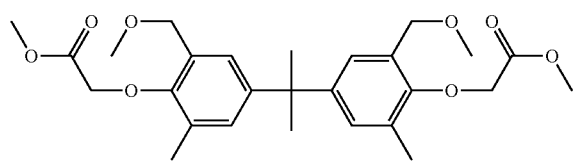
C-16
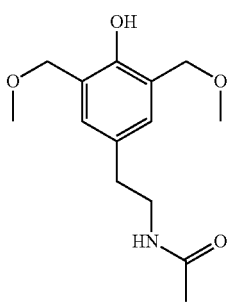
C-17
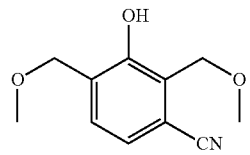
C-18
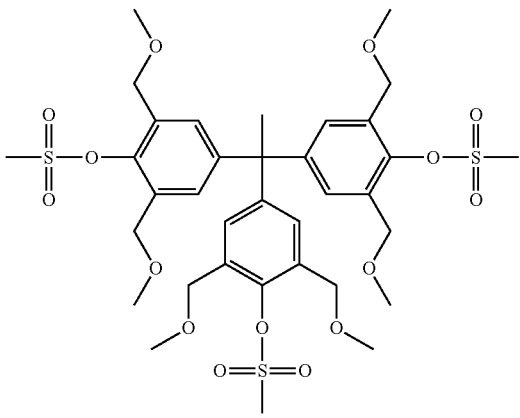
C-19
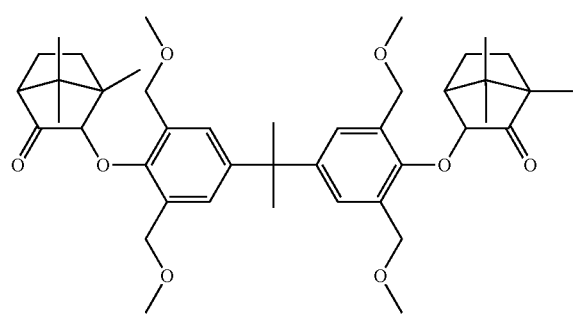
CL-1
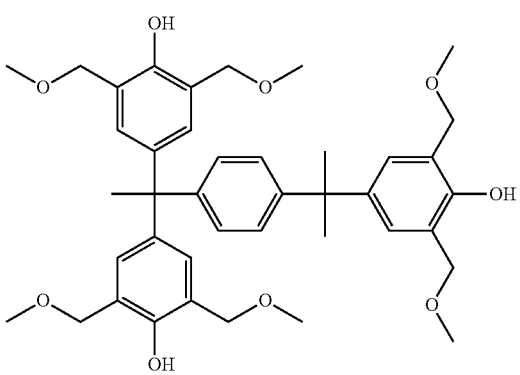

<Resin>

Resins (A-1) to (A-10) given below were used as the resin (A). The composition ratio (molar ratio), weight average molecular weight Mw, and polydispersity Mw/Mn are given therewith. Here, the composition ratio was calculated by $^{13}$C-NMR measurement. In addition, the weight average molecular weight (Mw: in terms of polystyrene), number average molecular weight (Mn: in terms of polystyrene), and polydispersity (Mw/Mn, also referred to as "PDI") of each resin were calculated by GPC (solvent: N-methylpyrrolidone (NMP)) measurement. These results are shown in the following chemical formulae. Further, a resin (RA-1) according to the method described in Examples of JP2009-37201A was used for comparison.

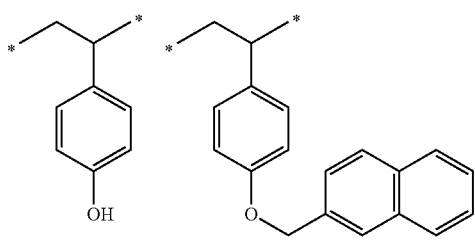

A-1

Composition ratio  85/15
Mw  10000
PDI  1.25

A-2

Composition ratio  90/10
Mw  3500
PDI  1.10

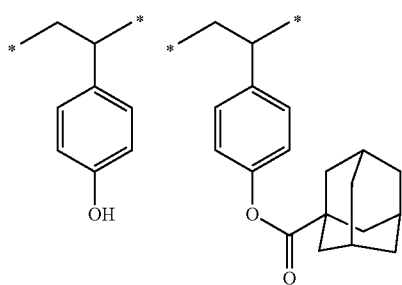

A-3

Mw  8000
PDI  1.05

A-4

Mw  4200
PDI  1.03

-continued

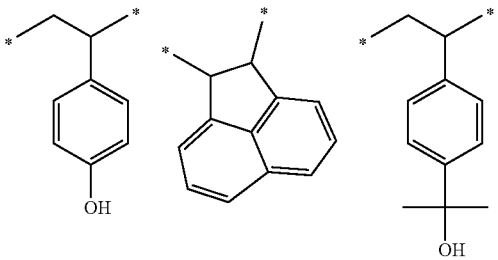

A-5

Composition ratio  60/10/30
Mw  3500
PDI  1.58

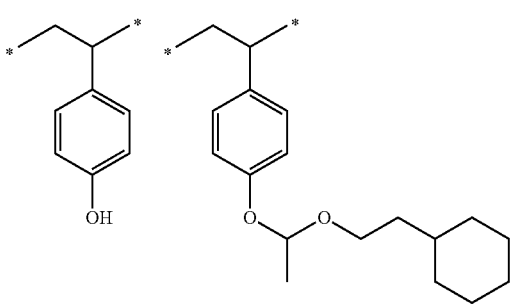

A-6

Composition ratio  91/9
Mw  3800
PDI  1.12

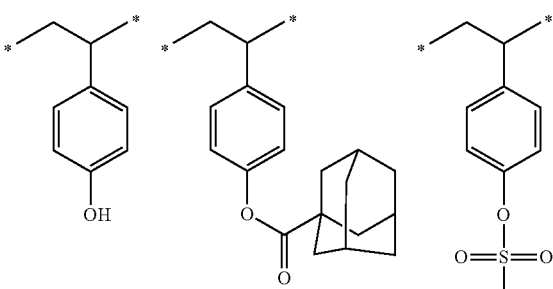

A-7

Composition ratio  85/10/5
Mw  6200
PDI  1.30

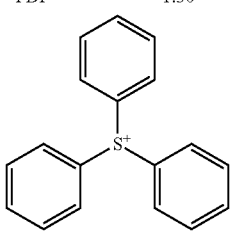

-continued
A-8
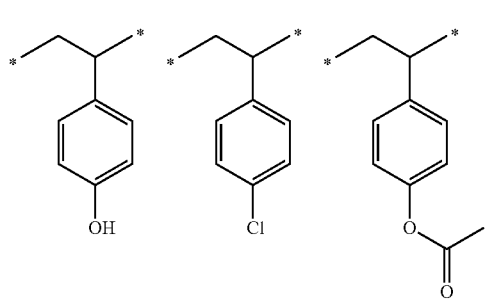
Composition ratio 75/12/13
Mw 9600
PDI 1.46
A-9
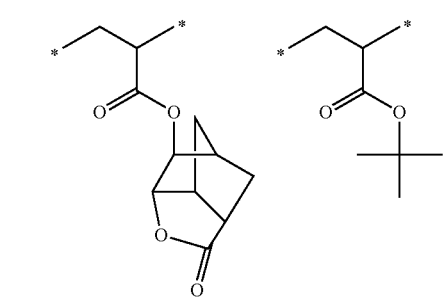
Composition ratio 40/60
Mw 18000
PDI 1.78
A-10
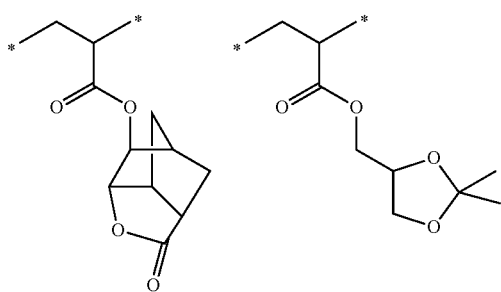
Composition ratio 50/50
Mw 16000
PDI 1.69
RA-1
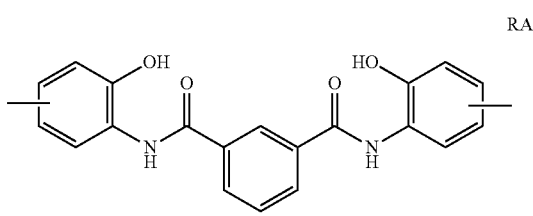
<Acid Generator>
Any one of compounds B-1 to B-6, and RB-1 shown below was used as the acid generator.
B-1
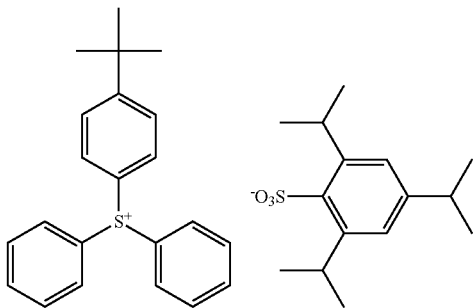
303 Å$^3$
B-2
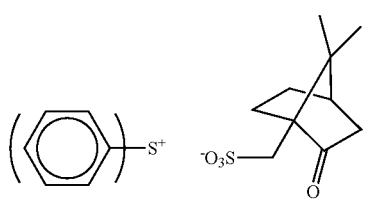
216 Å$^3$
B-3
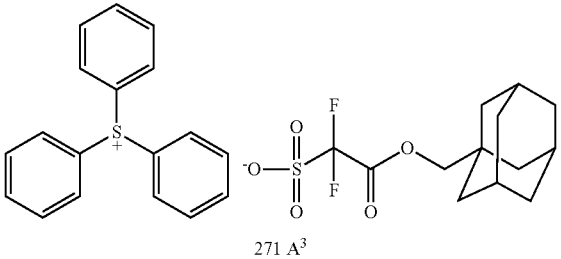
271 Å$^3$
B-4
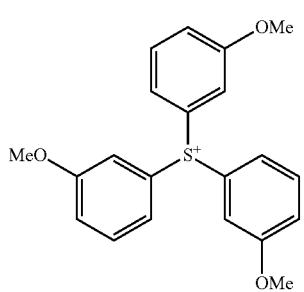
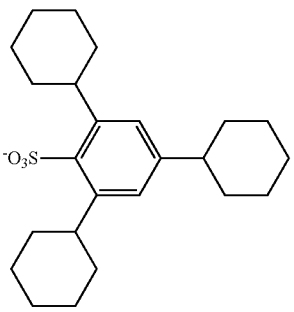
437 Å$^3$ B-5
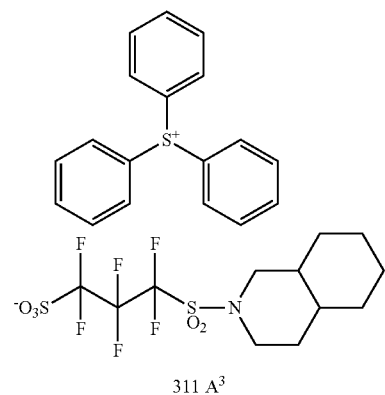
311 Å³
B-6
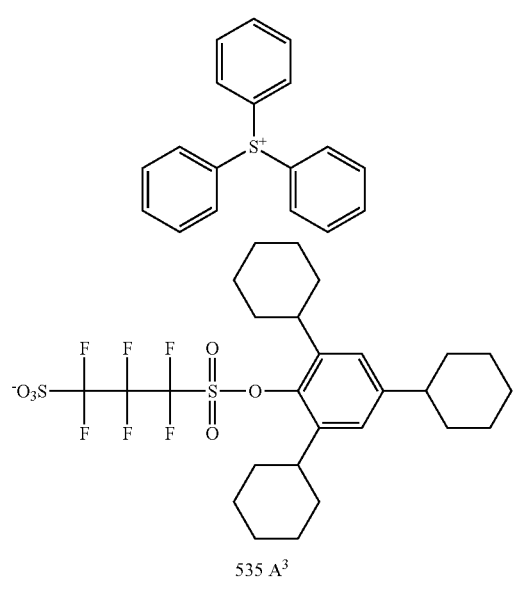
535 Å³
RB-1
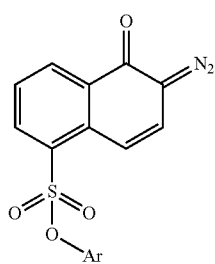
<Solvent>
The following compounds were used as the solvent.
S1: Propylene glycol monomethyl ether acetate
S2: Propylene glycol monomethyl ether
S3: Methyl lactate
S4: Cyclohexanone
<Basic Compound>
The following compounds were used as the basic compound.
N-1: Tetrabutylammonium hydroxide
N-3: Tri(n-octyl)amine
N-4: 2,4,5-Triphenyl imidazole
N-2
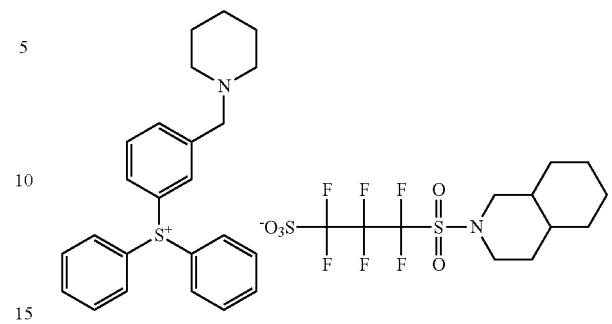
N-5
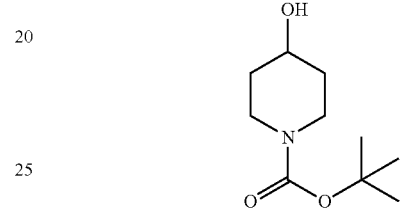
N-6
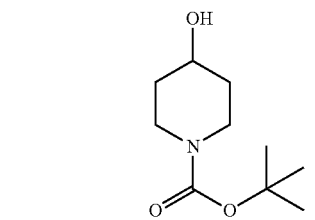
N-7
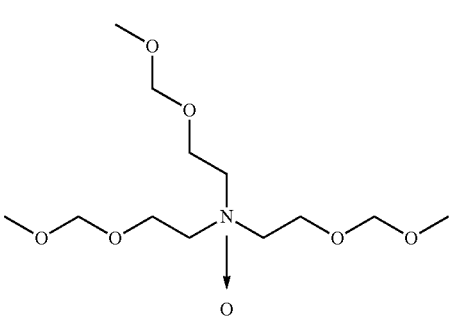
N-8
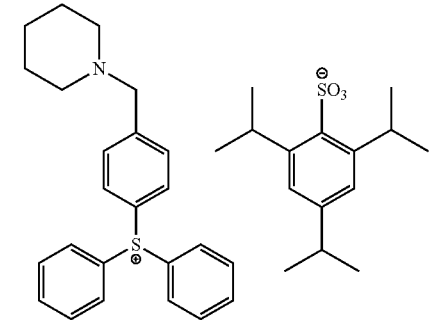

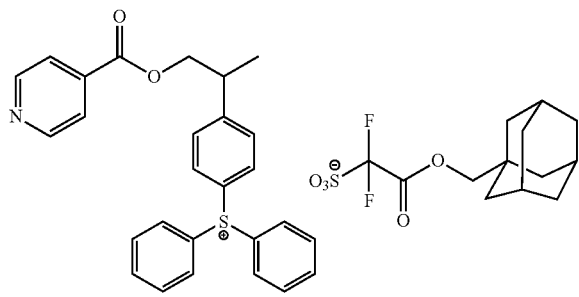

N-9

<Hydrophobic Resin>

Resins (X-1) and (X-2) given below were used as the hydrophobic resin. The composition ratio, weight average molecular weight (Mw: in terms of polystyrene), number average molecular weight (Mn: in terms of polystyrene), and polydispersity (Mw/Mn, also referred to as "PDI") of each resin were calculated in the same manner as in the resin (A).

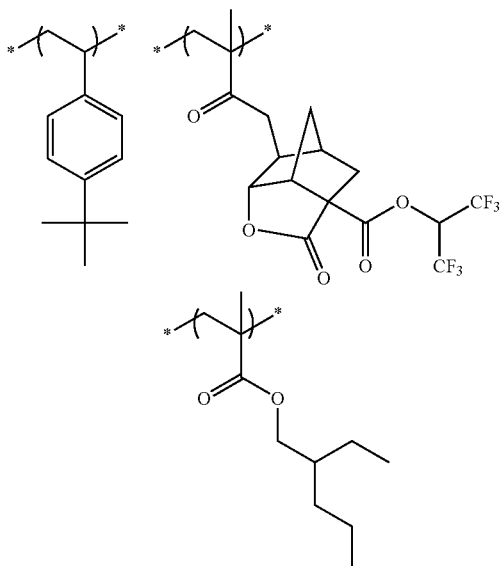

X-1

Composition ratio 15/83/2
Mw 15000
PDI 1.23

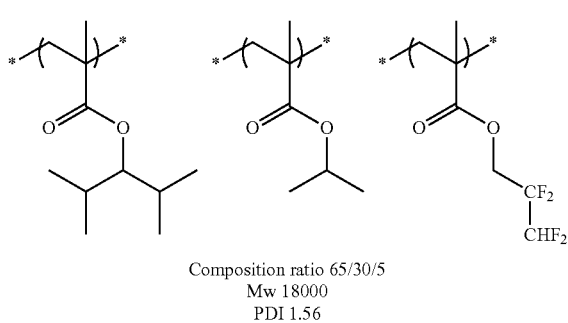

X-2

Composition ratio 65/30/5
Mw 18000
PDI 1.56

<Developer>
SG-1: Methyl amyl ketone
SG-2: Butyl acetate
SG-3: Aqueous solution of 2.38 mass % tetramethylammonium hydroxide <Rinsing Solution>

The following compounds were used as the rinsing solution.
SR-1: Methyl isobutyl carbinol
SR-2: Pure water

[Preparation of Support]

A Cr oxide-deposited 6-inch wafer (a wafer subjected to a treatment of forming a shielding film, which is used for conventional photomask blank) was prepared.

[Preparation of Resist Solution]

(Resist solution in Example 1)

| | |
|---|---|
| Resin (A-1) | 0.55 g |
| Acid generator (B-1) | 0.11 g |
| Crosslinking agent (C-1) | 0.16 g |
| Tetrabutylammonium hydroxide (basic compound N-1) | 0.002 g |
| 2-Hydroxy-3-naphthoic acid (organic carboxylic acid) | 0.012 g |
| Surfactant PF6320 (manufactured by OMNOVA Solutions Inc.) | 0.001 g |
| Propylene glycol monomethyl ether acetate (solvent S1) | 4.0 g |
| Propylene glycol monomethyl ether (solvent S2) | 5.0 g |

The solution of formulation above was microfiltered through a polytetrafluoroethylene filter having a pore size of 0.03 μm to obtain a resist coating solution.

Preparation of Resist Solutions in Examples 2 to 21, and Comparative Examples 1 and 2

Preparation of each resist solution used in Examples and Comparative Examples listed in Table 1 below was carried out in the same manner as in Example 1. Incidentally, although not shown in Table 1, as a surfactant and an organic carboxylic acid, the same components as in Example 1 shown above were used in the same amount.

<EB Exposure/Alkali Development, Organic Solvent Development>

[Preparation of Resist Film] The resist coating solution was coated on the above-described 6-inch wafer by using a spin coater, MARK 8, manufactured by Tokyo Electron Ltd., and dried on a hot plate at 110° C. for 90 seconds to obtain a resist film having a thickness of 50 nm. That is, a resist-coated mask blank was obtained.

[Production of Negative Resist Pattern]

This resist film was patternwise irradiated by using an electron beam lithography device (ELS-7500 manufactured by ELIONIX INC., accelerating voltage: 50 KeV). After the irradiation, the resist film was heated (PEB) on a hot plate at 110° C. for 90 seconds, dipped in the developer described in Table 1 for 60 seconds, rinsed with the rinsing solution described in Table 1 for 30 seconds and dried.

[Evaluation of Resist Pattern]

The obtained pattern was evaluated for the resolution and PEB temperature dependency according to the following methods.

[L/S Resolution]

The cross-sectional profile of the pattern obtained was observed using a scanning electron microscope (S-4300, manufactured by Hitachi, Ltd.). By taking an irradiation dose when resolving a 1:1 line and space resist pattern with a line width of 50 nm as the sensitivity, the limiting resolution (the minimum line width when the line and the space (line:space=1:1) were separated and resolved) at an irradiation dose exhibiting the above sensitivity was defined as the resolution (nm).

[PEB Temperature Dependency]

First, in the case of carrying out post exposure bake (PEB) at 110° C. for 90 seconds, an irradiation dose which reproduces a 1:1 line and space having a mask size of 50 nm was taken as the optimum exposure dose. At this optimum exposure dose, PEB was carried out at two different temperatures of ±2° C. (112° C., 108° C.) with respect to the post exposure bake temperature (110° C.). The length of each line and space obtained was measured to calculate line widths L1 and L2 thereof. PEB temperature dependency (PEBS) was defined as a variation of the line width per 1° C. of PEB temperature change, and calculated according to the following equation.

PEB temperature dependency (nm/° C.)=|L1-L2|/4

A smaller value indicates less change in performance in response to a temperature change and favorable performance.

through a polyethylene filter having a pore size of 0.03 μm to prepare an actinic ray-sensitive or radiation-sensitive resin composition. An organic antireflection coating material ARC29SR (manufactured by Nissan Chemical Industries, Ltd.) was coated onto a silicon wafer and baked at 205° C. for 60 seconds to form an antireflection film with a thickness of 95 nm. The prepared actinic ray-sensitive or radiation-sensitive resin composition was coated thereonto and baked (PB) at 100° C. for 60 seconds to form a resist film with a thickness of 100 nm.

[Preparation of Negative Resist Pattern]

Patternwise exposure was carried out on the wafer having a resist film formed thereon using an ArF excimer laser liquid immersion scanner (manufactured by ASML; XT1700i, NA1.20, C-Quad, outer sigma 0.981, inner sigma 0.895, and XY deflection) through an exposure mask (line/space=binary mask 60 nm/60 nm). Ultrapure water was used

TABLE 1

| | Resin (A) Amount added (g) | Acid generator (B) Amount added (g) | Crosslinking agent (C) Amount added (g) | Basic compound Amount added (g) | Solvent Amount added (g) | Developer | Rinsing solution | LS resolution (nm) | PEB temperature dependency (nm/° C.) |
|---|---|---|---|---|---|---|---|---|---|
| Example 1 | A-1 0.55 g | B-1 0.11 g | C-1 0.16 g | N-1 0.002 g | S1/S2 4 g/5 g | SG-3 | SR-2 | 24 | 0.2 |
| Example 2 | A-2 0.55 g | B-5 0.11 g | C-1 0.16 g | N-2 0.004 g | S1/S2 4 g/5 g | SG-1 | SR-1 | 30 | 1.2 |
| Example 3 | A-3 0.55 g | B-2 0.08 g | C-1 0.16 g | N-3 0.002 g | S1/S2 4 g/5 g | SG-2 | — | 32 | 1.8 |
| Example 4 | A-4 0.55 g | B-1 0.11 g | C-7 0.16 g | N-4 0.002 g | S3/S4 4 g/5 g | SG-3 | SR-2 | 40 | 3.2 |
| Example 5 | A-5 0.71 g | B-1 0.11 g | C-3 0.16 g | N-5 0.002 g | S1/S2/S3 3 g/3 g/2 g | SG-3 | SR-2 | 28 | 0.6 |
| Example 6 | A-6 0.71 g | B-1 0.11 g | C-5 0.17 g | N-6 0.002 g | S1/S2 5 g/4 g | SG-3 | SR-2 | 30 | 0.8 |
| Example 7 | A-7 0.60 g | — | C-6 0.17 g | N-7 0.004 g | S3/S4 4 g/5 g | SG-3 | SR-2 | 30 | 2.0 |
| Example 8 | A-1 0.55 g | B-6 0.11 g | C-2 0.17 g | N-1 0.002 g | S1/S2 5 g/4 g | SG-3 | SR-2 | 20 | 0.2 |
| Example 9 | A-8 0.55 g | B-2 0.05 g | C-8 0.18 g | N-8 0.002 g | S3/S4 4 g/5 g | SG-3 | SR-2 | 32 | 1.8 |
| Example 10 | A-5 0.55 g | B-3 0.13 g | C-9 0.18 g | N-9 0.003 g | S1/S2/S3 3 g/3 g/2 g | SG-3 | SR-2 | 30 | 1.6 |
| Example 11 | A-6 0.55 g | B-4/B-6 0.08 g/0.08 g | C-10 0.18 g | N-1 0.002 g | S1/S2/S3 3 g/3 g/2 g | SG-3 | SR-2 | 30 | 2.2 |
| Example 12 | A-2 0.55 g | B-5 0.13 g | C-11 0.19 g | N-2 0.002 g | S1/S2/S3 3 g/3 g/2 g | SG-3 | SR-2 | 26 | 0.6 |
| Example 13 | A-2 0.55 g | B-6 0.16 g | C-12 0 19 g | N-9 0.004 g | S1/S2 4 g/5 g | SG-3 | SR-2 | 22 | 0.2 |
| Example 14 | A-6 0.71 g | B-5 0.13 g | C-13 0.19 g | N-6 0.003 g | S1/S2 4 g/5 g | SG-3 | SR-2 | 32 | 1.4 |
| Example 15 | A-2 0.55 g | B-5 0.13 g | C-14 0.20 g | N-1 0.002 g | S1/S2 4 g/5 g | SG-3 | SR-2 | 28 | 1.0 |
| Example 16 | A-2/A-6 0.20 g/0.51 g | B-5 0.13 g | C-15 0.20 g | N-9 0.004 g | S1/S2 4 g/5 g | SG-3 | SR-2 | 26 | 1.2 |
| Example 17 | A-5 0.71 g | B-5 0.13 g | C-16 0.20 g | N-1 0.002 g | S1/S2 4 g/5 g | SG-3 | SR-2 | 40 | 3.0 |
| Example 18 | A-5 0.71 g | B-5 0.13 g | C-17 0.21g | N-5 0.001 g | S1/S2 4 g/5 g | SG-3 | SR-2 | 32 | 0.8 |
| Example 19 | A-2 0.55 g | B-5 0.13 g | C-9 0.21 g | N-3 0.002 g | S1/S2 4 g/5 g | SG-1 | SR-1 | 24 | 0.6 |
| Example 20 | A-6 0.71 g | B-5 0.13 g | C-12/C-4 0.10 g/0.10 g | N-1 0.002 g | S1/S2 4 g/5 g | SG-2 | SR-1 | 28 | 0.8 |
| Example 21 | A-2 0.55 g | B-5 0.13 g | C-7 0.22 g | N-3 0.002 g | S1/S2 4 g/5 g | SG-3 | SR-2 | 32 | 1.8 |
| Comparative Example 1 | A-2 0.60 g | B-1 0.11 g | CL-1 0.16 g | N-5 0.002 g | S1/S2 4 g/5 g | SG-3 | SR-2 | 75 | 5.5 |
| Comparative Example 2 | RA-1 0.55 g | RB-1 0.08 g | C-1 0.16 g | N-7 0.002 g | S1/S2 4 g/5 g | SG-3 | SR-2 | Non-resolved | Non-resolved |

<ArF Exposure/Organic Solvent Development>

[Preparation of Resist Solution and Resist Film]

The components shown in Table 2 were dissolved in a solvent shown in Table 2, and each solution was filtered as the immersion liquid. After that, heating (PEB) was carried out at 100° C. for 60 seconds. Subsequently, development was carried out by puddling a developer for 30 seconds and rinsing was carried out by puddling using the rinsing solution for 30 seconds while shaking off the developer. Subsequently, after rotating the wafer at a rotation speed of 4,000 rpm for 30 seconds, baking was carried out at 90° C. for 60 seconds. A 1:1 line and space resist pattern with a line width of 60 nm was obtained in this manner.

[Evaluation of Resist Pattern]

The obtained pattern was evaluated for the resolution and PEB temperature dependency in the same manner as described above. The results are shown in the table below.

TABLE 2

|  | Resin (A) Amount added (g) | Acid generator (B) Amount added (g) | Crosslinking agent (C) Amount added (g) | Hydrophobic resin Amount added (g) | Solvent Amount added (g) | Developer | Rinsing solution | LS resolution (nm) | PEB temperature dependency (nm/° C.) |
|---|---|---|---|---|---|---|---|---|---|
| Example 22 | A-9 0.55 g | B-5 0.11 g | C-1 0.16 g | X-1 0.05 g | S1/S2 4 g/5 g | SG-1 | SR-1 | 46 | 2.2 |
| Example 23 | A-10 0.55 g | B-3 0.11 g | C-5 0.16 g | X-2 0.05 g | S1/S2 4 g/5 g | SG-2 | — | 42 | 1.3 |
| Example 24 | A-9 0.55 g | B-5 0.11 g | C-7 0.16 g | X-1 0.05 g | S1/S2 4 g/5 g | SG-1 | SR-1 | 42 | 2.4 |
| Example 25 | A-10 0.55 g | B-3 0.11 g | C-12 0.16 g | X-2 0.05 g | S1/S2 4 g/5 g | SG-2 | — | 34 | 1.0 |
| Comparative Example 3 | A-9 0.60 g | B-1 0.11 g | CL-1 0.16 g | X-1 0.05 g | S1/S2 4 g/5 g | SG-1 | SR-1 | 75 | 8.0 |
| Comparative Example 4 | RA-1 0.55 g | RB-1 0.08 g | C-1 0.16 g | X-2 0.05 g | S1/S2 4 g/5 g | SG-2 | — | Non-resolved | Non-resolved |

What is claimed is:

1. An actinic ray-sensitive or radiation-sensitive resin composition, comprising:

a resin (A) containing a repeating unit represented by General Formula (4); and a crosslinking agent (C) containing a polar group, wherein the crosslinking agent (C) is a compound represented by General Formula (1), or a compound in which two to five structures represented by General Formula (1) are connected via a linking group or a single bond represented by $L_1$ in General Formula (3),

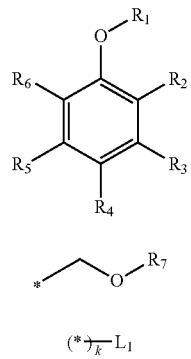

wherein in General Formula (1), $R_1$ to $R_6$ each independently represent a hydrogen atom, an organic group having 1 to 50 carbon atoms, or a binding site to a linking group or a single bond represented by $L_1$ in General Formula (3), provided that at least one of $R_2$, $R_3$, $R_4$, $R_5$, or $R_6$ is a group represented by General Formula (2), and at least one of $R_1$, $R_2$, $R_3$, $R_4$, $R_5$, $R_6$, or $L_1$ in General Formula (3) is a polar group selected from the following structures, or a group containing a polar group selected from the following structures as a partial structure,

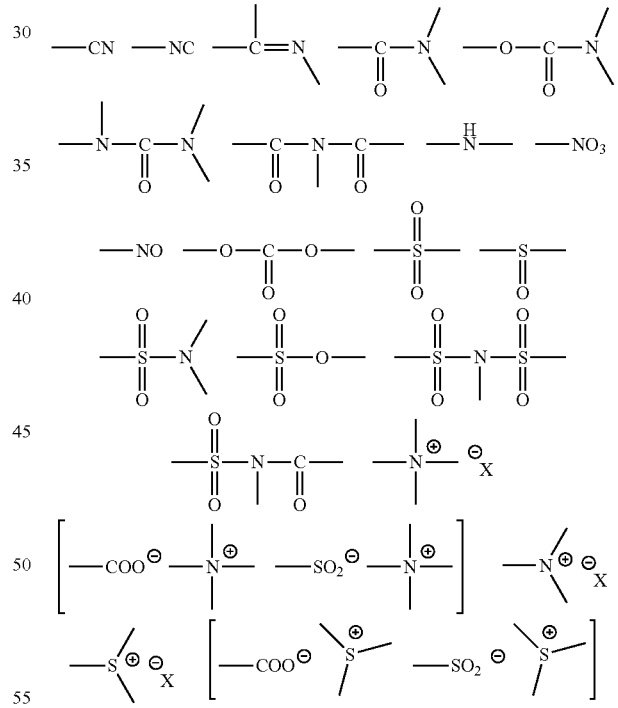

in General Formula (2), $R_7$ represents an organic group having 1 to 30 carbon atoms, in General Formula (3), $L_1$ represents a linking group or a single bond, * represents a binding site in any one of $R_1$, $R_2$, $R_3$, $R_4$, $R_5$, and $R_6$, and k is an integer of 2 to 5, and in General Formula (4), $R_{11}$ represents a hydrogen atom, a methyl group, or a trifluoromethyl group, $R_{12}$ represents a hydrogen atom or an alkyl group, $L_{11}$ represents a single bond or a linking group, X represents —Ar $(OX_1)m$ or —$CO_2X_2$ in which Ar represents an aromatic ring, $X_1$ represents a hydrogen atom, a group having a non-acid-decomposable hydrocarbon structure, or a group having an acid-decomposable group, $X_2$ represents a group capable of leaving by the action of an acid or a group having a group capable of leaving by the action of an acid, and m represents an integer of 1 to 12, or $R_{12}$ and X may be bonded to each other to form a ring.

2. The actinic ray-sensitive or radiation-sensitive resin composition according to claim 1, wherein the polar group is a structure selected from the following structures, or a group containing such a structure as a partial structure:

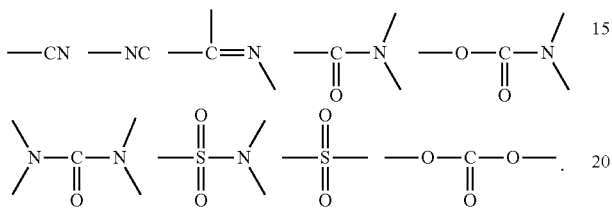

3. The actinic ray-sensitive or radiation-sensitive resin composition according to claim 1, wherein the polar group is a structure selected from the following structures, or a group containing such a structure as a partial structure:

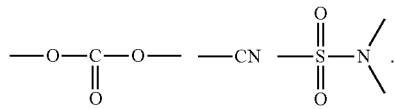

4. The actinic ray-sensitive or radiation-sensitive resin composition according to claim 1, further comprising a compound (B) capable of generating an acid upon irradiation with actinic rays or radiation.

5. The actinic ray-sensitive or radiation-sensitive resin composition according to claim 4, wherein the volume of an acid generated from a compound (B) upon irradiation with actinic rays or radiation is 240 Å$^3$ or more.

6. The actinic ray-sensitive or radiation-sensitive resin composition according to claim 1, wherein the resin (A) contains at least a repeating unit represented by the following General Formula (6), as the repeating unit represented by General Formula (4),

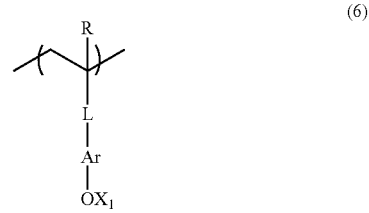

wherein in General Formula (6), R represents a hydrogen atom or a methyl group, L represents a single bond or a linking group, Ar represents an aromatic ring, and $X_1$ represents a hydrogen atom, a group having a non-acid-decomposable hydrocarbon structure, or a group having an acid-decomposable group.

7. An actinic ray-sensitive or radiation-sensitive film comprised of the actinic ray-sensitive or radiation-sensitive resin composition according to claim 1.

8. A mask blank provided with the actinic ray-sensitive or radiation-sensitive film according to claim 7.

9. A pattern forming method, comprising:
    forming an actinic ray-sensitive or radiation-sensitive film using the actinic ray-sensitive or radiation-sensitive resin composition according to claim 1;
    exposing the film; and
    developing the exposed film using a developer to form a pattern.

10. The pattern forming method according to claim 9, wherein the exposure is carried out using X-rays, an electron beam, or EUV light.

* * * * *